United States Patent
Kusai et al.

(10) Patent No.: US 9,117,848 B2
(45) Date of Patent: Aug. 25, 2015

(54) NONVOLATILE SEMICONDUCTOR MEMORY DEVICE AND METHOD OF MANUFACTURING THE SAME

(71) Applicant: Kabushiki Kaisha Toshiba, Tokyo (JP)

(72) Inventors: Haruka Kusai, Yokohama (JP); Kiwamu Sakuma, Yokohama (JP); Masao Shingu, Yokkaichi (JP); Shosuke Fujii, Fujisawa (JP); Masahiro Kiyotoshi, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/752,526

(22) Filed: Jan. 29, 2013

(65) Prior Publication Data
US 2013/0200450 A1   Aug. 8, 2013

(30) Foreign Application Priority Data

Feb. 3, 2012 (JP) .................................. 2012-022111

(51) Int. Cl.
| | |
|---|---|
| H01L 29/792 | (2006.01) |
| H01L 29/66 | (2006.01) |
| H01L 29/788 | (2006.01) |
| H01L 27/115 | (2006.01) |

(52) U.S. Cl.
CPC .... *H01L 29/66833* (2013.01); *H01L 27/11556* (2013.01); *H01L 27/11582* (2013.01); *H01L 29/66825* (2013.01); *H01L 29/7881* (2013.01); *H01L 29/792* (2013.01)

(58) Field of Classification Search
USPC ................... 257/314–326, E21.209, E21.68, 257/E21.662; 438/257–264, 287
See application file for complete search history.

(56) References Cited

U.S. PATENT DOCUMENTS

| | | | | |
|---|---|---|---|---|
| 5,889,304 | A * | 3/1999 | Watanabe et al. | 257/321 |
| 2006/0192266 | A1* | 8/2006 | Willer et al. | 257/510 |
| 2007/0290253 | A1* | 12/2007 | Kito et al. | 257/315 |
| 2009/0283819 | A1* | 11/2009 | Ishikawa et al. | 257/324 |

(Continued)

FOREIGN PATENT DOCUMENTS

| | | |
|---|---|---|
| JP | 8-64700 A | 3/1996 |
| JP | 11-317463 A | 11/1999 |

(Continued)

OTHER PUBLICATIONS

Office Action issued May 7, 2014 in Japanese Patent Application No. 2012-022111 (with English language translation).

(Continued)

*Primary Examiner* — Cuong Q Nguyen
*Assistant Examiner* — Nishath Yasmeen
(74) *Attorney, Agent, or Firm* — Oblon, McClelland, Maier & Neustadt, L.L.P.

(57) ABSTRACT

According to one embodiment, a nonvolatile semiconductor memory device includes a fin structure stacked in order of a first oxide layer, a semiconductor layer and a second oxide layer in a first direction perpendicular to a surface of the semiconductor substrate, the fin structure extending in a second direction parallel to the surface of the semiconductor substrate, and a gate structure stacked in order of a gate oxide layer, a charge storage layer, a block insulating layer and a control gate electrode in a third direction perpendicular to the first and second directions from a surface of the semiconductor layer in the third direction.

16 Claims, 58 Drawing Sheets

(56) References Cited

U.S. PATENT DOCUMENTS

| | | |
|---|---|---|
| 2010/0155810 A1* | 6/2010 | Kim et al. .................. 257/316 |
| 2010/0226195 A1 | 9/2010 | Lue |
| 2011/0018047 A1* | 1/2011 | Komiya .................. 257/315 |
| 2013/0015520 A1 | 1/2013 | Fujii et al. |
| 2013/0175490 A1 | 7/2013 | Kusai et al. |

FOREIGN PATENT DOCUMENTS

| | | |
|---|---|---|
| JP | 2007-500949 A | 1/2007 |
| JP | 2007-27777 A | 2/2007 |
| JP | 2007-511071 A | 4/2007 |
| JP | 2008-109128 A | 5/2008 |
| WO | WO 2011/114503 A1 | 9/2011 |

OTHER PUBLICATIONS

U.S. Appl. No. 13/895,660, filed May 16, 2013, Sakuma, et al.

A. Hubert et al. "A stacked SONOS technology, up to 4 levels and 6nm crystalline nanowires, with gate-all-around or independent gates (ϕ-Flash), suitable for full 3D integration", IEDM 2009 pp. 637-640.

SungJin Whang et al, "Novel 3-Dimensional Dual Control-Gate with Surrounding Floating-Gate (DC-SF) NAND Flash Cell for 1Tb File Storage Application", IEDM 2010 pp. 668-671.

* cited by examiner

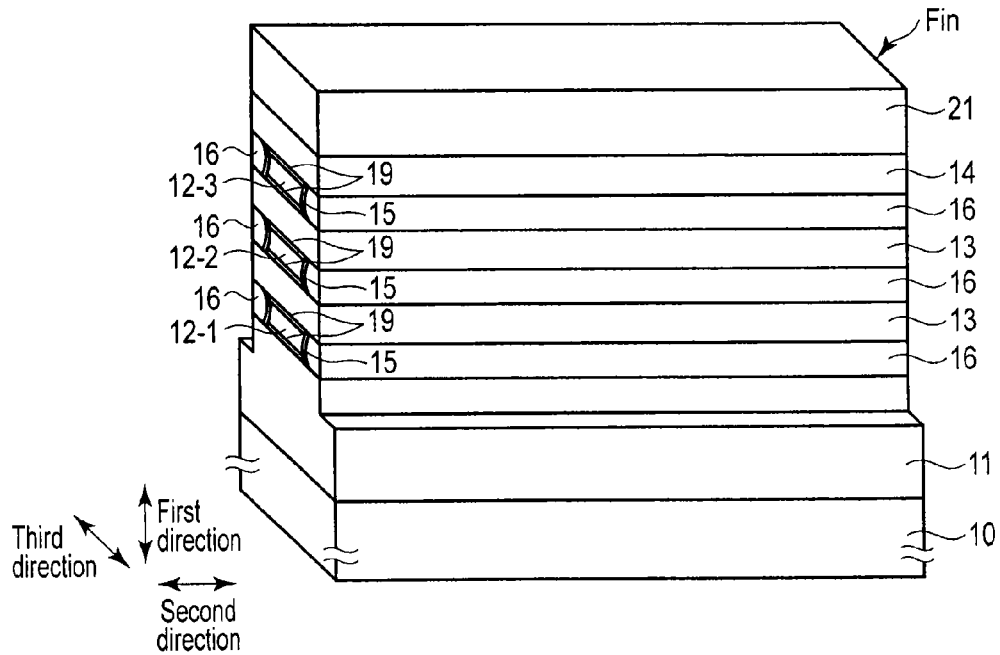
F I G. 14
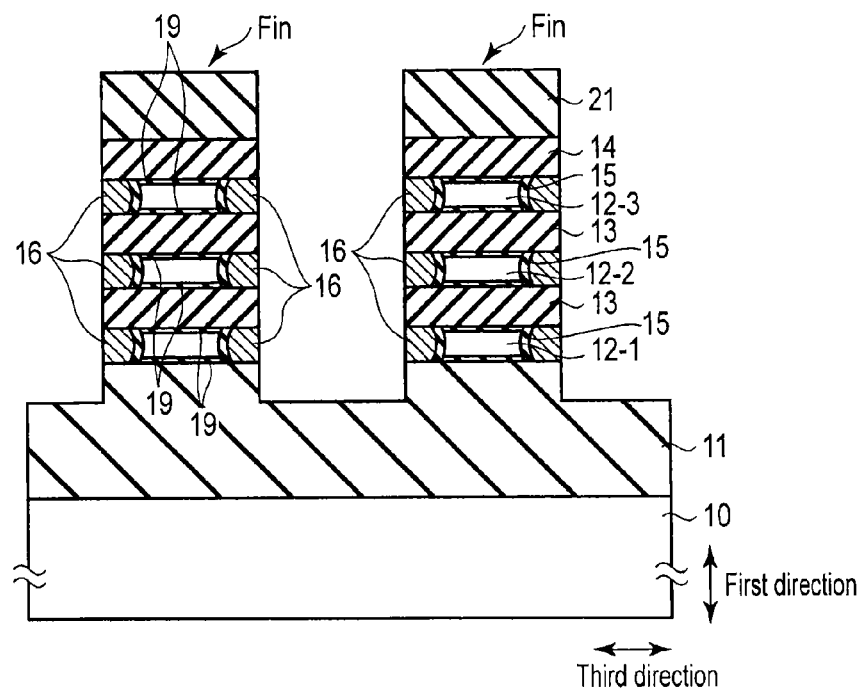
F I G. 15

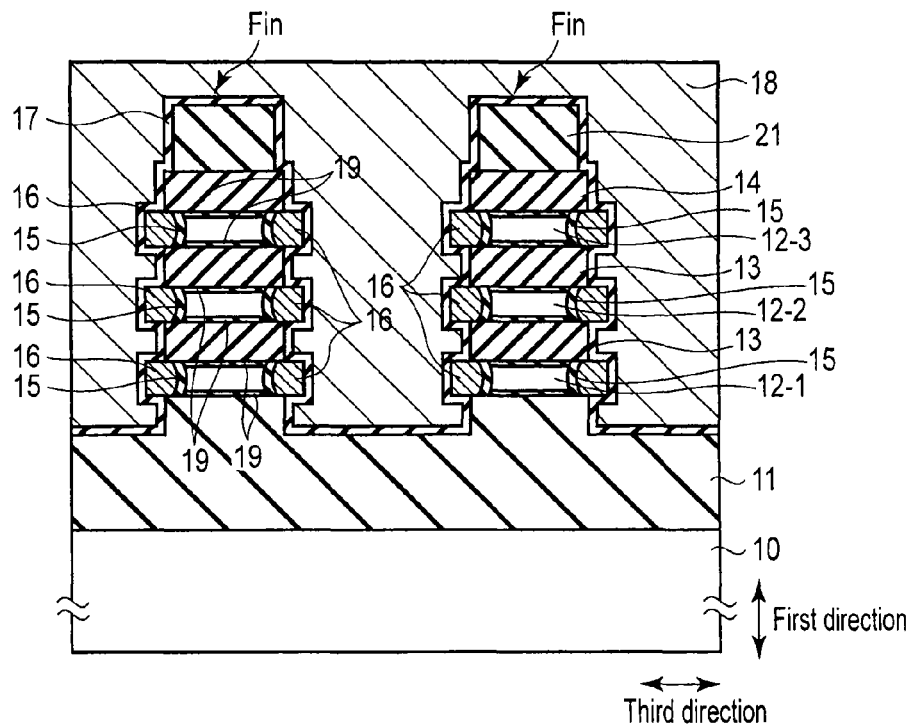
F I G. 23
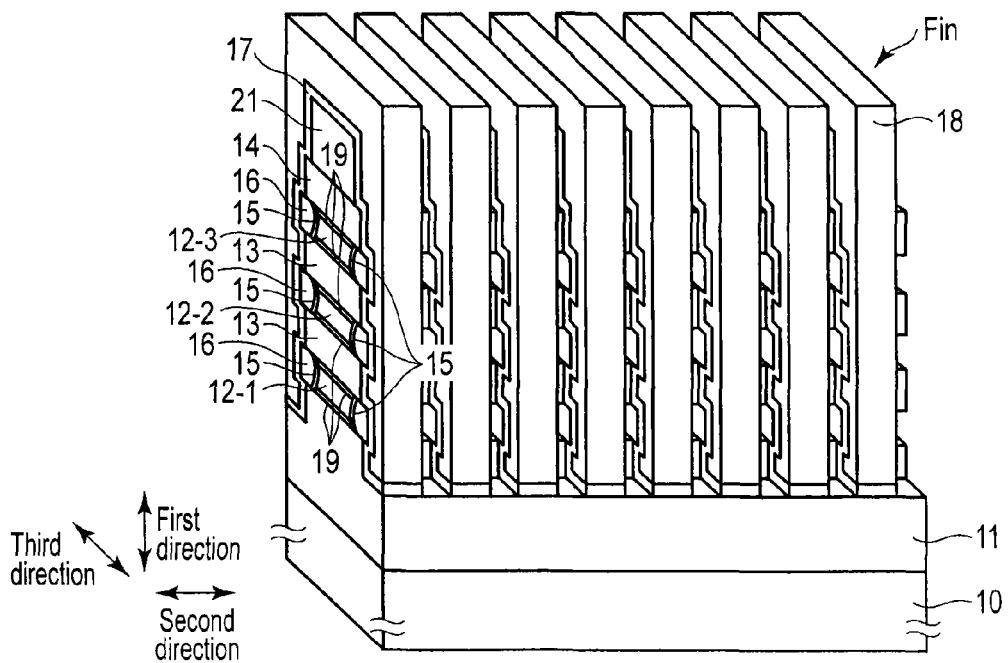
F I G. 24

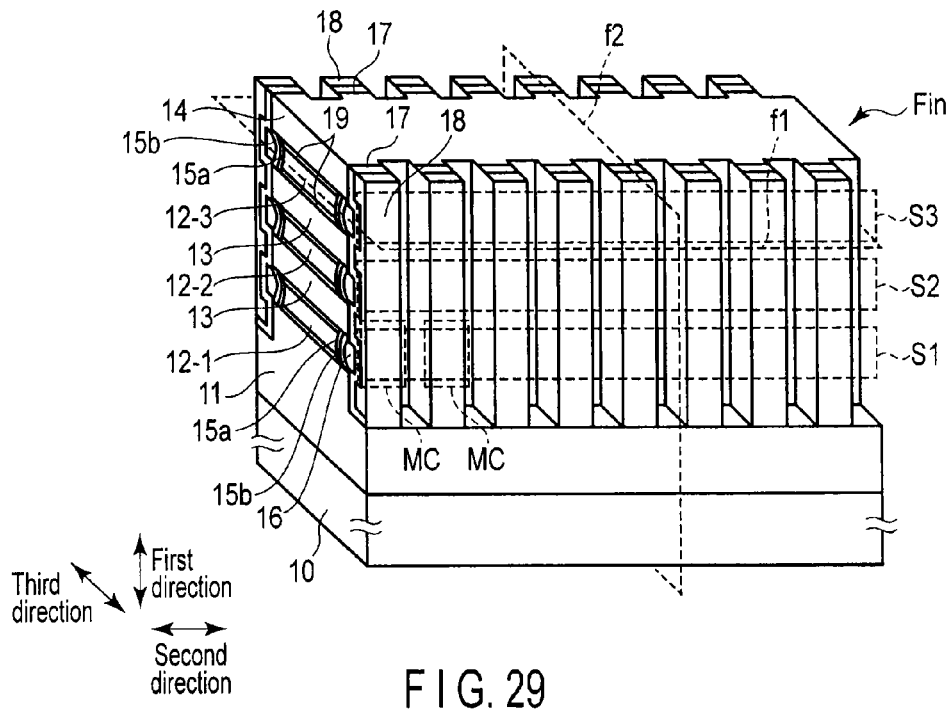
F I G. 29
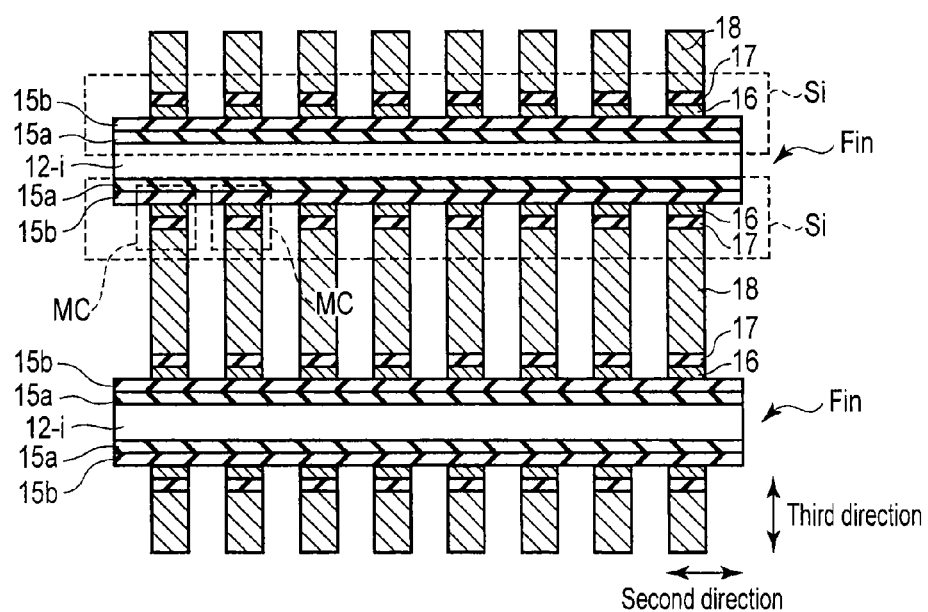
F I G. 30

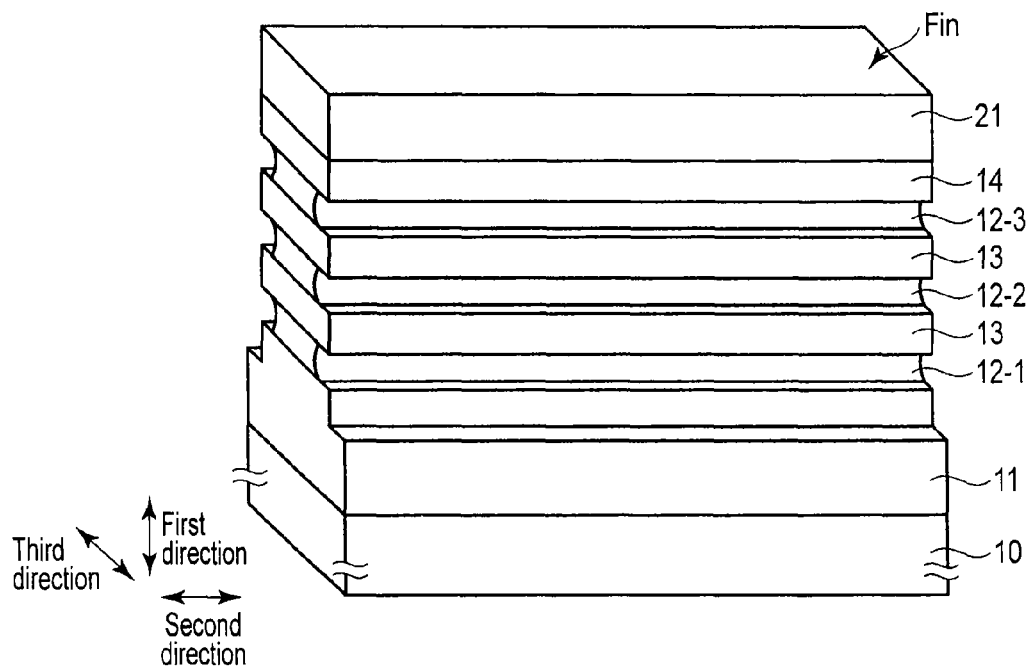
F I G. 34
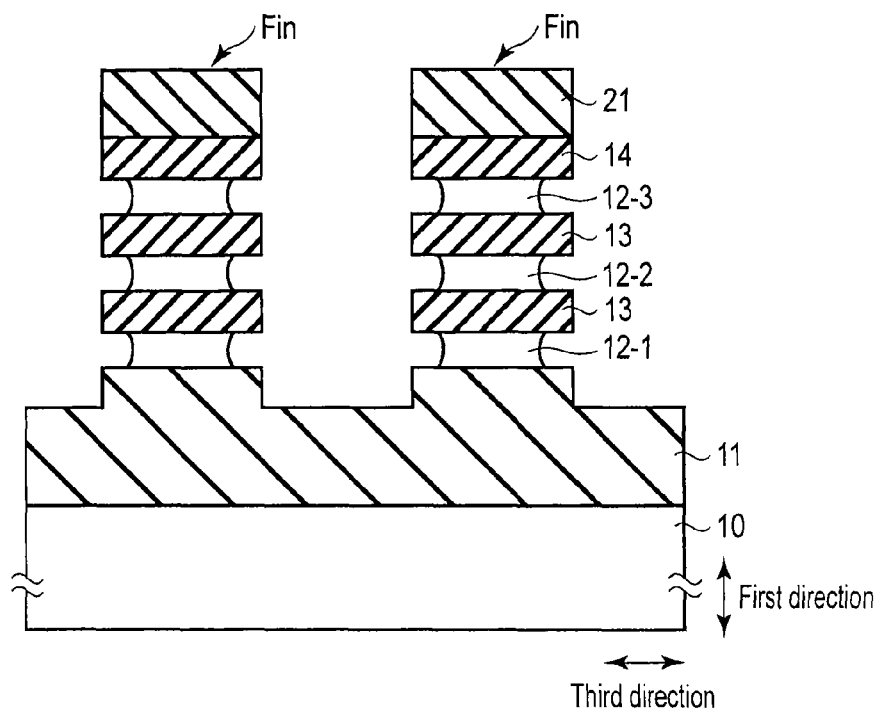
F I G. 35

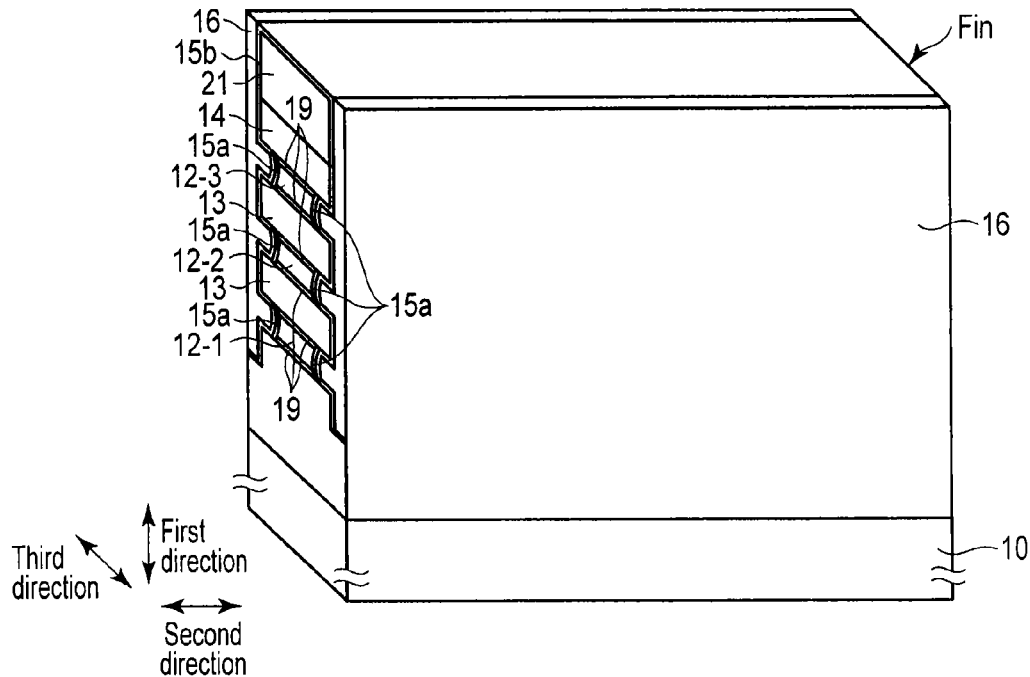
F I G. 38
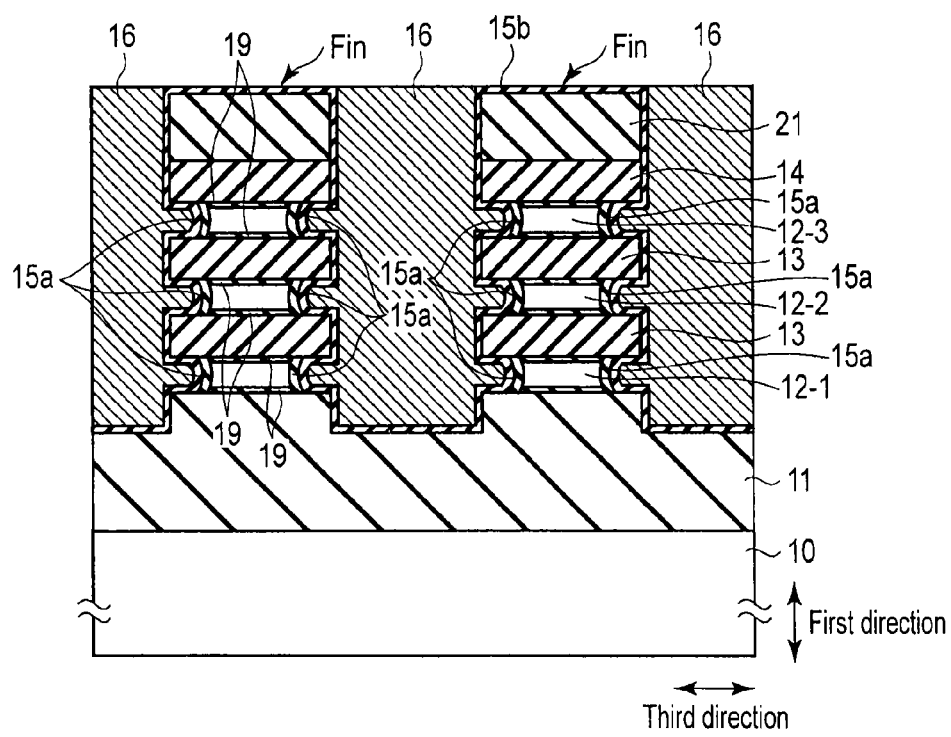
F I G. 39

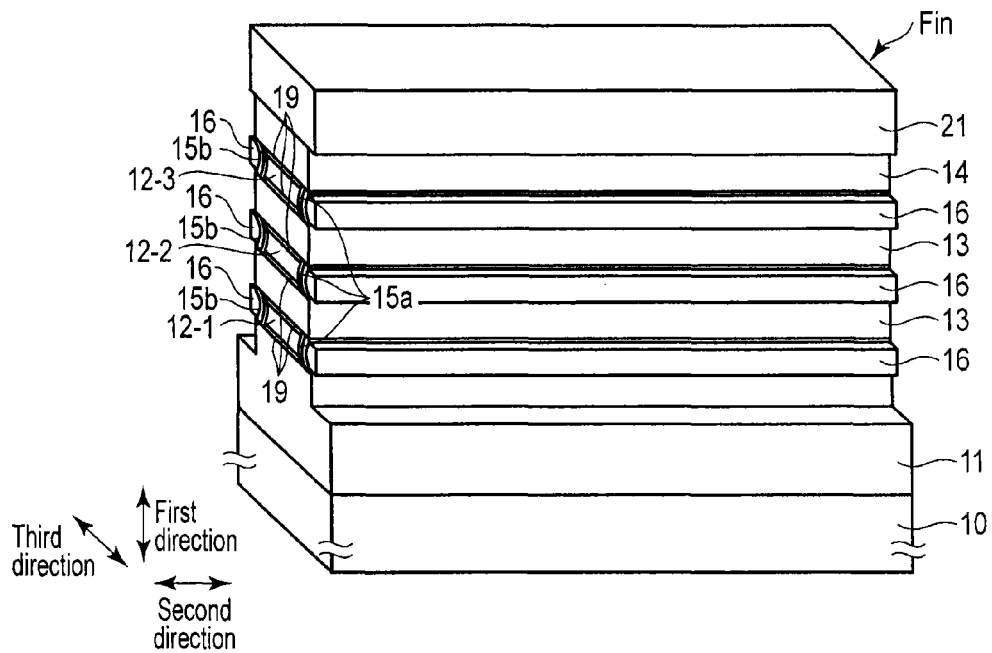
F I G. 42
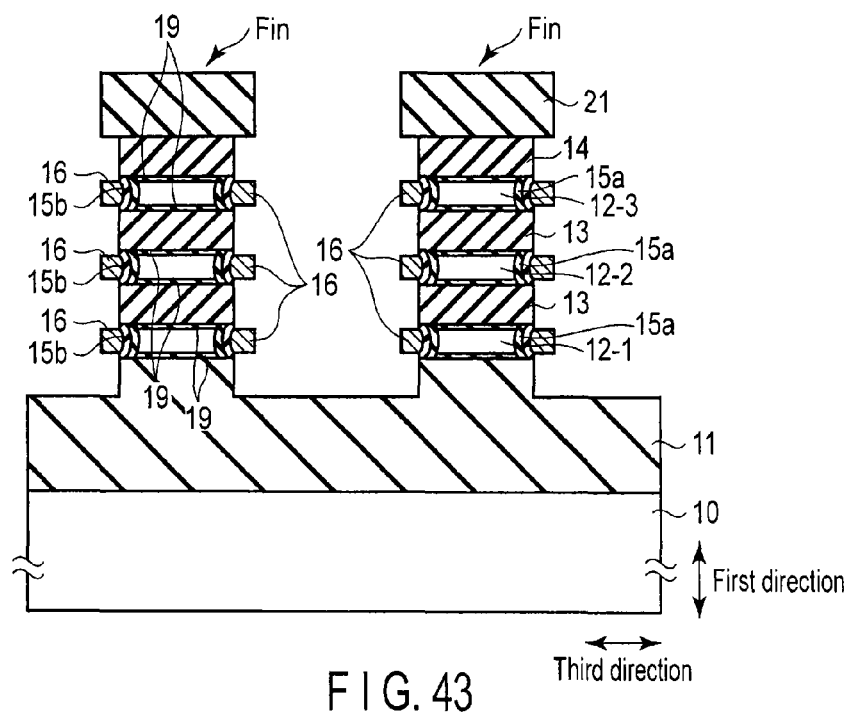
F I G. 43

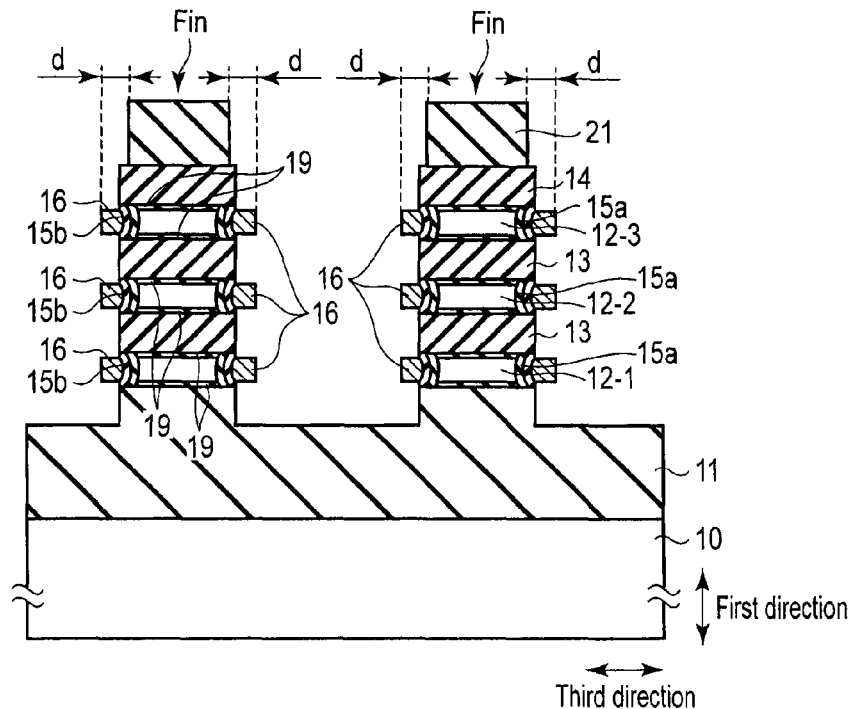
F I G. 46
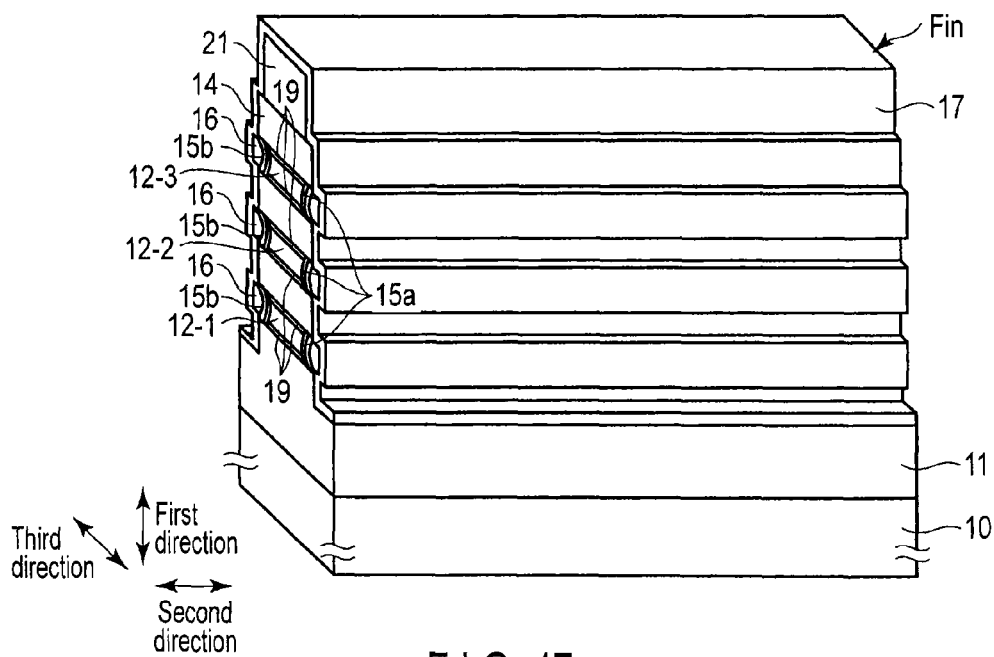
F I G. 47

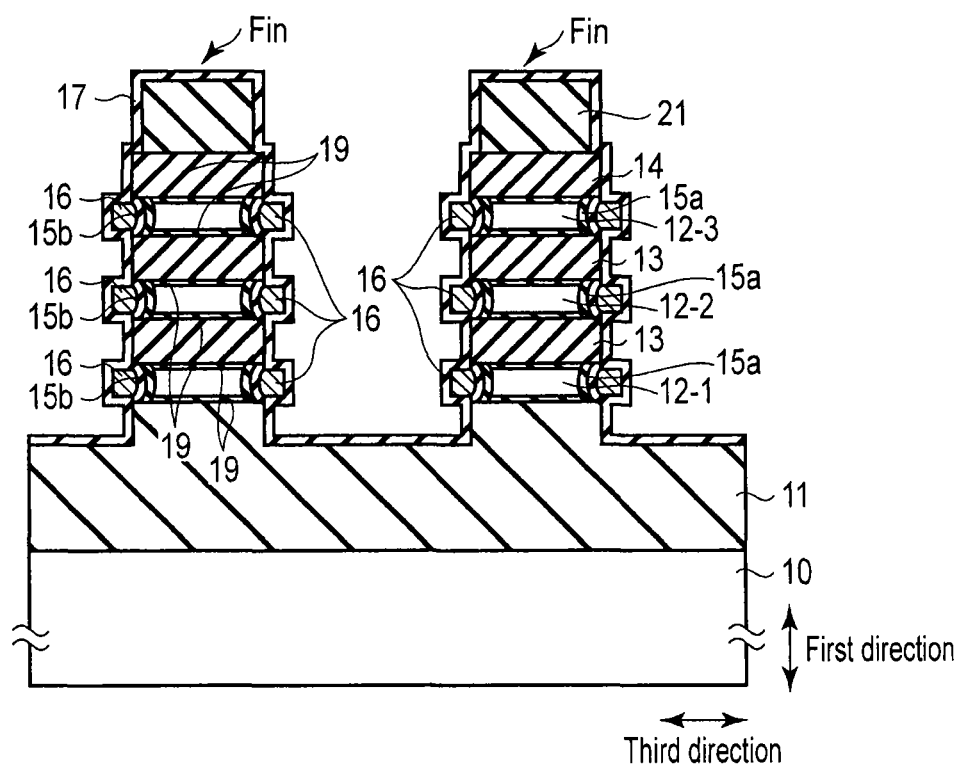
F I G. 48

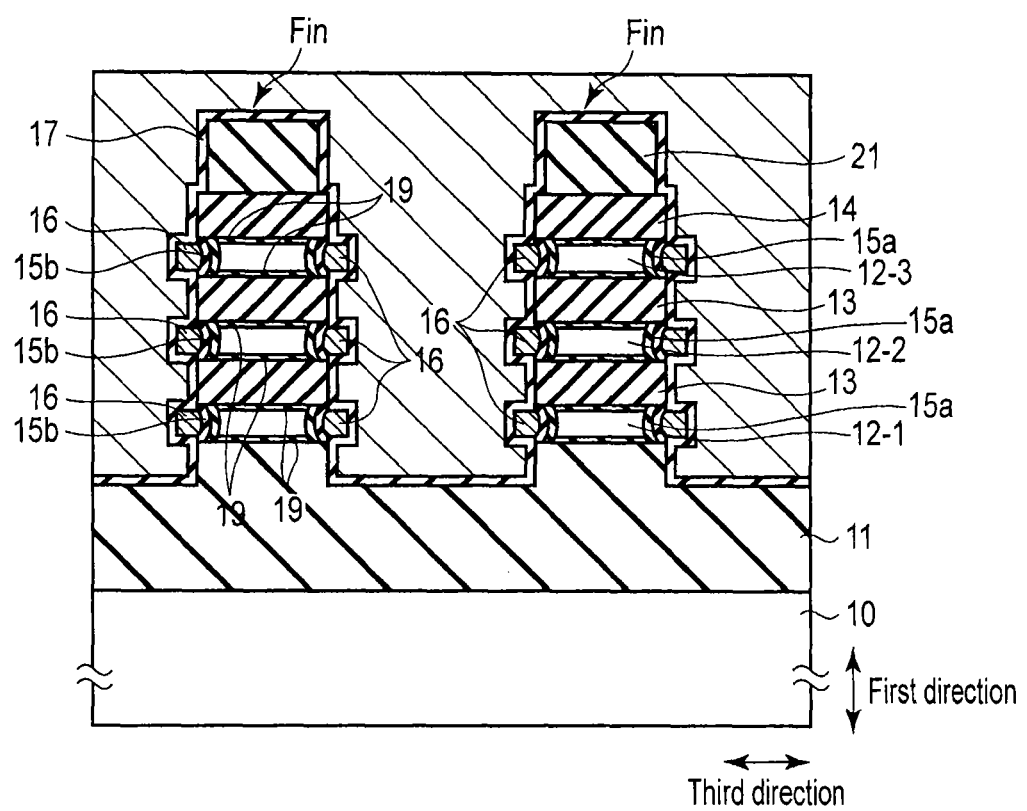
F I G. 52

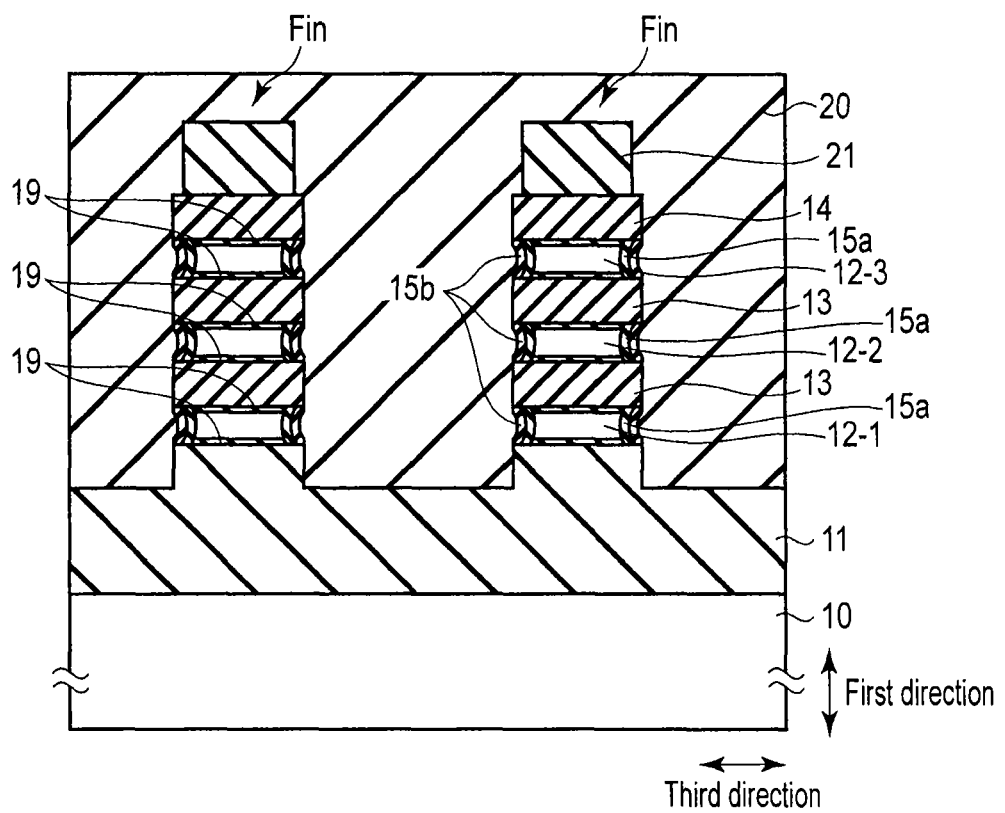
F I G. 55

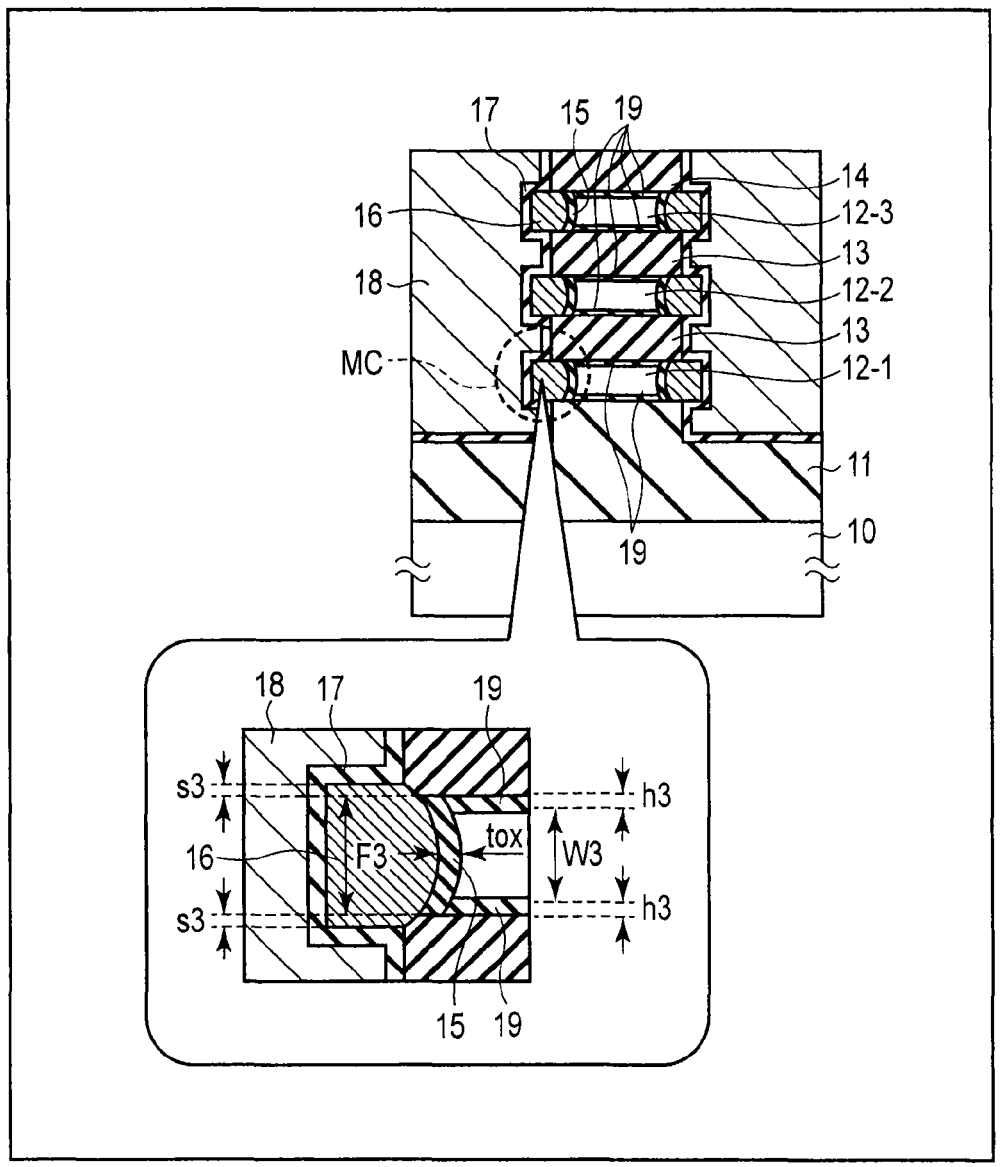
F I G. 58

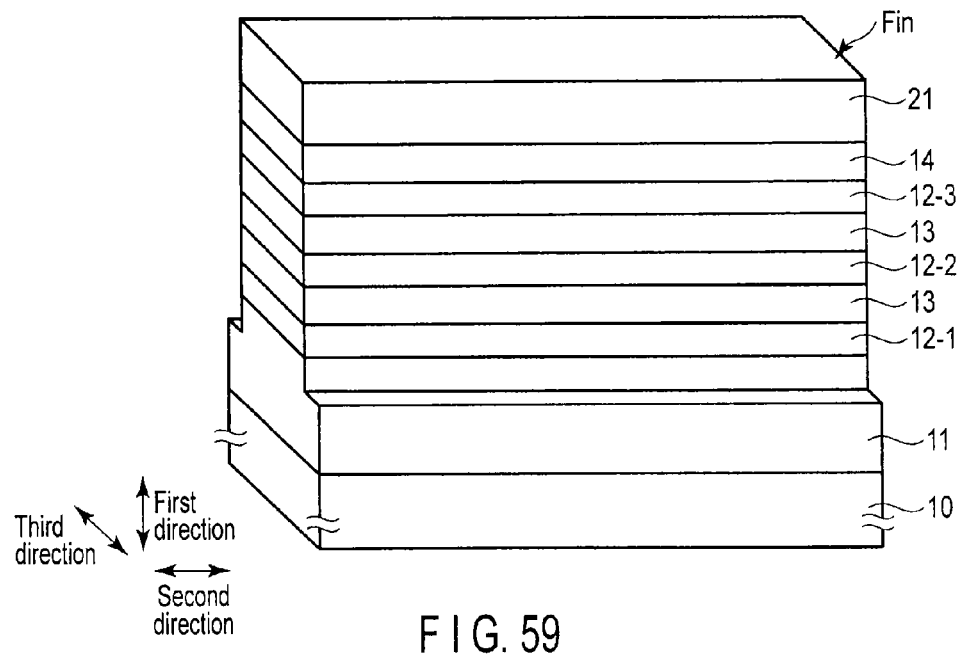
F I G. 59
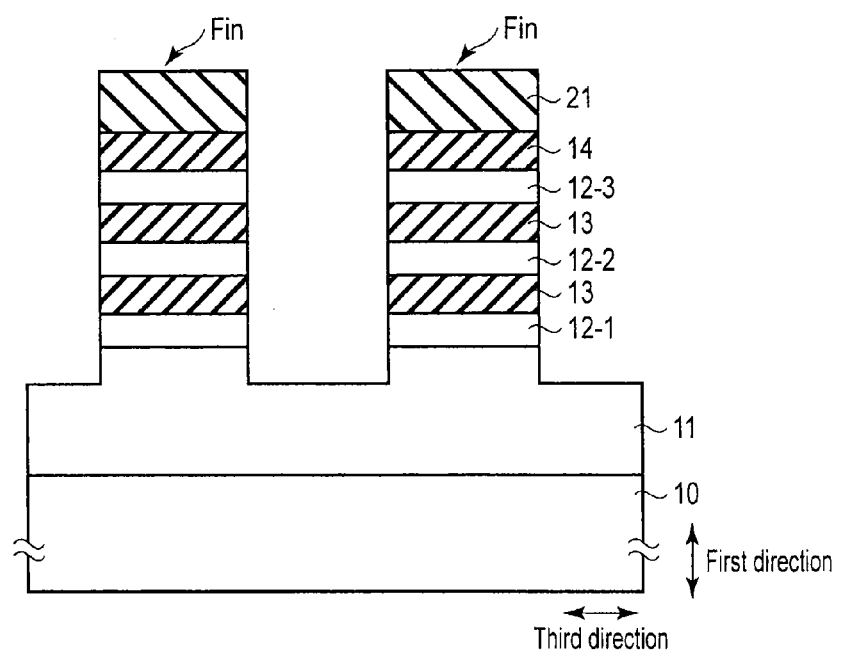
F I G. 60

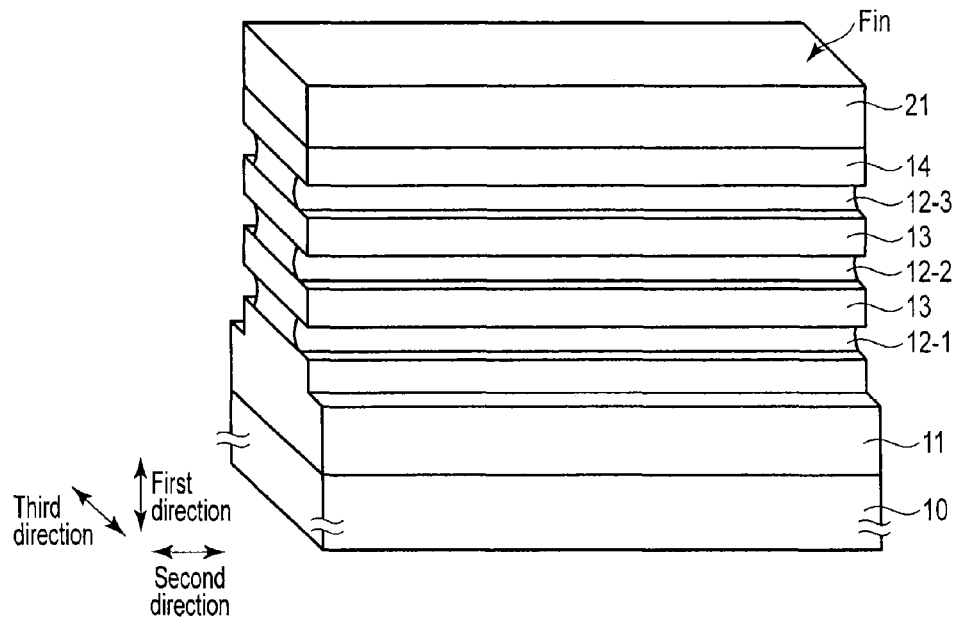
F I G. 61
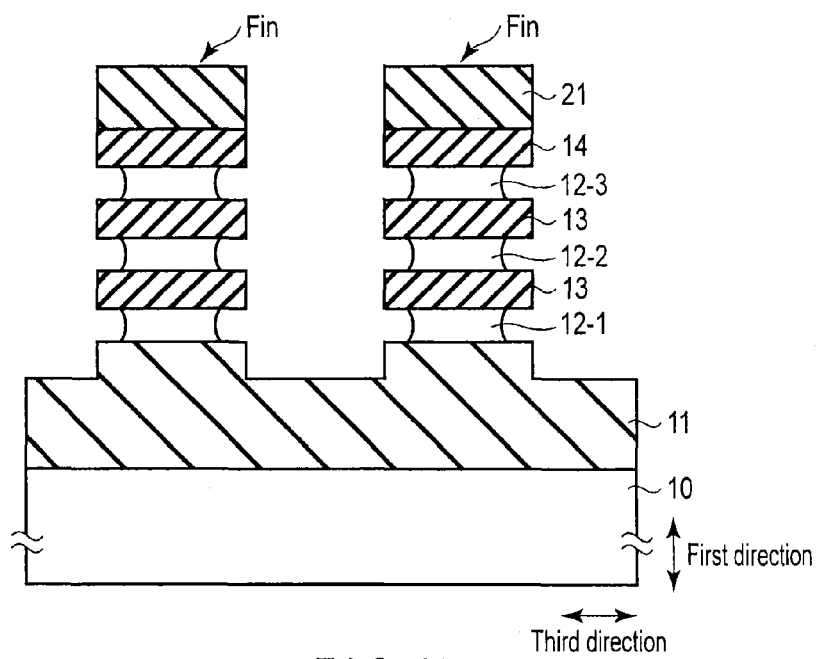
F I G. 62

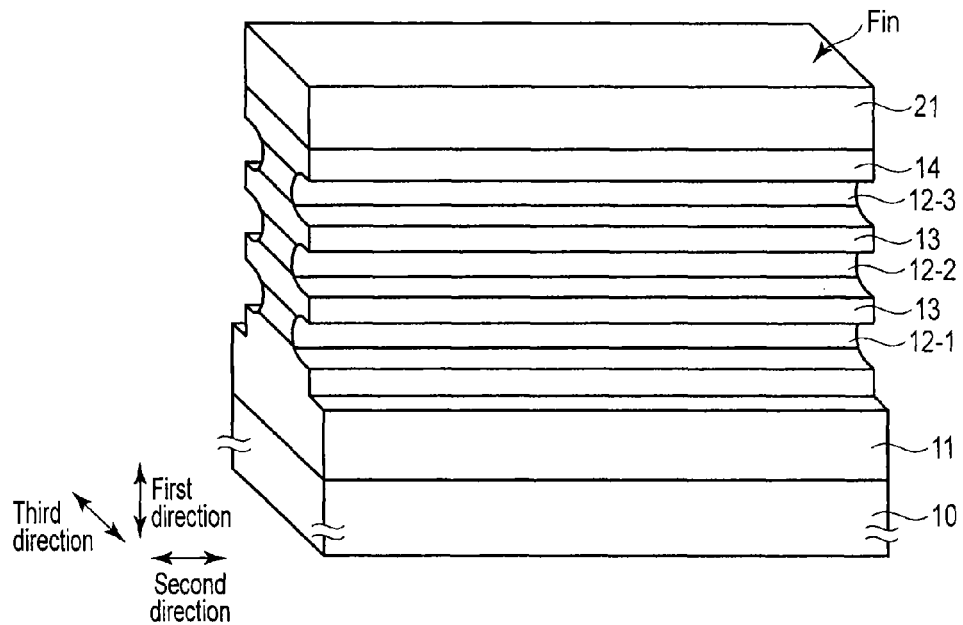
F I G. 63
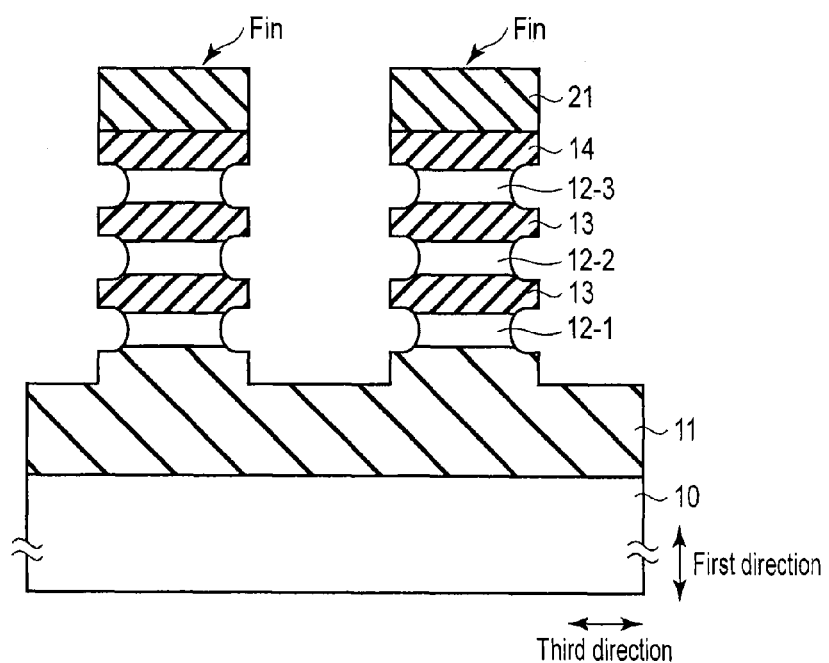
F I G. 64

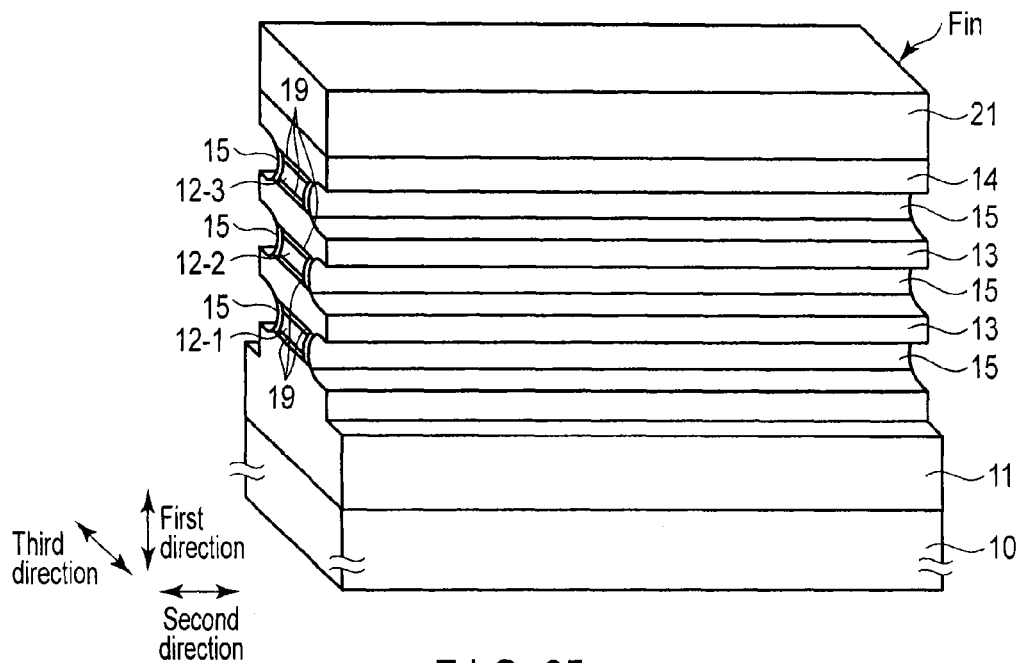
F I G. 65
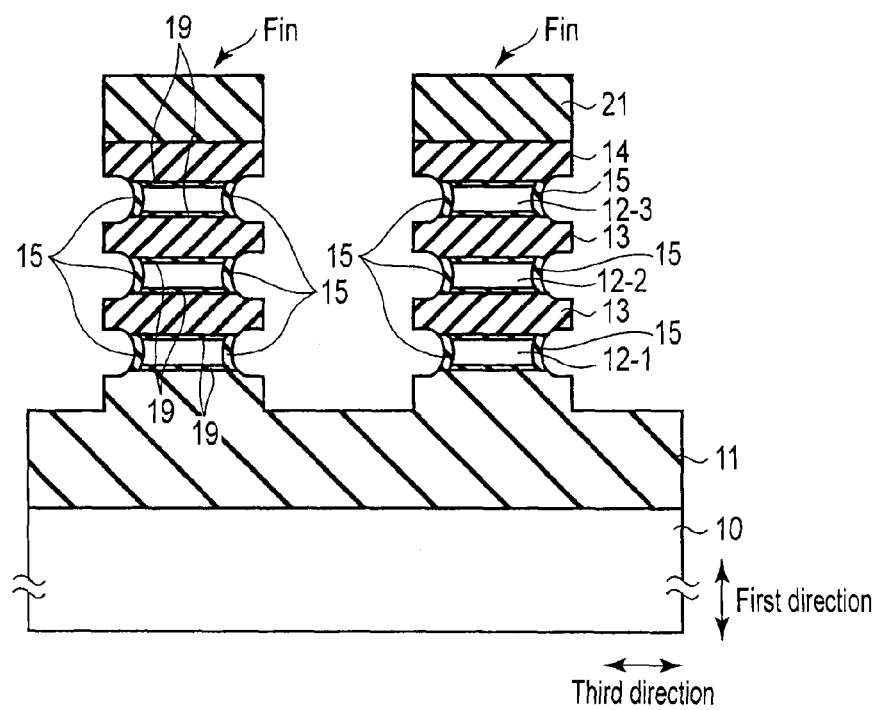
F I G. 66

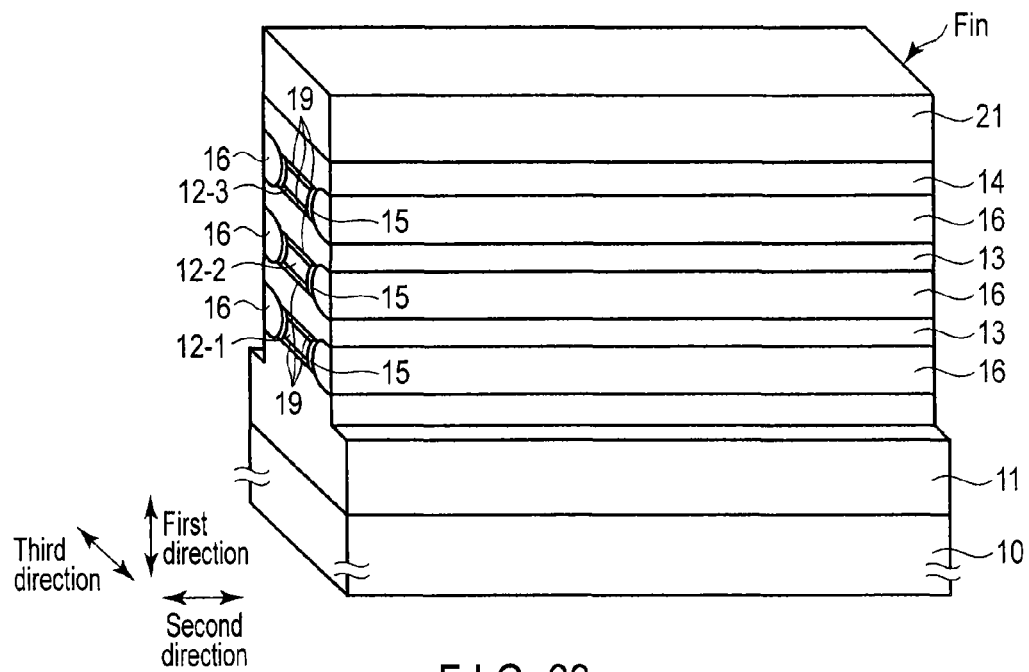
F I G. 69
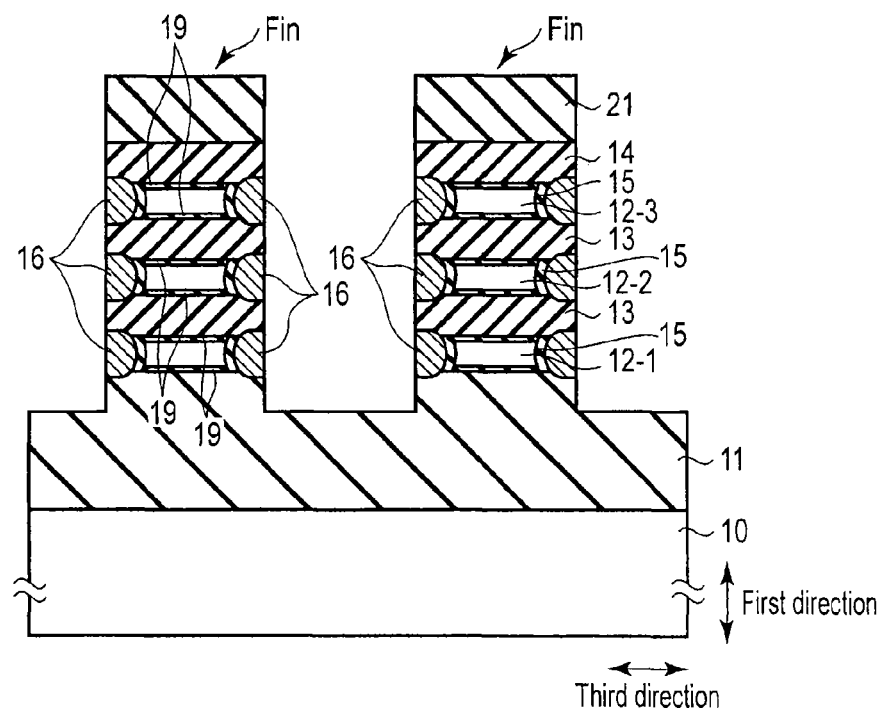
F I G. 70

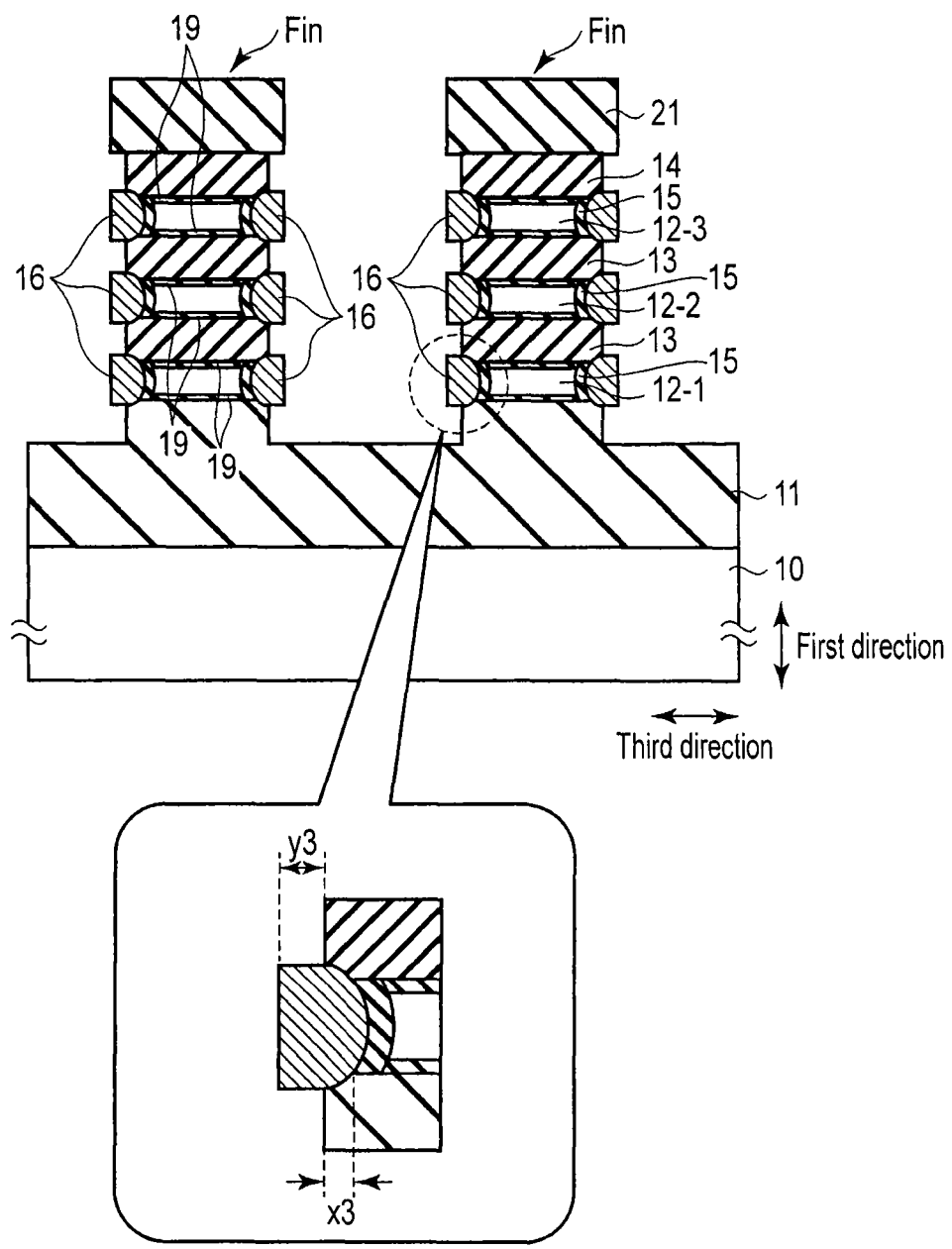
F I G. 72

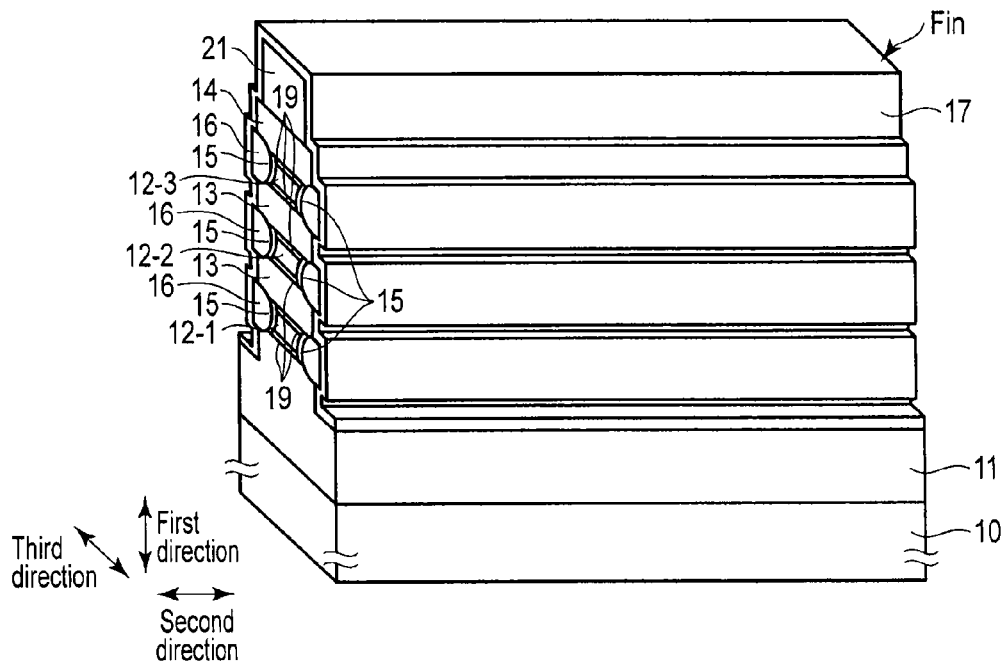
F I G. 75
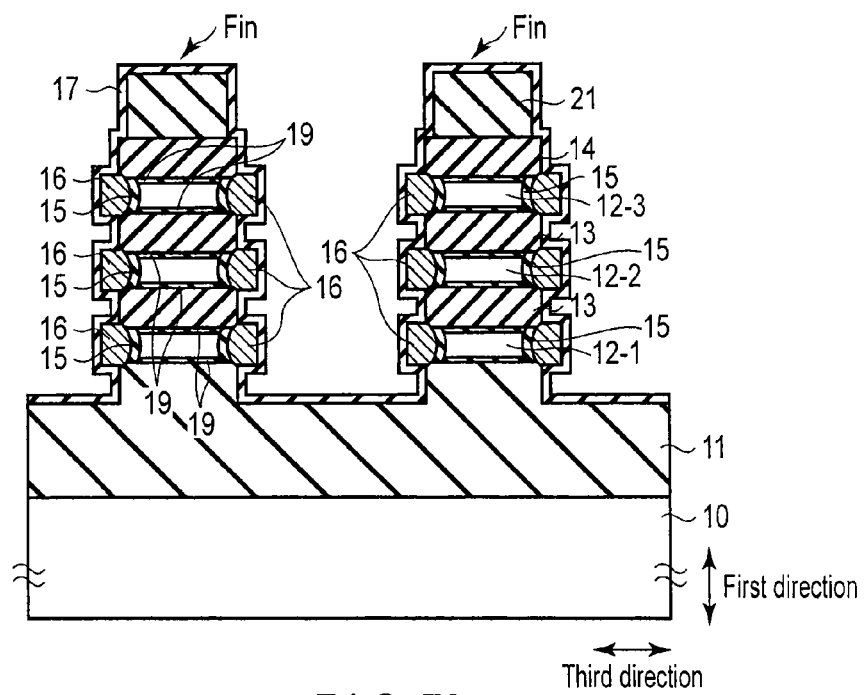
F I G. 76

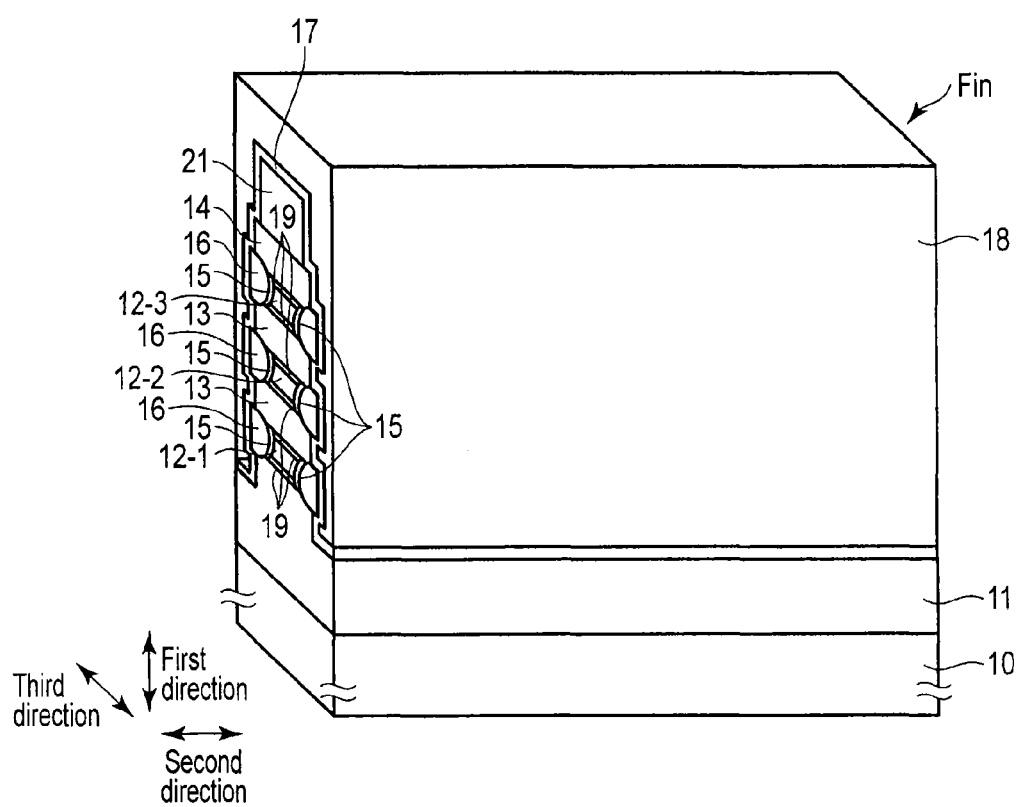
F I G. 77

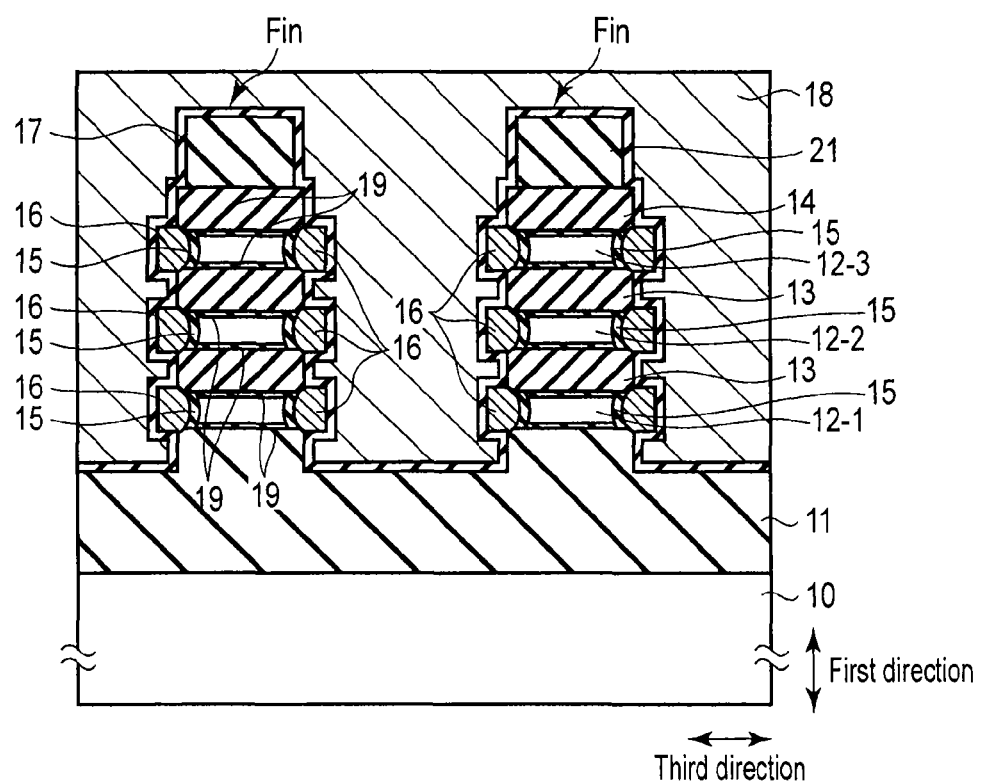
F I G. 82

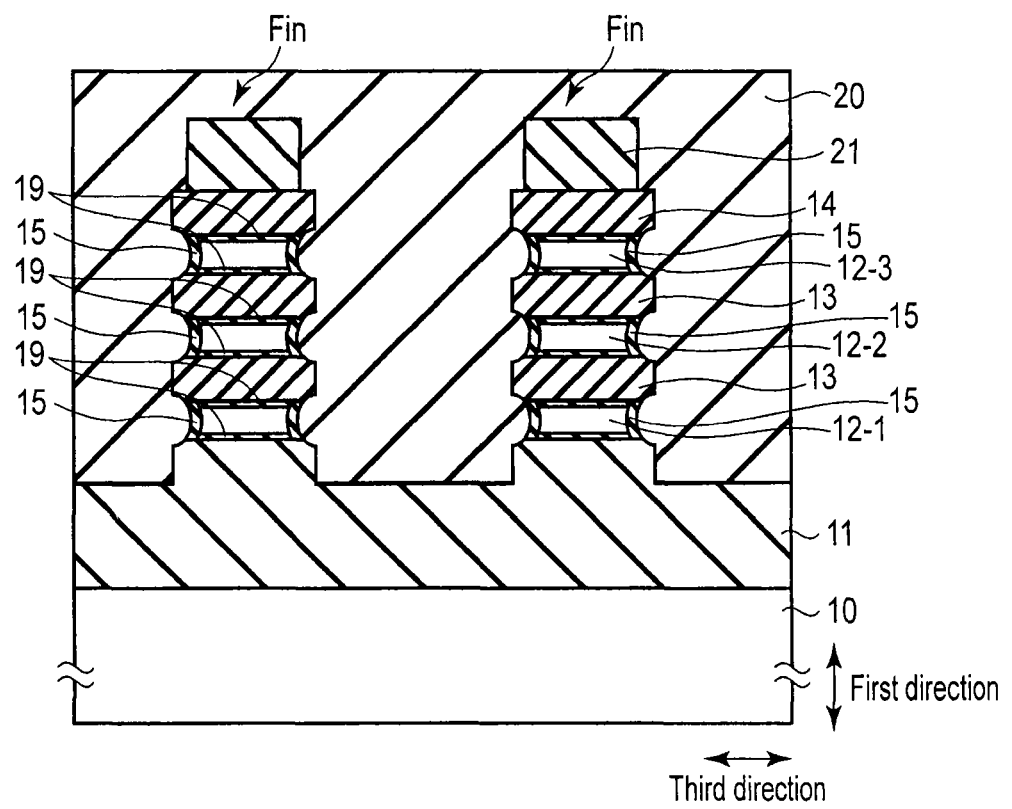
F I G. 83

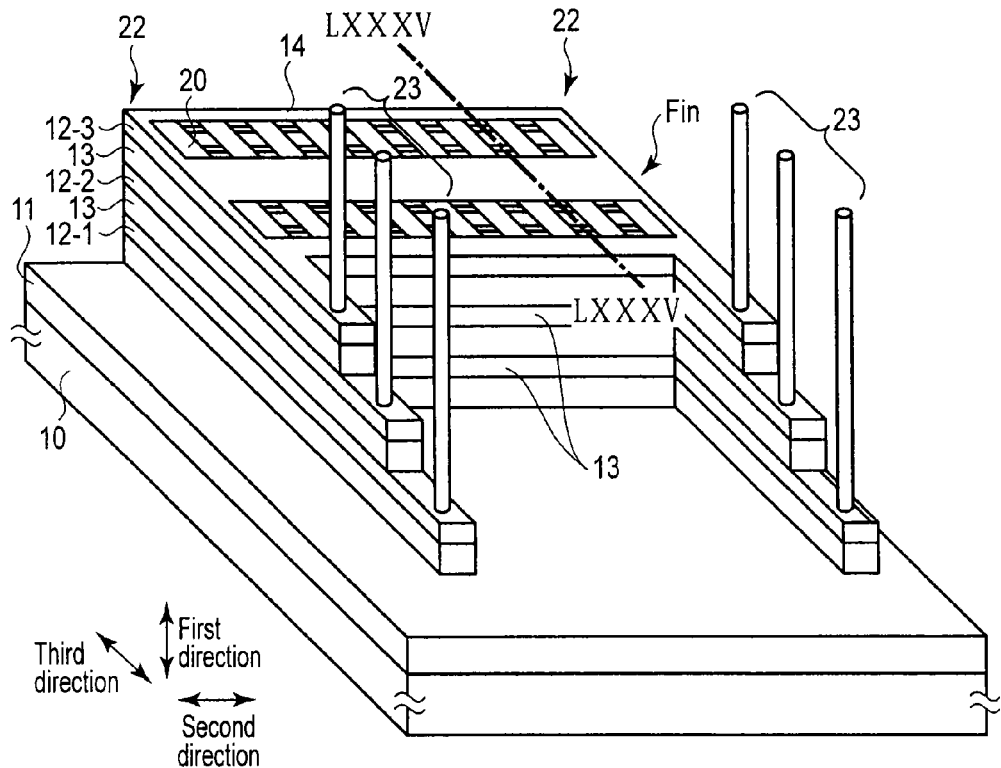
F I G. 84
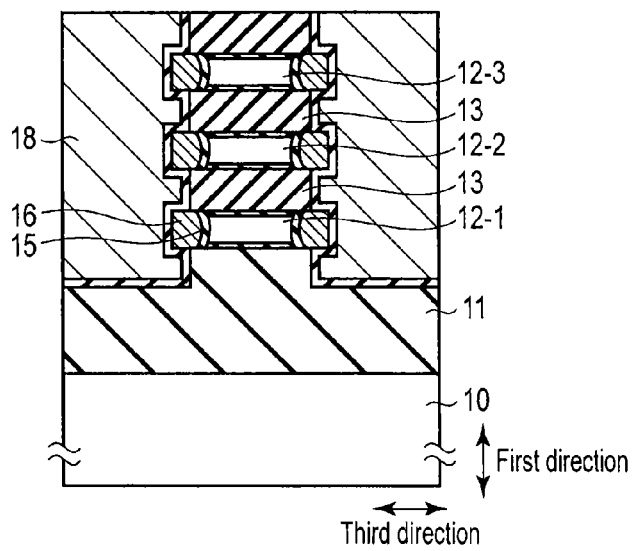
F I G. 85

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2012-022111, filed Feb. 3, 2012, the entire contents of which are incorporated herein by reference.

FIELD

Embodiments described herein relate generally to a nonvolatile semiconductor memory device and a method of manufacturing the same.

BACKGROUND

For higher integration and higher capacity of a nonvolatile semiconductor memory device, it is necessary to reduce design rules. In order to reduce the design rules, further micro fabrication of, for example, a wiring pattern is needed. However, an extremely high level of fabrication technique is required for this purpose, so that the reduction of the design rules has been increasingly difficult.

Accordingly, to enhance the integration of a memory cell, there has recently been suggested a three-dimensional nonvolatile semiconductor memory device comprising a fin structure that includes a structure in which a first oxide layer, a semiconductor layer, and a second oxide layer are stacked in this order.

A memory cell of this nonvolatile semiconductor memory device comprises a gate structure in which a gate oxide layer (tunnel oxide layer), a charge storage layer, a block insulating layer, and a control gate electrode are stacked in this order, for example, on the side surface of the semiconductor layer in the fin structure.

However, in this nonvolatile semiconductor memory device, characteristic improvement of the memory cell is difficult due to specific problems resulting from its manufacturing method.

For example, in the manufacturing method of this nonvolatile semiconductor memory device, a process for recessing the side surface of the semiconductor layer, that is, a process for shrinking the width of the semiconductor layer is employed after the formation of the fin structure. In this case, the side surface of the semiconductor layer is etched into a concave curve. This becomes noticeable when the semiconductor layer is recessed by wet etching (etching that uses a chemical).

This concave curve forms, in the edge of the semiconductor layer on the side of the first and second oxide layers, a tapered portion extending on the side of the charge storage layer. Thus, in the gate oxide layer formed along the concave curve of the semiconductor layer, an electric field concentrates between the tapered portion of the semiconductor layer and the charge storage layer. This leads to characteristic deterioration of the memory cell.

Therefore, when the generation of this concave curve is premised, it is necessary to suggest a new structure and a manufacturing method of the same which lessen the curvature of the concave curve and which prevent a local concentration of the electric field in the gate oxide layer of the memory cell, in order to put the above-mentioned three-dimensional nonvolatile semiconductor memory device into practical use.

BRIEF DESCRIPTION OF THE DRAWINGS

FIG. 1 and FIG. 2 are views showing basic embodiments;
FIG. 6 to FIG. 28 are views showing a process of a manufacturing method;
FIG. 29 is a perspective view showing a second embodiment;
FIG. 30 is a sectional view of FIG. 29;
FIG. 32 to FIG. 55 are views showing a process of a manufacturing method;
FIG. 58 is a sectional view taken along the line LVIII-LVIII in FIG. 56;
FIG. 59 to FIG. 83 are views showing a process of a manufacturing method;
FIG. 84 is a perspective view showing a VLB as an application example;
FIG. 85 is a sectional view taken along the line LXXXV-LXXXV in FIG. 84.

DETAILED DESCRIPTION

Figure 3:
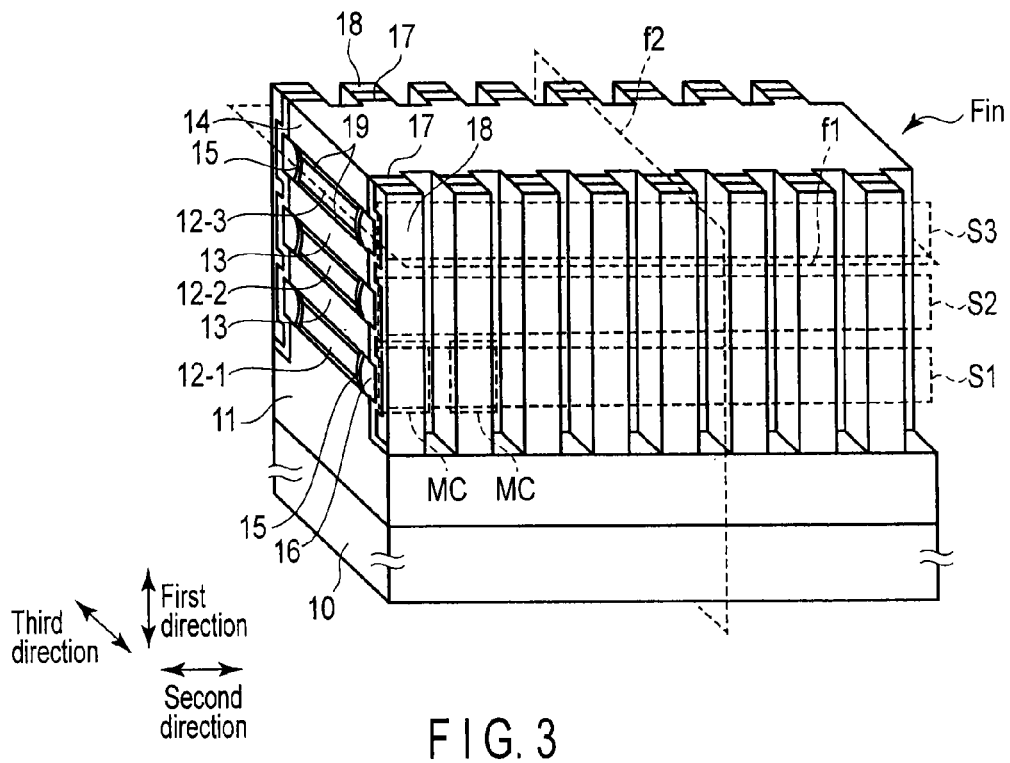
FIG. 3 is a perspective view showing a first embodiment.

In general, according to one embodiment, a nonvolatile semiconductor memory device comprises: a semiconductor substrate; a fin structure stacked in order of a first oxide layer, a semiconductor layer and a second oxide layer in a first direction perpendicular to a surface of the semiconductor substrate, the fin structure extending in a second direction parallel to the surface of the semiconductor substrate; and a gate structure stacked in order of a gate oxide layer, a charge storage layer, a block insulating layer and a control gate electrode in a third direction perpendicular to the first and second directions from a surface of the semiconductor layer in the third direction. The surface of the semiconductor layer in the third direction has a concave curve, and is located inside surfaces of the first and second oxide layers in the third direction. A surface of the charge storage layer beside the gate oxide layer has a convex curve. A curvature of the concave curve is smaller than a curvature of the convex curve.

Hereinafter, embodiments will be described with reference to the drawings.

Like components are indicated by like reference signs throughout the embodiments, and repeated explanations are not given. The drawings are schematic views illustrating the invention and serving to promote the understanding of the invention. The shapes, dimensions, and ratios are different from those in an actual device in some parts, but can be properly designed and modified in view of the following explanations and known techniques.

The embodiments below are intended for a three-dimensional nonvolatile semiconductor memory device comprising a fin structure that includes a structure in which a first oxide layer, a semiconductor layer, and a second oxide layer are stacked in this order.

A memory cell of this nonvolatile semiconductor memory device comprises a gate structure in which a gate oxide layer (tunnel oxide layer), a charge storage layer, a block insulating layer, and a control gate electrode are stacked in this order, for example, on the side surface of the semiconductor layer in the fin structure.

For example, a vertical gate ladder-bit cost scalable memory (VLB) which is one of vertical gate three-dimensional stacked layer memory corresponds to the nonvolatile semiconductor memory device for which the embodiments are intended.

The VLB is classified into a vertical gate-floating gate type (VG-FG type) in which a charge storage layer is an electrically floating conductive layer (floating gate electrode), and a vertical gate-Si/oxide/nitride/oxide/Si type (VG-SONOS type) in which a charge storage layer is a charge trapping insulating layer.

Here, the term called the block insulating layer is used as an insulating layer disposed between the charge storage layer and the control gate electrode mainly in the VG-SONOS type. On the other hand, in the VG-FG type, the insulating layer disposed between the charge storage layer and the control gate electrode is often represented as an inter-electrode insulator or an inter-polysilicon dielectric (IPD).

However, both when the floating gate electrode is used as the charge storage layer and when the charge trapping insulating layer is used as the charge storage layer, both the floating gate electrode and the charge trapping insulating layer are represented as the block insulating layers in the present specification for the common purpose of preventing a leak current between the charge storage layer and the control gate electrode.

In the nonvolatile semiconductor memory device comprising the above-mentioned fin structure, a process for recessing the side surface of the semiconductor layer, that is, a process for shrinking the width of the semiconductor layer by etching is employed after the formation of the fin structure in order to physically divide the charge storage layer in a stack layer direction in which the first oxide layer, the semiconductor layer, and the second oxide layer are stacked.

As a result of this process, a recess is formed between the first and second oxide layers. In the middle of the etching of the semiconductor layer, a phenomenon in which the center of the semiconductor layer is etched more than its end occurs. Therefore, the side surface of the semiconductor layer has a concave curve after the end of the etching.

For example, when the semiconductor layer is recessed by wet etching (etching that uses a chemical), the tip of the chemical is rounded by surface tension if the chemical enters the recess between the first and second oxide layers. That is, the center of the semiconductor layer is exposed to the chemical the most, so that the side surface of the semiconductor layer is etched into the concave curve.

This phenomenon becomes more noticeable if the semiconductor layer is reduced in thickness for higher integration.

This concave curve forms, in the edge of the semiconductor layer on the side of the first and second oxide layers, a tapered portion extending on the side of the charge storage layer. Thus, in the gate oxide layer formed along the concave curve of the semiconductor layer, an electric field concentrates between the tapered portion of the semiconductor layer and the charge storage layer. This leads to characteristic deterioration of the memory cell.

Accordingly, the embodiments suggest a new structure and a manufacturing method of the same which lessen the curvature of the concave curve of the semiconductor layer in the fin structure to prevent the deterioration in the characteristics and reliability of the memory cell caused by the concentration of the electric field.

Figure 1:
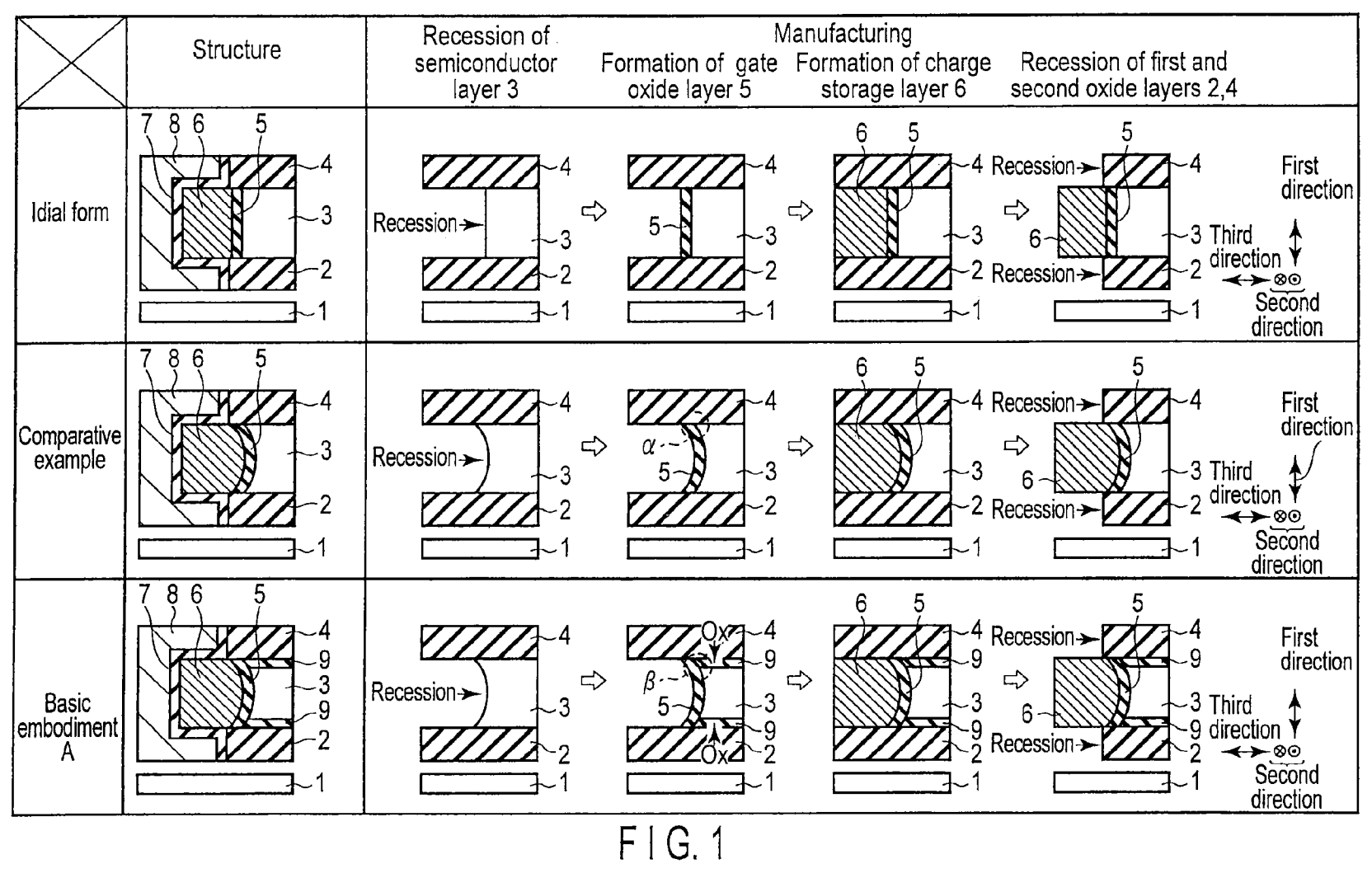
Figure 2:
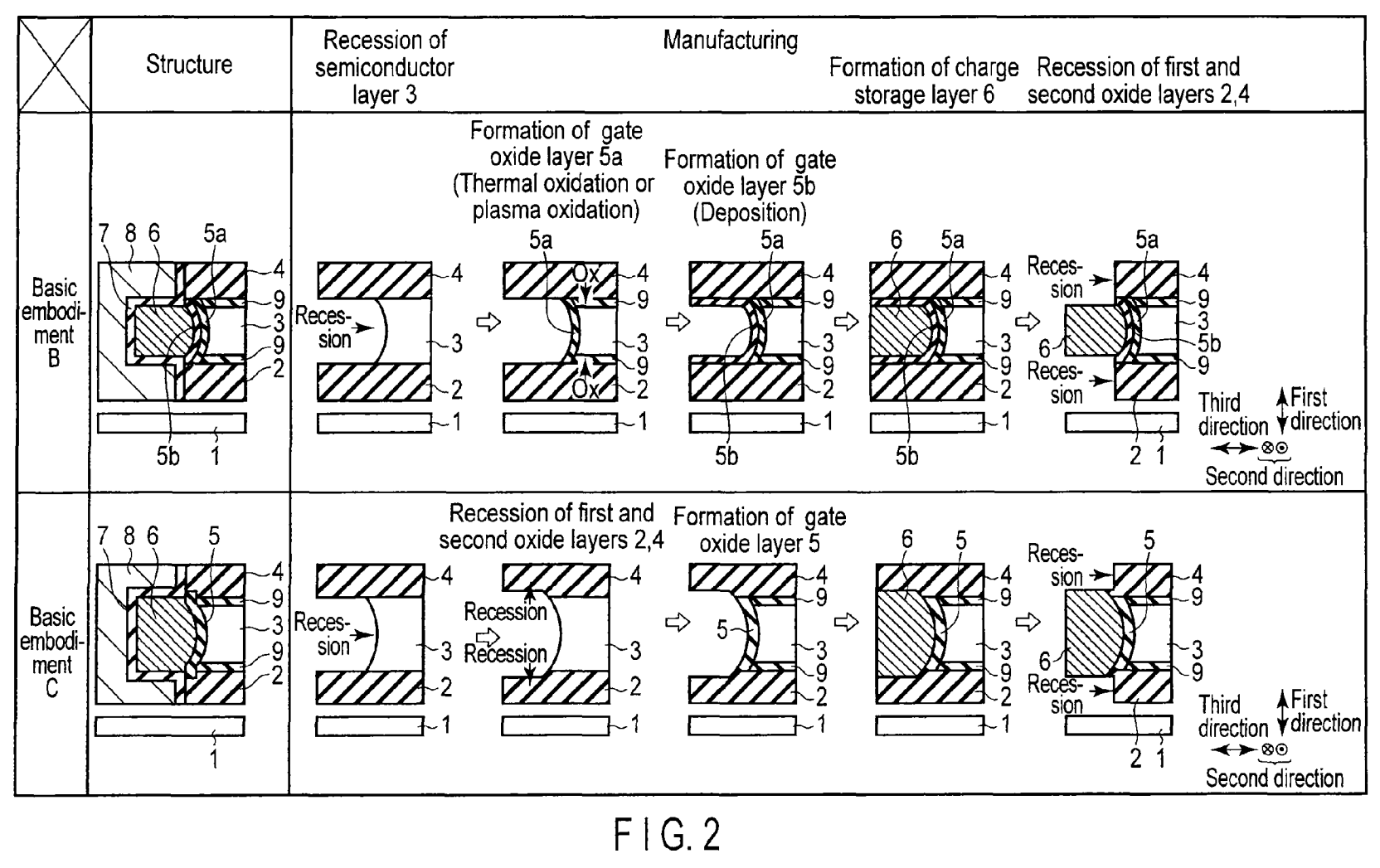

FIG. 1 and FIG. 2 show a structure and a manufacturing method of the same as basic embodiments.

The common characteristics of basic embodiments A, B, and C and a comparative example are as follows: A fin structure and a gate structure are provided on semiconductor substrate 1. The fin structure includes a structure in which first oxide layer 2, semiconductor layer 3, and second oxide layer 4 are stacked in this order in a first direction perpendicular to the surface of semiconductor substrate 1. The fin structure extends in a second direction parallel to the surface of semiconductor substrate 1. The gate structure includes gate oxide layer 5, charge storage layer 6, block insulating layer 7, and control gate electrode 8 that are stacked in this order on the surface (side surface) of semiconductor layer 3 in a third direction perpendicular to the first and second directions.

In the structure according to basic embodiments A, B, and C and the comparative example, the surface of semiconductor layer 3 in the third direction has a concave curve, and is located inside the surfaces of first and second oxide layers 2 and 4 in the third direction. The surface of charge storage layer 6 on the side of gate oxide layer 5 has a convex curve.

Here, in an ideal form, the surface of semiconductor layer 3 in the third direction and the surface of charge storage layer 6 on the side of gate oxide layer 5 are preferably linear.

However, as has already been described, in a recessing process of semiconductor layer 3 to divide the end of charge storage layer 6 in the first direction, the surface of semiconductor layer 3 in the third direction is etched into a concave curve.

Thus, according to basic embodiments A, B, and C, new oxide layer 9 is provided on the surface of semiconductor layer 3 in the first direction. This new oxide layer 9 decreases the curvature of the concave curve of semiconductor layer 3 in the third direction (increases the curvature radius). That is, new oxide layer 9 further oxidizes the edge of the concave curve of semiconductor layer 3, so that the curvature of the concave curve of semiconductor layer 3 becomes smaller than the curvature of the convex curve of charge storage layer 6.

The curvature of the concave curve of semiconductor layer 3 can be zero, that is, the curvature radius thereof can be infinite so that the surface of semiconductor layer 3 in the third direction may be linear.

Thus, according to basic embodiments A, B, and C, the curvature of the concave curve of semiconductor layer 3 is set within a range which is smaller than the curvature of the convex curve of charge storage layer 6 and which is equal to or more than zero (the curvature radius is zero).

Here, when the curvature of the concave curve of semiconductor layer 3 and the curvature of the convex curve of charge storage layer 6 vary by the locations thereof, the curvature of the concave curve and the curvature of the convex curve mean their maximum values.

According to basic embodiment A, the width of semiconductor layer (active area) 3 in the first direction is smaller than the width of charge storage layer 6 in the first direction. This structure has the advantageous effects of improving the coupling ratio of the memory cell and the controllability of a channel.

The structure according to basic embodiment A is formed through processes including the recession of semiconductor layer 3, the formation of gate oxide layer 5, the formation of charge storage layer 6, and the recession of first and second oxide layers 2 and 4, after the formation of the fin structure.

Semiconductor layer 3 is recessed by a method such as wet etching or dry etching. New oxide layer 9 can be formed by using a heat treatment after the recession of semiconductor layer 3 to diffuse oxygen from first and second oxide layers 2 and 4 to semiconductor layer 3, and causing a chemical reaction between oxygen atoms and semiconductor atoms.

In order that new oxide layer 9 may be easily formed by the heat treatment, the ratio of oxygen contained in first and second oxide layers 2 and 4 can be controlled in advance; for example, excessive oxygen can be contained in first and second oxide layers 2 and 4 in advance.

The heat treatment to form new oxide layer 9 may be a treatment to form gate oxide layer 5 on the surface of semiconductor layer 3 in the third direction, or a different treatment.

When the heat treatment is the treatment to form gate oxide layer 5 and new oxide layer 9 are simultaneously formed by a method such as thermal oxidation or plasma oxidation.

When the heat treatment is the treatment different from the treatment to form gate oxide layer 5, new oxide layer 9 may be formed before the formation of gate oxide layer 5 or may be formed after the formation of gate oxide layer 5.

Thus, as a result of the formation of new oxide layer 9, the curvature of edge β of semiconductor layer 3 according to basic embodiment A is smaller than the curvature of edge α of semiconductor layer 3 according to the comparative example (the tapering of the tapered portion of semiconductor layer 3 is lessened). This can prevent a local concentration of the electric field, and improve the characteristics and reliability of the memory cell.

Here, first and second oxide layers 2 and 4, gate oxide layer 5, and new oxide layer 9 may be all formed of the same material or may be respectively formed of different materials. At least two of first and second oxide layers 2 and 4, gate oxide layer 5, and new oxide layer 9 may be formed of the same material.

First and second oxide layers 2 and 4, gate oxide layer 5, and new oxide layer 9, when all formed of the same material, are preferably, for example, silicon oxide layers.

Charge storage layer 6 is formed, for example, by a process of depositing a material of charge storage layer 6, and a process of only leaving charge storage layer 6 in a recess between first and second oxide layers 2 and 4. First and second oxide layers 2 and 4 are recessed by a method such as wet etching or dry etching.

After the recession of first and second oxide layers 2 and 4, the end of the tapered portion of gate oxide layer 5 in the third direction is preferably located inside the surfaces of first and second oxide layers 2 and 4 in the third direction. This is because the concentration of the electric field in the tapered portion of gate oxide layer 5 can be further lessened.

However, the tapered portion of gate oxide layer 5 refers to the end (tapered portion) of gate oxide layer 5 in the first direction formed along the convex curve of charge storage layer 6.

According to basic embodiment B, the width of semiconductor layer (active area) 3 in the first direction is equal to or smaller than the width of charge storage layer 6 in the first direction. This structure has the advantageous effects of preventing inter-cell interference resulting from Yupin effect.

The structure according to basic embodiment B is formed through processes including the recession of semiconductor layer 3, the formation of gate oxide layers 5a and 5b, the formation of charge storage layer 6, and the recession of first and second oxide layers 2 and 4, after the formation of the fin structure.

Semiconductor layer 3 is recessed by a method such as wet etching or dry etching. New oxide layer 9 can be formed by using a heat treatment after the recession of semiconductor layer 3 to diffuse oxygen from first and second oxide layers 2 and 4 to semiconductor layer 3, and causing a chemical reaction between oxygen atoms and semiconductor atoms.

This heat treatment is the same as the heat treatment described in basic embodiment A. That is, the method (including modifications) of the heat treatment described in basic embodiment A can also be used in basic embodiment B.

However, the manufacturing method according to basic embodiment B comprises two processes: the formation of gate oxide layer 5a and the formation of gate oxide layer 5b.

Therefore, when the heat treatment to form new oxide layer 9 is a treatment to form a gate oxide layer, new oxide layer 9 is also formed when gate oxide layer 5a is formed. In this case, gate oxide layer 5a and new oxide layer 9 are simultaneously formed by a method such as thermal oxidation or plasma oxidation.

According to basic embodiment B, gate oxide layer 5a is formed by oxidizing semiconductor layer 3, and gate oxide layer 5b is formed by newly depositing an oxide layer in accordance with a deposition method such as CVD or PVD.

In this case, gate oxide layer 5b adheres along the inner surface of a recess between first and second oxide layers 2 and 4, so that the width of charge storage layer 6 in the first direction becomes small. As a result, the width of semiconductor layer (active area) 3 in the first direction is equal to or greater than the width of charge storage layer 6 in the first direction.

Although gate oxide layer 5b is formed after the formation of gate oxide layer 5a in basic embodiment B, gate oxide layer 5a can be formed after the formation of gate oxide layer 5b instead.

As in basic embodiment A, first and second oxide layers 2 and 4, gate oxide layers 5a and 5b, and new oxide layer 9 may be all formed of the same material or may be respectively formed of different materials. At least two of first and second oxide layers 2 and 4, gate oxide layers 5a and 5b, and new oxide layer 9 may be formed of the same material.

Charge storage layer 6 is formed, for example, by a process of depositing a material of charge storage layer 6, and a process of only leaving charge storage layer 6 in the recess between first and second oxide layers 2 and 4. First and second oxide layers 2 and 4 are recessed by a method such as wet etching or dry etching.

After the recession of first and second oxide layers 2 and 4, the ends of the tapered portions of gate oxide layers 5a and 5b in the third direction are preferably located inside the surfaces of first and second oxide layers 2 and 4 in the third direction. This is because the concentration of the electric field in the tapered portions of gate oxide layers 5a and 5b can be further lessened.

When first and second oxide layers 2 and 4 are recessed, gate oxide layer 5b formed in the recess between first and second oxide layers 2 and 4 is also removed.

According to basic embodiment C, the width of charge storage layer 6 in the first direction is greater than in basic embodiment A, so that the width of semiconductor layer (active area) 3 in the first direction is even smaller than the width of charge storage layer 6 in the first direction. This structure has the advantageous effects of further improving the coupling ratio of the memory cell and the controllability of a channel.

The structure according to basic embodiment C is formed through processes including the recession of semiconductor layer 3, the recession of first and second oxide layers 2 and 4, the formation of gate oxide layer 5, the formation of charge storage layer 6, and the recession of first and second oxide layers 2 and 4, after the formation of the fin structure.

Semiconductor layer 3 is recessed in the third direction by a method such as wet etching or dry etching. First and second oxide layers 2 and 4 are also recessed in the first direction by a method such as wet etching or dry etching. The width of a recess between first and second oxide layers 2 and 4 in the first direction is increased by the recession of first and second oxide layers 2 and 4.

New oxide layer 9 can be formed by using a heat treatment after the recession of semiconductor layer 3 to diffuse oxygen from first and second oxide layers 2 and 4 to semiconductor layer 3, and causing a chemical reaction between oxygen atoms and semiconductor atoms.

This heat treatment is the same as the heat treatment described in basic embodiment A. That is, the method (including modifications) of the heat treatment described in basic embodiment A can also be used in basic embodiment C.

For example, the heat treatment to form new oxide layer 9 may be a treatment to form gate oxide layer 5 on the surface of semiconductor layer 3 in the third direction, or a different treatment.

When the heat treatment is the treatment to form gate oxide layer 5, gate oxide layer 5 and new oxide layer 9 are simultaneously formed by a method such as thermal oxidation or plasma oxidation.

When the heat treatment is a treatment different from the treatment to form gate oxide layer 5, new oxide layer 9 may be formed before the formation of gate oxide layer 5 or may be formed after the formation of gate oxide layer 5.

Here, first and second oxide layers 2 and 4, gate oxide layer 5, and new oxide layer 9 may be all formed of the same material or may be respectively formed of different materials. At least two of first and second oxide layers 2 and 4, gate oxide layer 5, and new oxide layer 9 may be formed of the same material.

First and second oxide layers 2 and 4, gate oxide layer 5, and new oxide layer 9, when all formed of the same material, are preferably, for example, silicon oxide layers.

Charge storage layer 6 is formed, for example, by a process of depositing a material of charge storage layer 6, and a process of only leaving charge storage layer 6 in the recess between first and second oxide layers 2 and 4. Here, as has already been described, the width of the recess between first and second oxide layers 2 and 4 in the first direction is greater than in basic embodiment A, so that the width of charge storage layer 6 in the first direction is also greater than in basic embodiment A.

First and second oxide layers 2 and 4 are recessed in the third direction by a method such as wet etching or dry etching.

Thus, according to basic embodiments A, B, and C, the curvature of the concave curve of semiconductor layer 3 in the fin structure in the third direction is lessened, and a local concentration of the electric field in gate oxide layer 5 (5a and 5b) of the memory cell is prevented. This can improve the characteristics or reliability of the memory cell of the three-dimensional nonvolatile semiconductor memory device.

First to third embodiments of a VG-FG type VLB are described below.

First Embodiment

Figure 4:
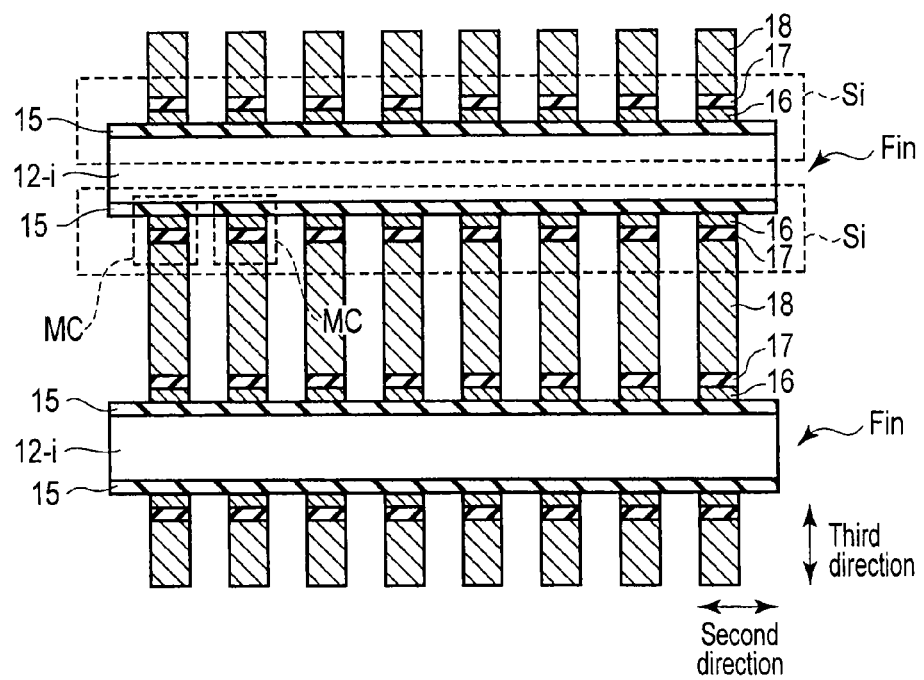
FIG. 4 is a sectional view of FIG. 3.
Figure 5:
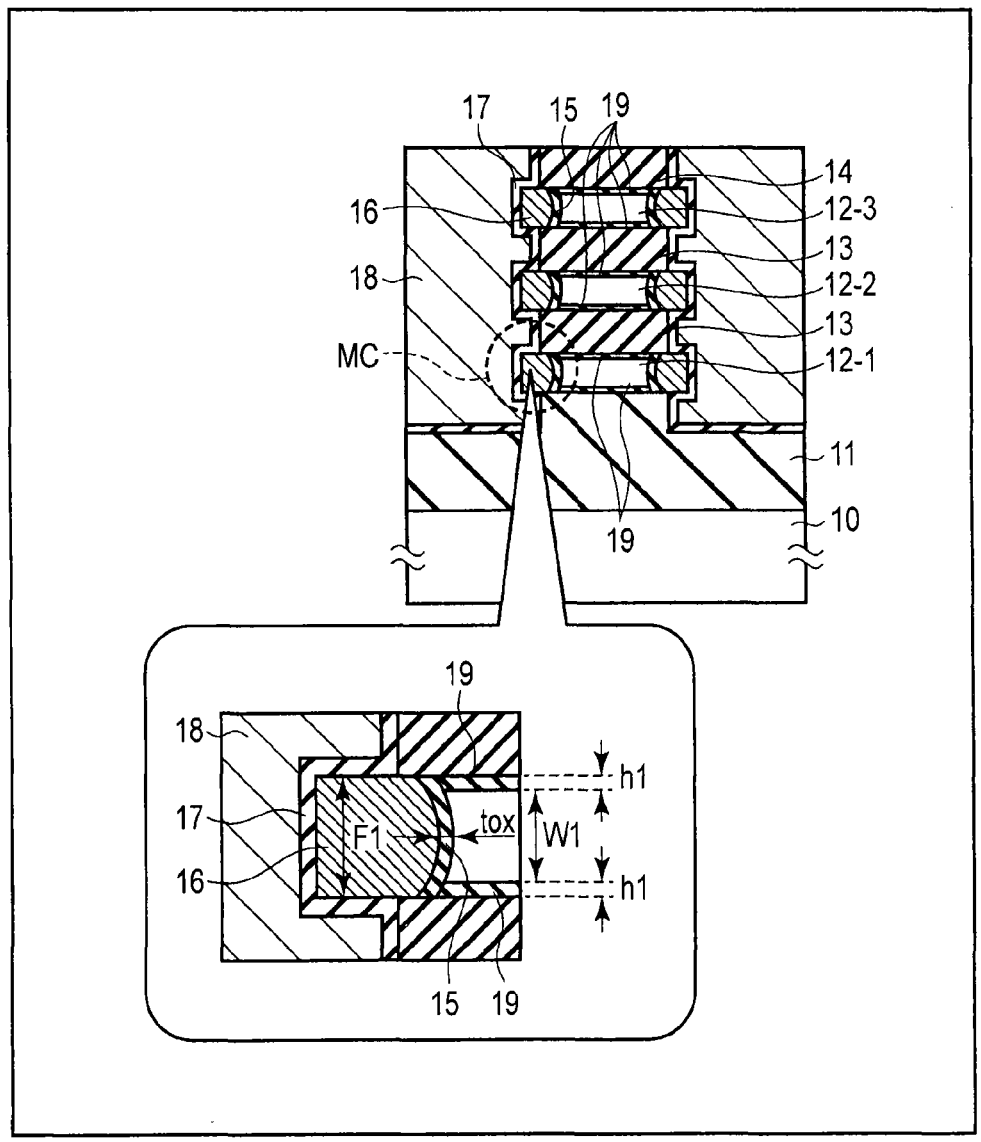
FIG. 5 is a sectional view taken along the line V-V in FIG. 3.

FIG. 3 shows the structure of a VG-FG type VLB. FIG. 4 is a sectional view of the structure of FIG. 3 cut along surface f1. FIG. 5 is a sectional view of the structure of FIG. 3 cut along surface f2.

As has already been described, the common characteristics of basic embodiments A, B, and C are the structure of a memory cell and a manufacturing method of the same. Thus, according to the present embodiment, a memory cell array of the VG-FG type VLB is described.

A selector to select a memory cell of the memory cell array is needed to actually operate the VG-FG type VLB. The selector is not described here because a known technique can be applied. An example of the selector will be described as an application example after the first to third embodiments of the VG-FG type VLB are described.

Semiconductor substrate 10 is, for example, a silicon substrate. Oxide layer 11 is, for example, a silicon oxide layer called buried oxide (BOX), and is used as an element isolation insulating layer.

First, second, and third semiconductor layers (active areas) 12-1, 12-2, and 12-3 are disposed on oxide layer 11. First, second, and third semiconductor layers 12-1, 12-2, and 12-3 are stacked in a first direction perpendicular to the surface of semiconductor substrate 10, extend in a second direction parallel to the surface of semiconductor substrate 10, and are insulated from one another.

Although the structure in which three semiconductor layers are stacked is shown in the present embodiment, the invention is not limited thereto. Two or more semiconductor layers have only to be stacked. A greater number of semiconductor layers stacked are preferable because a memory capacity as a semiconductor memory is increased accordingly.

First, second, and third semiconductor layers 12-1, 12-2, and 12-3 are insulated from one another by oxide layers (e.g. silicon oxide layers) 13.

Oxide layer (e.g. silicon oxide layer) 14 is disposed on uppermost third semiconductor layer 12-3.

First, second, and third semiconductor layers 12-1, 12-2, and 12-3 and oxide layers 13 and 14 constitute fin structure Fin. First, second, and third semiconductor layers 12-1, 12-2, and 12-3 are preferably monocrystalline, but may be polycrystalline or amorphous.

First, second, and third memory strings S1, S2, and S3 use first, second, and third semiconductor layers 12-1, 12-2, and 12-3 as channels, respectively. Each of first, second, and third memory strings S1, S2, and S3 comprises memory cells MC connected in series in the second direction.

Each of first, second, and third memory strings S1, S2, and S3 comprises floating gate electrodes 16 and control gate electrodes 18 corresponding to memory cells MC, on the surfaces of first, second, and third semiconductor layers 12-1, 12-2, and 12-3 in a third direction perpendicular to the first and second directions.

Gate oxide layer (tunnel oxide layer) 15 is disposed between first, second, and third semiconductor layers 12-1, 12-2, and 12-3 and floating gate electrodes 16. Block insulating layer 17 to prevent a leak current during writing/erasing is disposed between floating gate electrodes 16 and control gate electrodes 18.

Control gate electrodes 18 extend in the first direction along the surfaces of first, second, and third semiconductor layers 12-1, 12-2, and 12-3 in the third direction.

Although the present embodiment shows the structure in which three memory strings corresponding to three semiconductor layers are stacked, the invention is not limited thereto. Two or more memory strings corresponding to two or more semiconductor layers have only to be stacked.

The surfaces of first, second, and third semiconductor layers 12-1, 12-2, and 12-3 in the third direction have concave curves, and are located inside the surfaces of oxide layers 11, 13, and 14 in the third direction. The surfaces of floating gate electrodes 16 on the side of gate oxide layer 15 have convex curves.

Gate oxide layer 15 between first, second, and third semiconductor layers 12-1, 12-2, and 12-3 and floating gate electrodes 16 has a curved surface, and has a tapered portion at the end in the first direction.

New oxide layer (e.g. silicon oxide layer) 19 having thickness (width in the first direction) h1 is disposed on the surfaces of first, second, and third semiconductor layers 12-1, 12-2, and 12-3 in the first direction.

New oxide layer 19 decreases the curvature of the concave curves of first, second, and third semiconductor layers 12-1, 12-2, and 12-3 in the third direction. As a result, the curvature of the concave curves of first, second, and third semiconductor layers 12-1, 12-2, and 12-3 is smaller than the curvature of the convex curves of floating gate electrodes 16.

According to the present embodiment, a new oxide layer having thickness h1 is formed on the surfaces of first, second, and third semiconductor layers 12-1, 12-2, and 12-3 in the first direction.

Therefore, the width of first, second, and third semiconductor layers 12-1, 12-2, and 12-3 in the first direction is W1(=F1−2×h1) wherein F1 is the width of one floating gate electrode 16 in the first direction, and h1 is the thickness of new oxide layer 19. Width W1 corresponds to the channel width of each of memory cells (FETs) MC that constitute memory strings S1, S2, and S3.

In order to prevent inter-cell interference resulting from what is called Yupin effect, the total thickness (width in the first direction) of oxide layers 13 and 19 between first, second, and third semiconductor layers 12-1, 12-2, and 12-3 is preferably 40 nm or more when width W1 is about 20 nm.

When the thickness (width in the third direction) of gate oxide layer 15 is tox (e.g. about 8 nm), thickness h1 of new oxide layer 19 is generally equal to or less than tox. Therefore, the width of first, second, and third semiconductor layers 12-1, 12-2, and 12-3 in the first direction before the heat treatment to form new oxide layer 19 needs to be more than at least 2×tox (e.g. about 16 nm) to ensure width W1 after the heat treatment.

According to the structure described above, the curvature of the concave curves of first, second, and third semiconductor layers 12-1, 12-2, and 12-3 in fin structure Fin in the third direction is lessened, and a local concentration of the electric field in gate oxide layer 15 of memory cell MC is prevented. This can improve the characteristics or reliability of memory cell MC.

According to the present embodiment, width (channel width) W1 of first, second, and third semiconductor layers 12-1, 12-2, and 12-3 in the first direction is smaller than width F1 of floating gate electrode 16 in the first direction, so that the coupling ratio of the memory cell and the controllability of the channel can be improved.

Materials best suited to each semiconductor memory generation can be properly selected as the materials that constitute the VG-FG type VLB described above. Examples of most frequently used materials are described below.

Semiconductor substrate 10 is, for example, a monocrystalline silicon substrate.

Oxide layer 11 is, for example, a silicon oxide layer. Oxide layer 11 may have a multilayer structure including different insulating layers if the part that contacts first semiconductor layer 12-1 is an oxide layer. Oxide layer 13 is also, for example, a silicon oxide layer. Oxide layer 13 may have a multilayer structure including different insulating layers if the part that contacts first, second, and third semiconductor layers 12-1, 12-2, and 12-3 is an oxide layer.

Each of first, second, and third semiconductor layers 12-1, 12-2, and 12-3 is, for example, a silicon (Si) layer. First, second, and third semiconductor layers 12-1, 12-2, and 12-3 are preferably monocrystalline, but may be amorphous or polycrystalline.

Uppermost oxide layer 14 that constitutes fin structure Fin is, for example, a silicon oxide layer. Oxide layer 14 may have a multilayer structure including different insulating layers if the part that contacts third semiconductor layer 12-3 is an oxide layer.

Gate oxide layer (tunnel oxide layer) 15 that constitutes memory cell MC is, for example, a silicon oxide layer. Gate oxide layer 15 may be silicon oxynitride, or a stacked layer structure of silicon oxide and silicon nitride. Gate oxide layer 15 may include silicon nanoparticles or metal ions.

(Nondoped or impurity-added) polysilicon, (nondoped or impurity-added) amorphous silicon, or a metal can be selected for floating gate electrode 16. Floating gate electrode 16 may have a stacked layer structure including different materials.

In the VG-FG type VLB described according to the present embodiment, the charge storage layer of memory cell MC is floating gate electrode 16. However, in the case of a VG-SONOS type VLB in which the charge storage layer of memory cell MC is a charge trapping insulating layer, the charge storage layer that constitutes memory cell MC can be made of a material selected from the group consisting of, for example, silicon-rich SiN, $Si_x N_y$, having any composition ratio x, y of silicon and nitrogen, silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), and lanthanum aluminate ($LaAlO_3$).

The charge storage layer may include, for example, silicon nanoparticles or metal ions.

Block insulating layer 17 that constitutes memory cell MC functions, for example, to prevent a leak current during writing/erasing. Block insulating layer 17 can be made of a material selected from the group consisting of, for example, silicon oxide ($SiO_2$), silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), lanthanum aluminate ($LaAlO_3$), and lanthanum aluminum silicate (LaAlSiO).

Control gate electrode 18 constituting memory cell MC comprises one of a conductive polysilicon layer and a metal silicide layer such as nickel silicide (NiSi).

Control gate electrode 18 may be made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

An interlayer insulating layer to fill the space between control gate electrode 18 is preferably made of a material substantially equal in dielectric constant to a silicon oxide layer having a relative dielectric constant of 3.9. Although TEOS is shown here as an example of the interlayer insulating layer, the interlayer insulating layer may be, for example, a silicon oxide layer formed by burning polysilazane through a heat treatment.

FIG. 6 to FIG. 28 show a method of manufacturing the VG-FG type VLB in FIG. 3 to FIG. 5.

Figure 6:
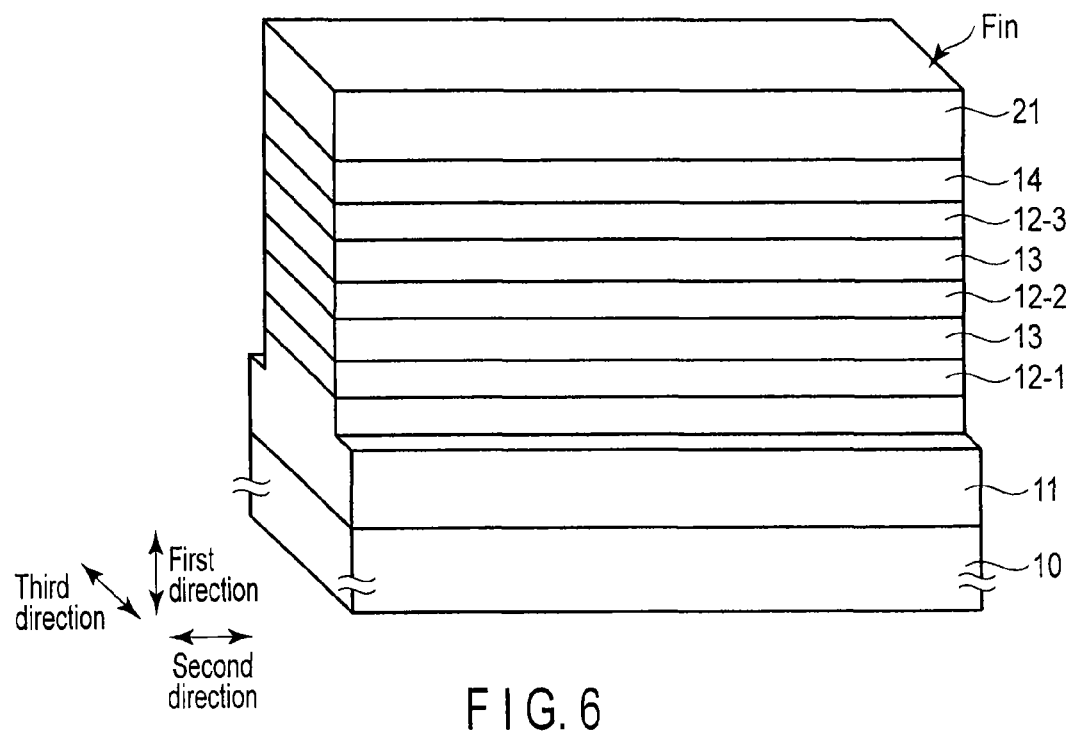
Figure 7:
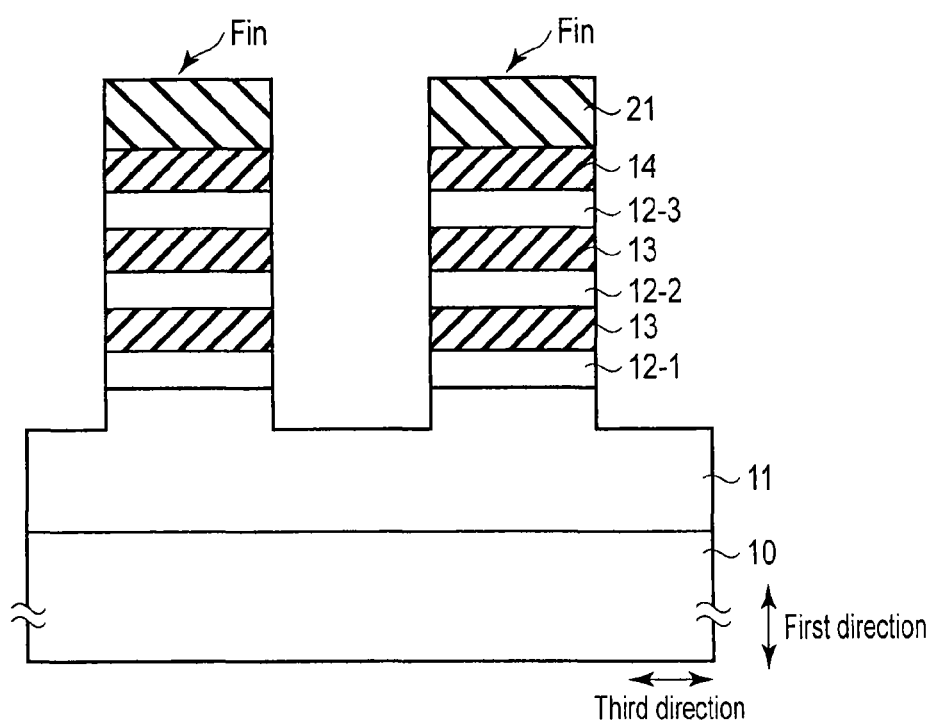

First, as shown in FIG. 6 and FIG. 7, a p-type or n-type silicon substrate, for example, having a plane direction (100) and a specific resistance of 10 to 20 Ωcm is prepared as semiconductor substrate 10. On this semiconductor substrate 10, silicon oxide layers as oxide layers 11, 13, and 14, and polycrystalline silicon layers as first, second, and third semiconductor layers 12-1, 12-2, and 12-3 are alternately formed. Hard mask layer (e.g. silicon nitride layer) 21 is then formed on oxide layer 14.

A resist pattern is formed on hard mask layer 21 by photo engraving process (PEP). The resist pattern is used as a mask to sequentially etch hard mask layer 21, oxide layer 14, third semiconductor layer 12-3, oxide layer 13, second semiconductor layer 12-2, oxide layer 13, and first semiconductor layer 12-1 by reactive ion etching (RIE).

As a result, fin structure Fin is formed. The resist pattern is then removed.

Figure 8:
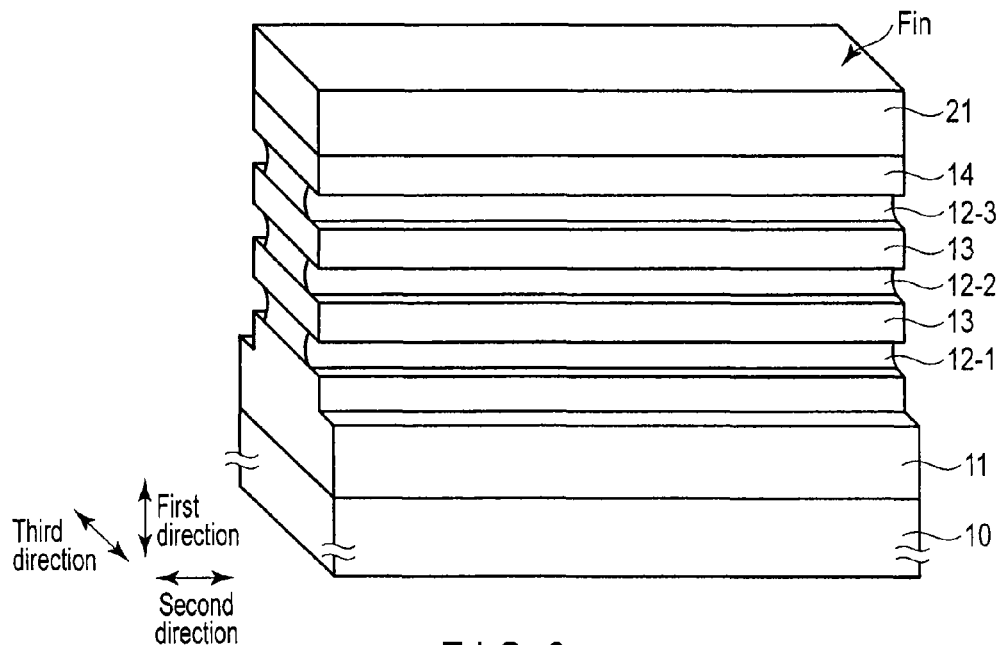
Figure 9:
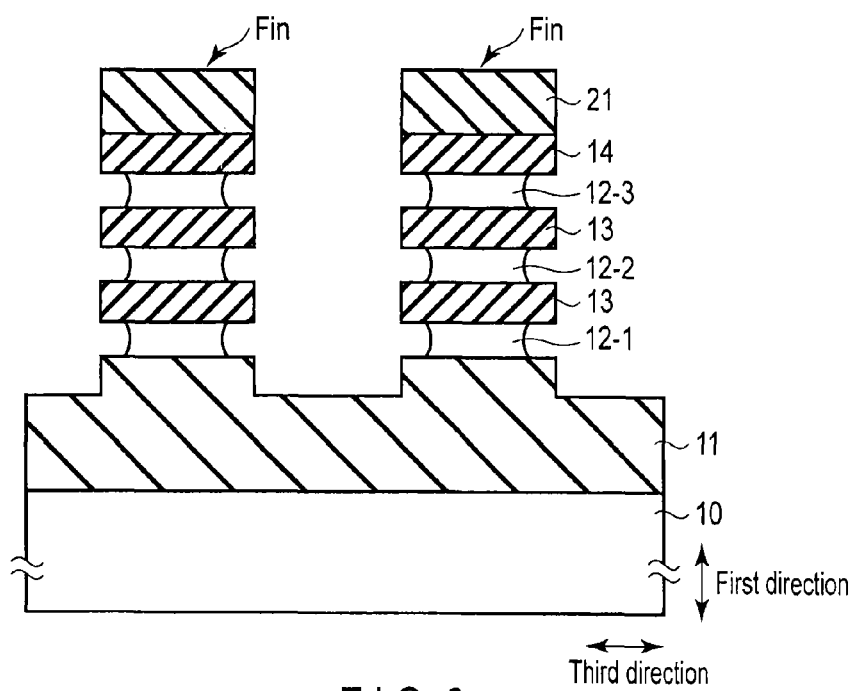

As shown in FIG. 8 and FIG. 9, the surfaces, in the third direction, of first, second, and third semiconductor layers 12-1, 12-2, and 12-3 that constitute fin structure Fin are then recess-etched, for example, by wet etching that uses chlorine, chemical dry etching (CDE), or dry etching that uses a chlorine gas. As a result, a recess is formed in the surface of fin structure Fin in the third direction.

The surfaces of first, second, and third semiconductor layers 12-1, 12-2, and 12-3 in the third direction are formed into concave curves by the etching.

Here, the concave curves of first, second, and third semiconductor layers 12-1, 12-2, and 12-3 are particularly noticeable when the wet etching is used as the recess-etching. That is, if first, second, and third semiconductor layers 12-1, 12-2, and 12-3 are recessed in the third direction by the wet etching, the tip of an etching solution (chemical) is rounded by surface tension when entering the recesses between oxide layers 11, 13, and 14.

Accordingly, the surfaces of first, second, and third semiconductor layers 12-1, 12-2, and 12-3 in the third direction are recess-etched into the concave curves.

Figure 10:
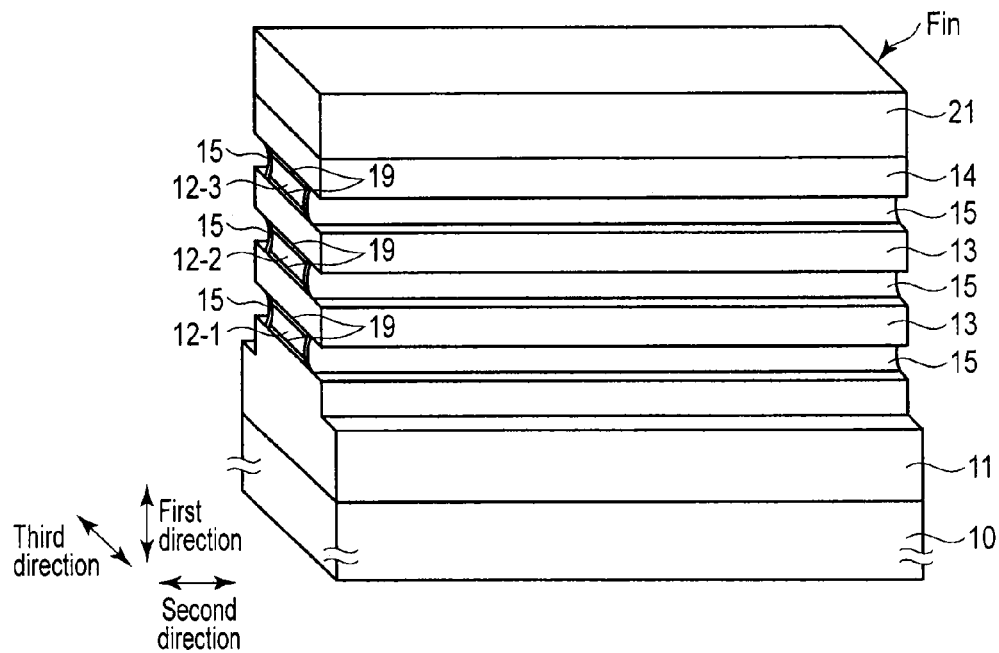
Figure 11:
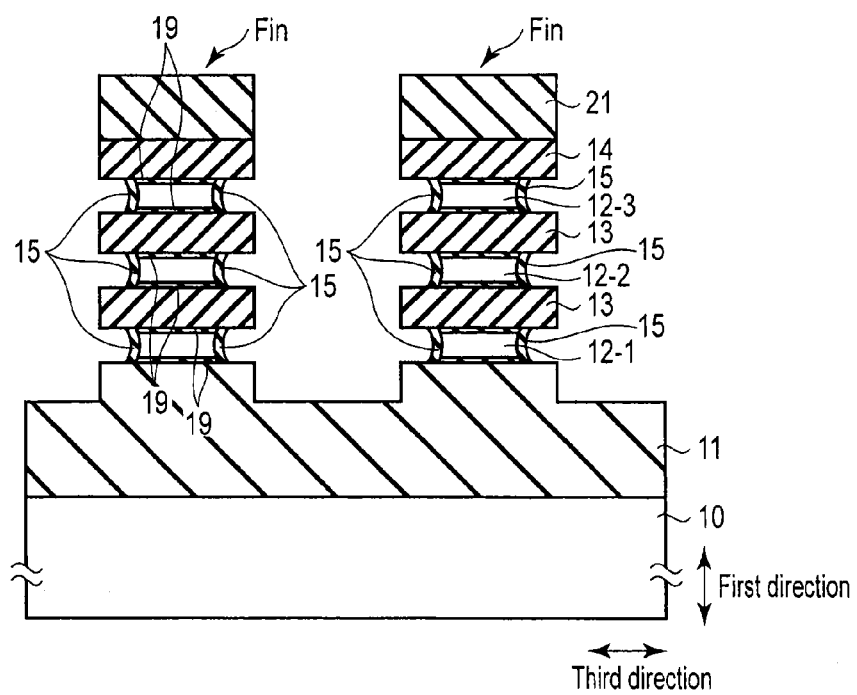

As shown in FIG. 10 and FIG. 11, gate oxide layer (e.g. silicon oxide layer) 15 as a tunnel oxide layer is then formed, for example, by a slot plane antenna (SPA) plasma generation technique in the recess of fin structure Fin in the third direction, that is, on the surfaces of first, second, and third semiconductor layers 12-1, 12-2, and 12-3 in the third direction.

As the surfaces of foundation first, second, and third semiconductor layers 12-1, 12-2, and 12-3 in the third direction have the concave curves, gate oxide layer 15 is shaped into a curved surface as a result.

However, according to the present embodiment, oxygen is diffused from oxide layers 11, 13, and 14 to first, second, and third semiconductor layers 12-1, 12-2, and 12-3, for example, simultaneously with the formation of gate oxide layer 15 to form new oxide layer 19 on the surfaces of first, second, and third semiconductor layers 12-1, 12-2, and 12-3 in the first direction.

Therefore, the curvature of the concave curves of first, second, and third semiconductor layers 12-1, 12-2, and 12-3 is lessened by new oxide layer 19.

Figure 12:
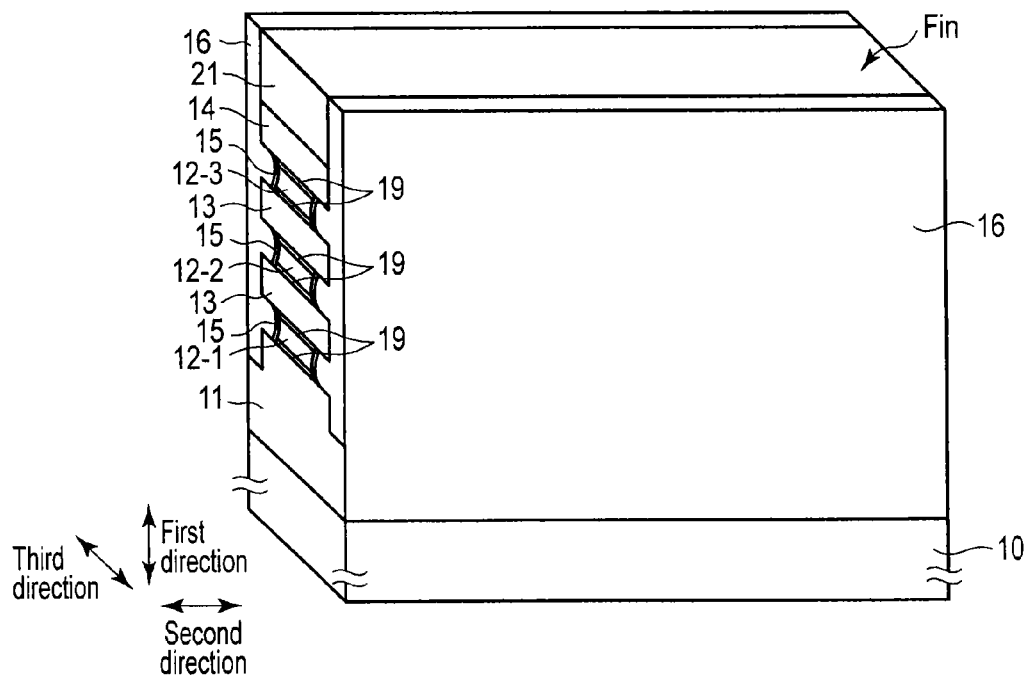
Figure 13:
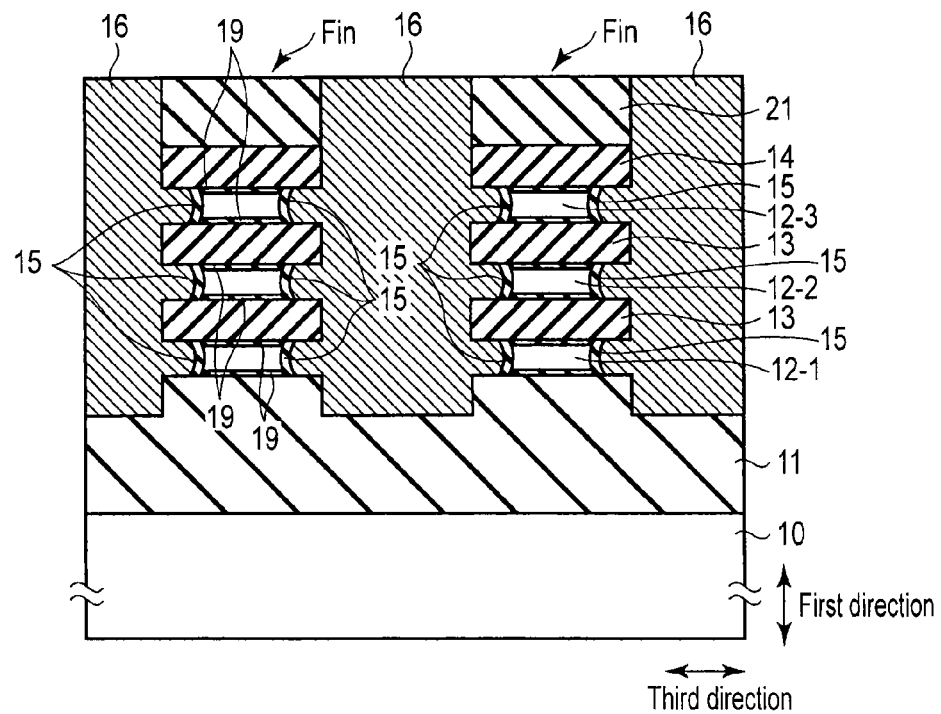

As shown in FIG. 12 and FIG. 13, floating gate electrode 16 covering the entire surface of fin structure Fin is then formed, for example, by CVD.

As shown in FIG. 14 and FIG. 15, extra parts of floating gate electrode 16 other than the part located in the recess of fin structure Fin in the third direction are then removed, for example, by RIE. As a result, floating gate electrode 16 only remains on gate oxide layer 15 which is on the surfaces of first, second, and third semiconductor layers 12-1, 12-2, and 12-3 in the third direction.

At the same time, floating gate electrode 16 is divided into parts in the first direction, and each of the parts constitutes one layer extending in the second direction along one semiconductor layer 12-$i$ (i is one of 1 to 3) functioning as a channel of the memory string.

Figure 16:
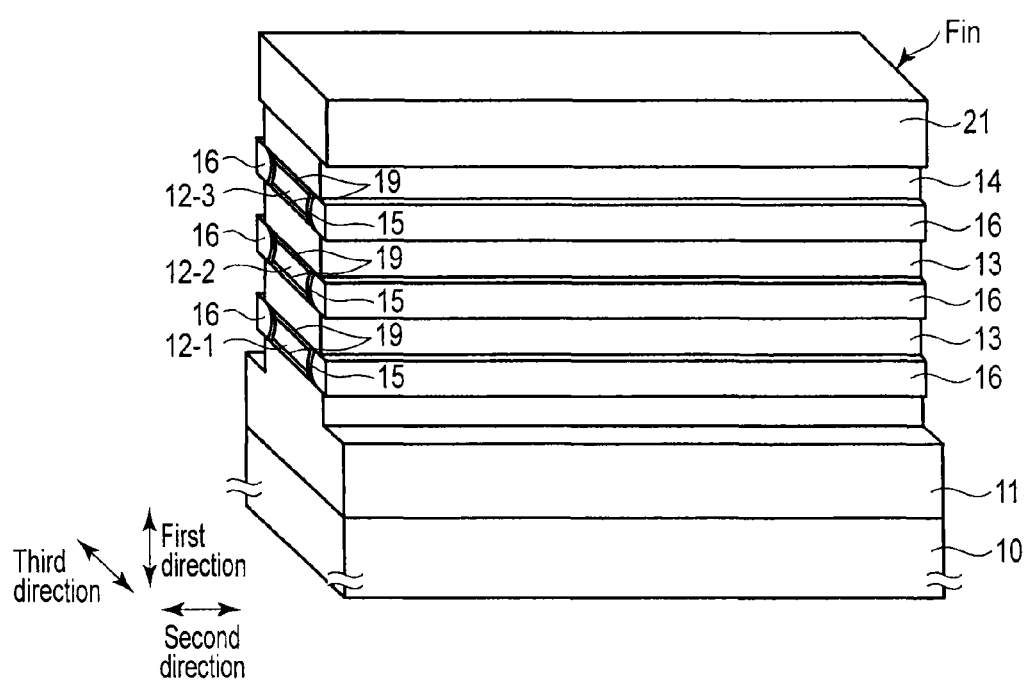
Figure 17:
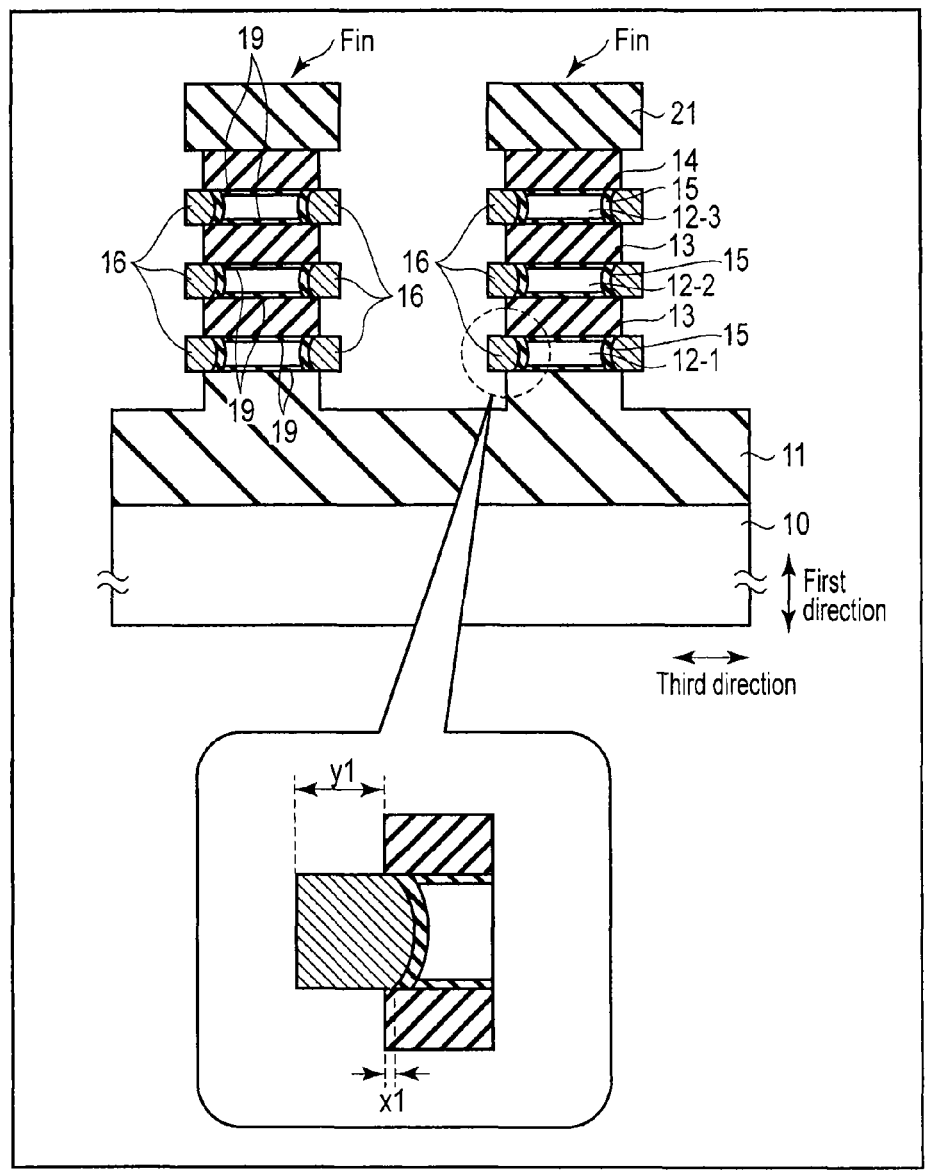

As shown in FIG. 16 and FIG. 17, the surfaces of oxide layers 11, 13, and 14 in the third direction are then recess-etched, for example, by wet etching or by isotropic dry etching that uses $HF/NH_3$ gas.

Etching amount y1 of oxide layers 11, 13, and 14 is set so that the surfaces of oxide layers 11, 13, and 14 in the third direction after the etching are located outside the part (the tapered portion of gate oxide layer 5), which is located on the outermost side of fin structure Fin, of an interface between gate oxide layer 15 and floating gate electrode 16.

This is intended to prevent a control gate electrode that will be formed later from being excessively close to the edges of first, second, and third semiconductor layers 12-1, 12-2, and 12-3. As the area in which the later-formed control gate electrode and the floating gate electrode face each other is increased by the recess-etching of oxide layers 11, 13, and 14, the coupling ratio of the memory cell can be improved.

According to the present embodiment, the width of a portion between the surfaces of oxide layers 11, 13, and 14 in the third direction after the etching and the part, which is located on the outermost side of fin structure Fin, of the interface between gate oxide layer 15 and floating gate electrode 16 is set to x1.

Figure 18:
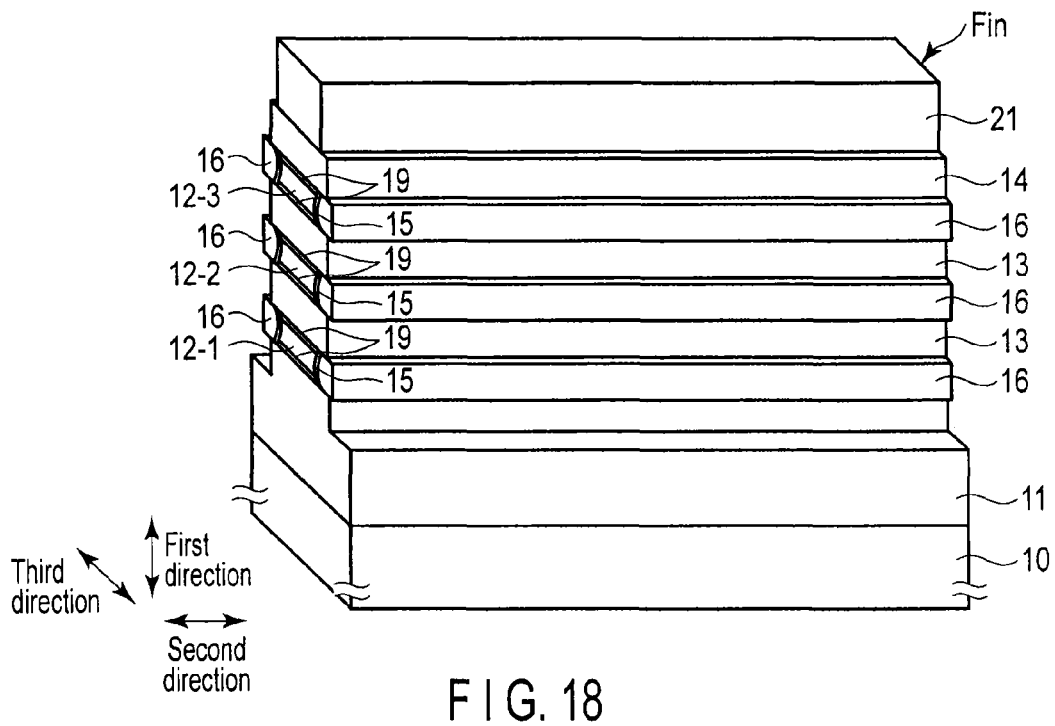
Figure 19:
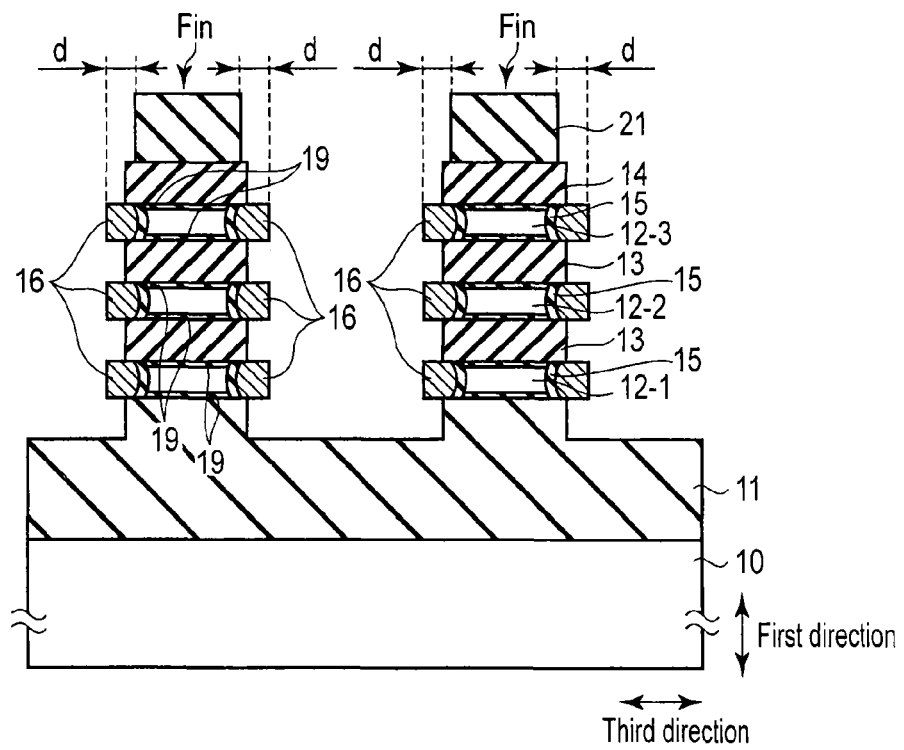

As shown in FIG. 18 and FIG. 19, hard mask layer 21 is etched, for example, by isotropic etching, and the width of hard mask layer 21 in the third direction is shrunk.

This process is carried out to ensure that floating gate electrode (one layer extending in the second direction) 16 in one memory string is divided for each memory cell during later-described patterning of the control gate.

Therefore, this process can be omitted on the premise that floating gate electrode 16 in one memory string is not divided for each memory cell, for example, as in the VG-SONOS type VLB.

Shrinkage amount d of hard mask layer 21 resulting from this process is an amount (ideal value) that is enough for floating gate electrode 16 in one memory string to be divided for each memory cell during the patterning of the control gate electrode.

More specifically, shrinkage amount d is set so that the surface of hard mask layer 21 in the third direction after the shrinkage is outside the interface between first, second, and third semiconductor layers 12-1, 12-2, and 12-3 and gate oxide layer 15. Particularly preferably, the surface of hard mask layer 21 in the third direction after the shrinkage is located outside the interface between first, second, and third semiconductor layers 12-1, 12-2, and 12-3 and gate oxide layer 15 and inside the interface between gate oxide layer 15 and floating gate electrode 16.

Figure 20:
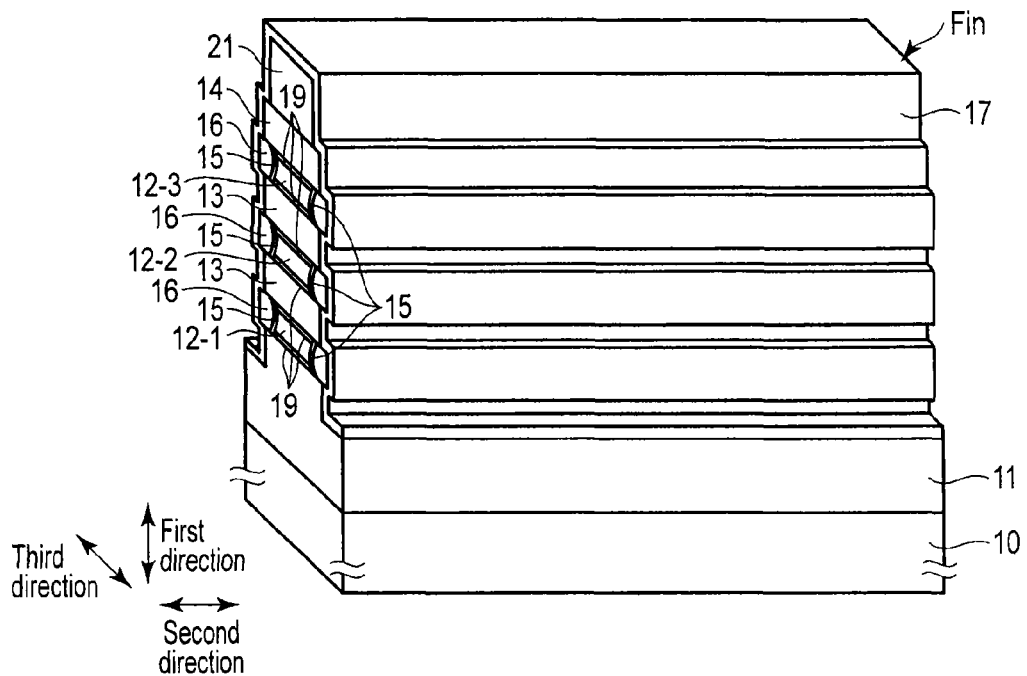
Figure 21:
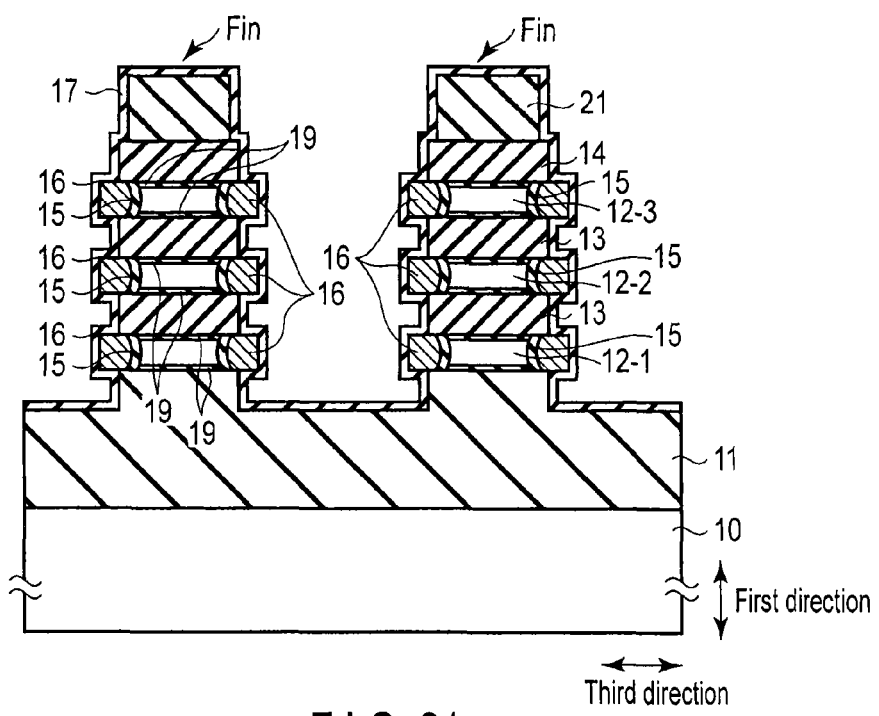

As shown in FIG. 20 and FIG. 21, block insulating layer (e.g. $SiO_2/Si_3N_4/SiO_2$) 17 covering the entire surface of fin structure Fin is then formed, for example, by CVD.

Figure 22:
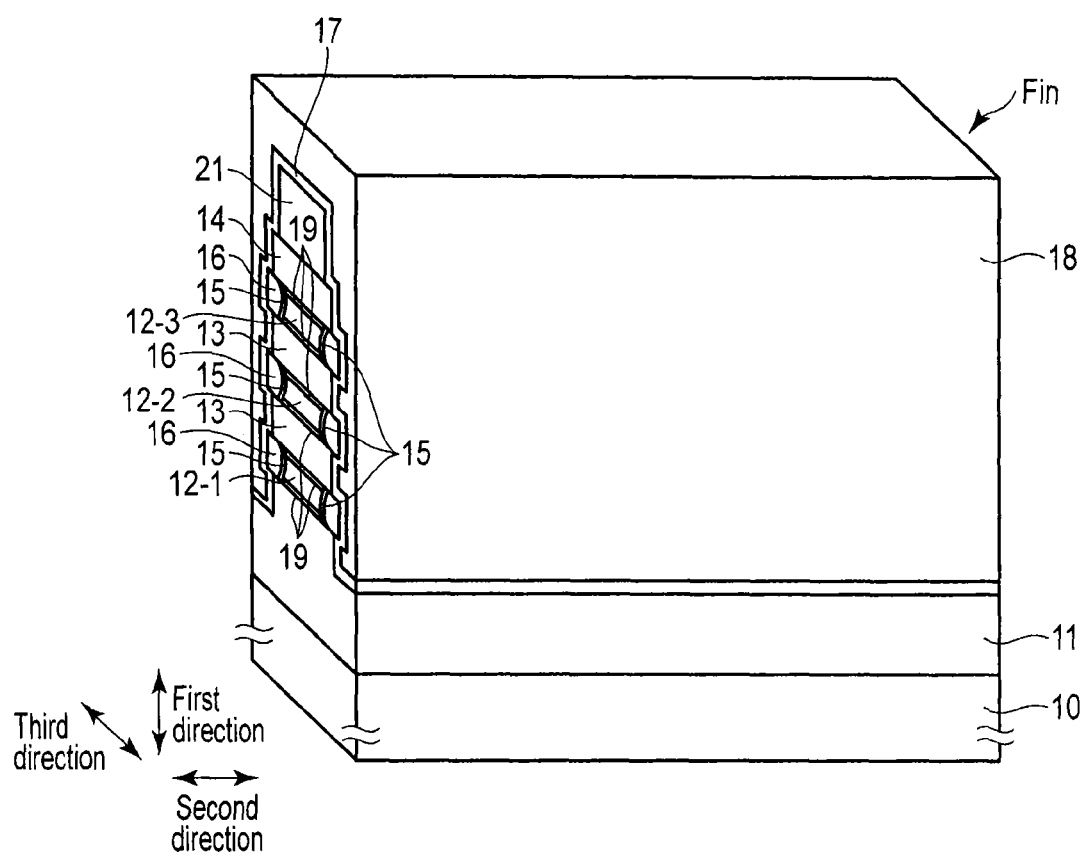

As shown in FIG. 22 and FIG. 23, control gate electrode (e.g. silicon layer) 18 covering fin structure Fin and completely filling the space between fin structures Fin is then formed.

Figure 25:
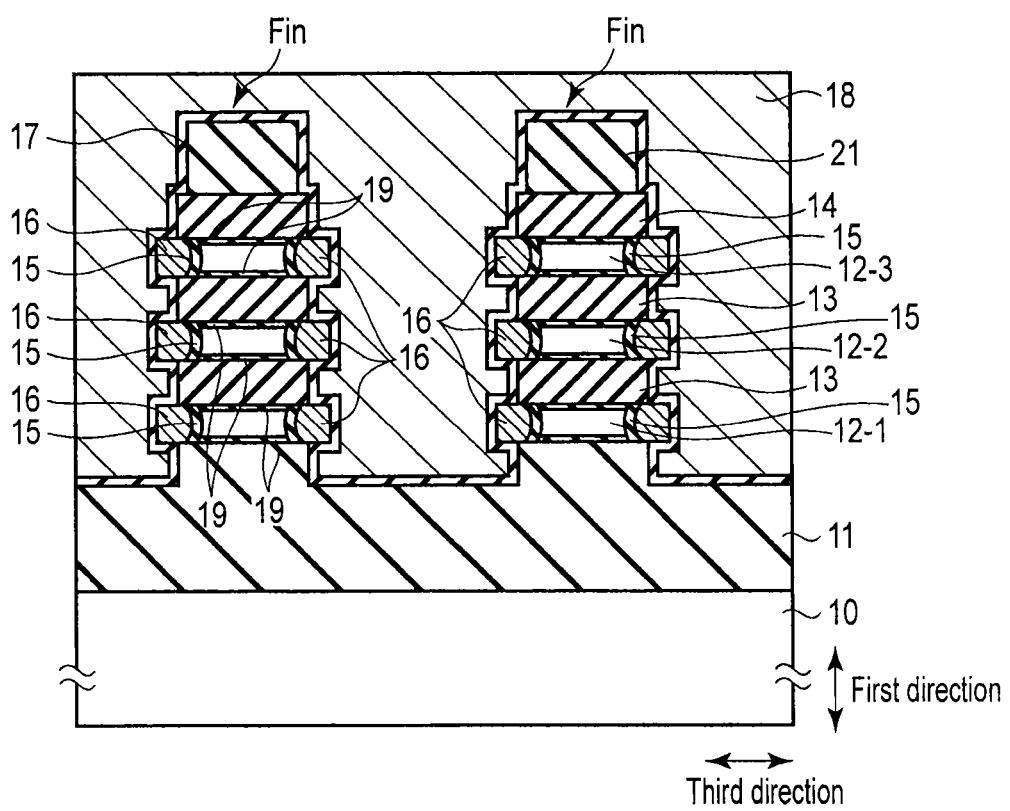

As shown in FIG. 24 and FIG. 25, a resist pattern is then formed on control gate electrode 18 by PEP, and this resist pattern is used as a mask to pattern control gate electrode 18 by RIE.

Here, the upper surface (surface in the first direction) of control gate electrode 18 may be planarized by chemical mechanical polishing (CMP) before the patterning. In this case, the CMP is preferably carried out after the formation of an insulating layer such as a silicon oxide layer on control gate electrode 18.

The resist pattern has a line-and-space pattern extending in the third direction on the upper surface of control gate electrode 18.

Control gate electrode 18 and block insulating layer 17 located in parts that are not covered by the resist pattern are completely removed. At the same time, floating gate electrode 16 located in parts that are not covered by the resist pattern is also removed.

Figure 26:
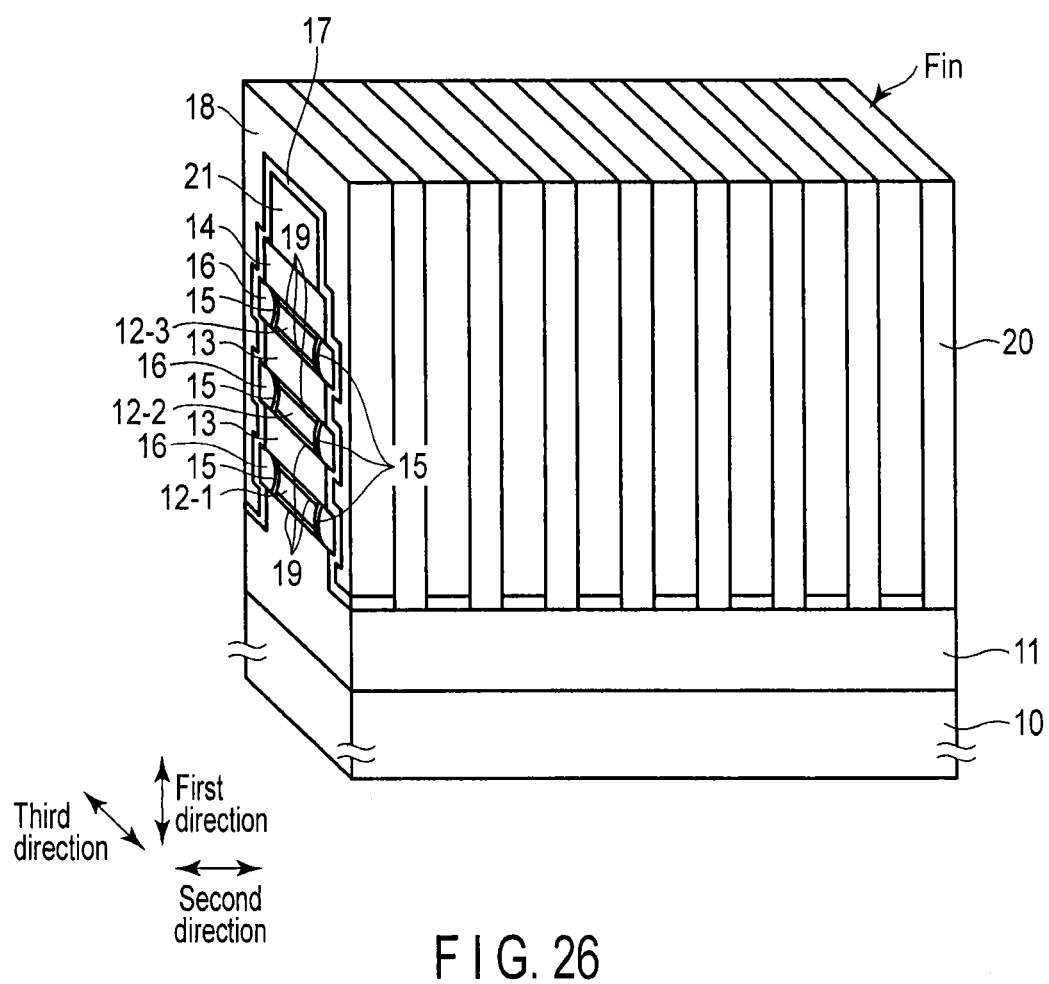
Figure 27:
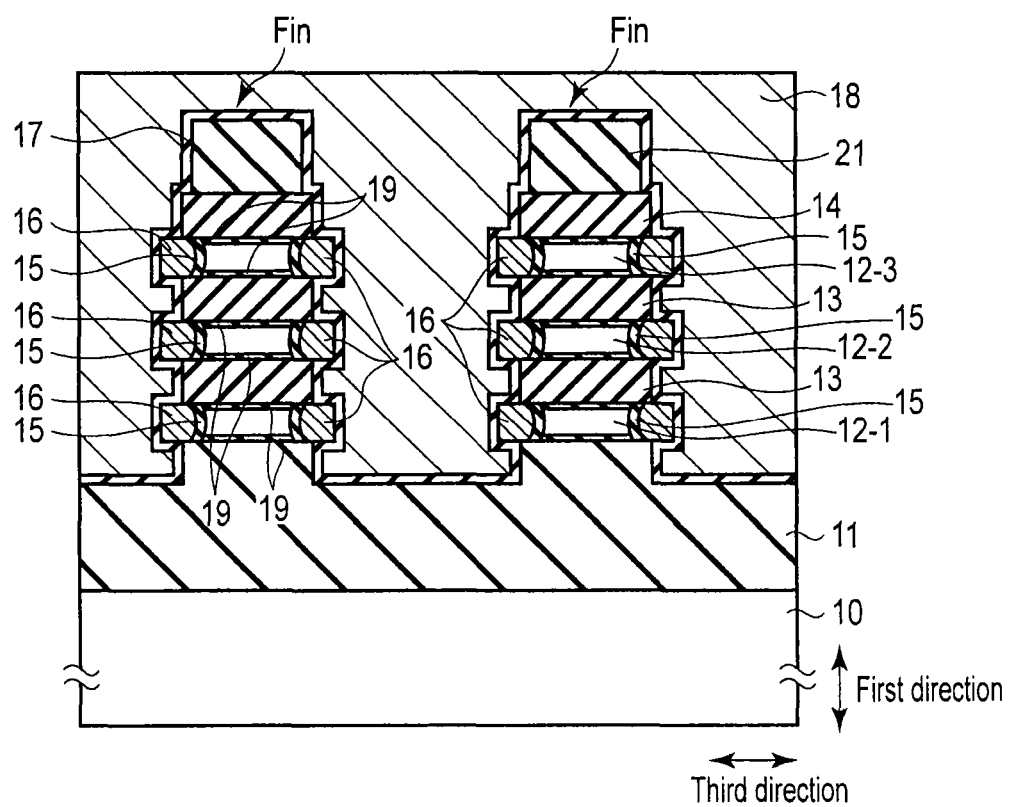
Figure 28:
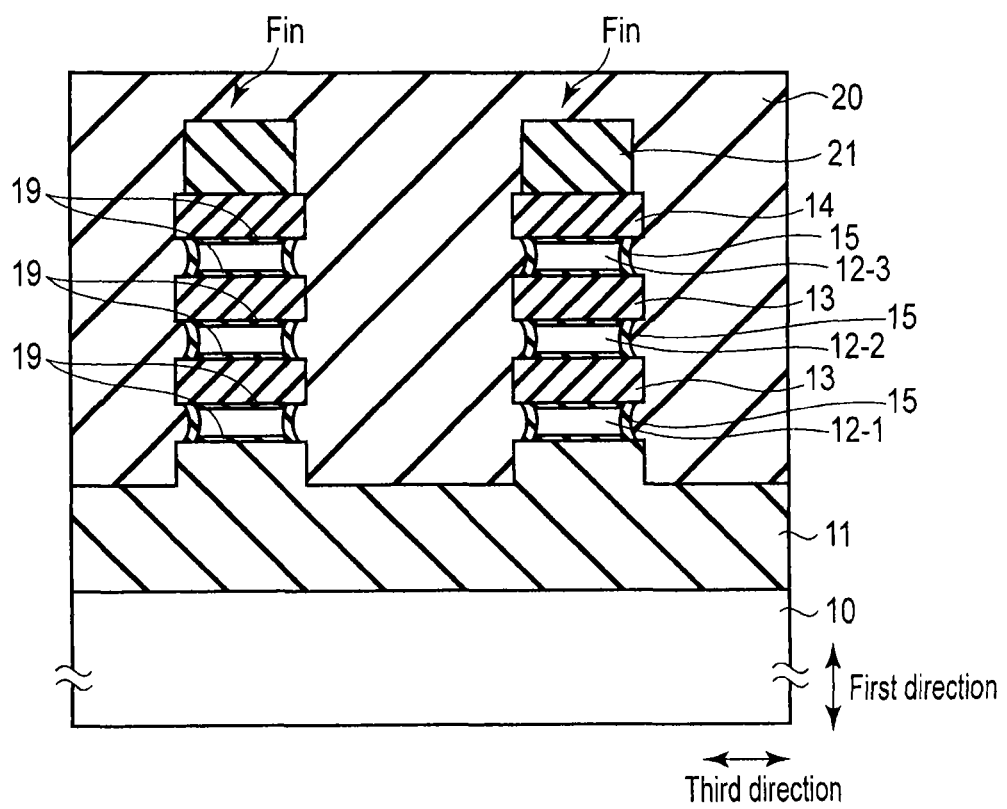

Finally, as shown in FIG. 26 to FIG. 28, the space between control gate electrodes 18 having the line-and-space patterns is filled with interlayer insulating layer (e.g. silicon oxide layer) 20, for example, by CVD.

The VG-FG type VLB in FIG. 3 to FIG. 5 is completed by the process described above.

Second Embodiment

Figure 31:
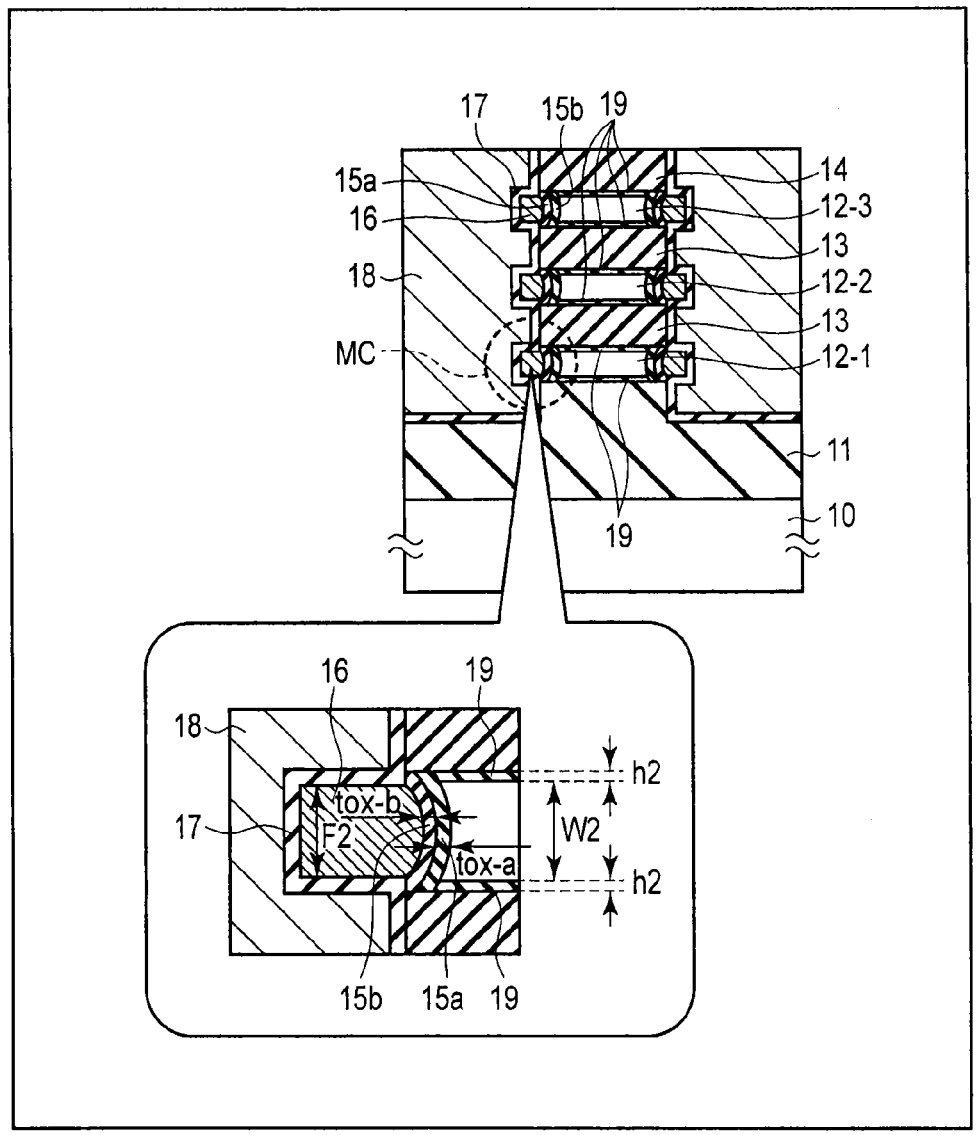
FIG. 31 is a sectional view taken along the line XXX-XXX in FIG. 29.

FIG. 29 shows the structure of a VG-FG type VLB. FIG. 30 is a sectional view of the structure of FIG. 29 cut along surface f1. FIG. 31 is a sectional view of the structure of FIG. 29 cut along surface f2.

As in the first embodiment, a memory cell array is described again in the present embodiment.

Semiconductor substrate 10 is, for example, a silicon substrate. Oxide layer 11 is, for example, a silicon oxide layer called BOX, and is used as an element isolation insulating layer.

First, second, and third semiconductor layers (active areas) 12-1, 12-2, and 12-3 are disposed on oxide layer 11. First, second, and third semiconductor layers 12-1, 12-2, and 12-3 are stacked in a first direction perpendicular to the surface of semiconductor substrate 10, extend in a second direction parallel to the surface of semiconductor substrate 10, and are insulated from one another.

Although the structure in which three semiconductor layers are stacked is shown in the present embodiment, the invention is not limited thereto. Two or more semiconductor layers have only to be stacked. A greater number of semiconductor layers stacked are preferable because a memory capacity as a semiconductor memory is increased accordingly.

First, second, and third semiconductor layers 12-1, 12-2, and 12-3 are insulated from one another by oxide layers (e.g. silicon oxide layers) 13.

Oxide layer (e.g. silicon oxide layer) 14 is disposed on uppermost third semiconductor layer 12-3.

First, second, and third semiconductor layers 12-1, 12-2, and 12-3 and oxide layers 13 and 14 constitute fin structure Fin. First, second, and third semiconductor layers 12-1, 12-2, and 12-3 are preferably monocrystalline, but may be polycrystalline or amorphous.

First, second, and third memory strings S1, S2, and S3 use first, second, and third semiconductor layers 12-1, 12-2, and 12-3 as channels, respectively. Each of first, second, and third memory strings S1, S2, and S3 comprises memory cells MC connected in series in the second direction.

Each of first, second, and third memory strings S1, S2, and S3 comprises floating gate electrodes 16 and control gate electrodes 18 corresponding to memory cells MC, on the surfaces of first, second, and third semiconductor layers 12-1, 12-2, and 12-3 in a third direction perpendicular to the first and second directions.

Gate oxide layers (tunnel oxide layers) 15a and 15b are disposed between first, second, and third semiconductor layers 12-1, 12-2, and 12-3 and floating gate electrodes 16. Block insulating layer 17 to prevent a leak current during writing/erasing is disposed between floating gate electrodes 16 and control gate electrodes 18.

Control gate electrodes 18 extend in the first direction along the surfaces of first, second, and third semiconductor layers 12-1, 12-2, and 12-3 in the third direction.

Although the present embodiment shows the structure in which three memory strings corresponding to three semiconductor layers are stacked, the invention is not limited thereto. Two or more memory strings corresponding to two or more semiconductor layers have only to be stacked.

The surfaces of first, second, and third semiconductor layers 12-1, 12-2, and 12-3 in the third direction have concave curves, and are located inside the surfaces of oxide layers 11, 13, and 14 in the third direction. The surfaces of floating gate electrodes 16 on the side of gate oxide layers 15a and 15b have convex curves.

Thus, gate oxide layers 15a and 15b between first, second, and third semiconductor layers 12-1, 12-2, and 12-3 and floating gate electrodes 16 have curved surfaces, and have tapered portions at the ends in the first direction.

New oxide layer (e.g. silicon oxide layer) 19 having thickness (width in the first direction) h2 is disposed on the surfaces of first, second, and third semiconductor layers 12-1, 12-2, and 12-3 in the first direction.

New oxide layer 19 decreases the curvature of the concave curves of first, second, and third semiconductor layers 12-1, 12-2, and 12-3 in the third direction. As a result, the curvature of the concave curves of first, second, and third semiconductor layers 12-1, 12-2, and 12-3 is smaller than the curvature of the convex curves of floating gate electrodes 16.

According to the present embodiment, new oxide layer 19 having thickness h2 is formed on the surfaces of first, second, and third semiconductor layers 12-1, 12-2, and 12-3 in the first direction.

The memory cell has two gate oxide layers 15a and 15b.

Gate oxide layer 15a is formed by oxidizing the surfaces of first, second, and third semiconductor layers 12-1, 12-2, and 12-3 in the first direction, whereas gate oxide layer 15b is formed by newly depositing an oxide layer.

Thus, although described in detail later, the width of floating gate electrode 16 in the first direction is reduced by two times thickness (thickness when gate oxide layer 15b is regarded as a film) tox–b of gate oxide layer 15b in the present embodiment as compared with the structure according to the first embodiment.

Therefore, the width of first, second, and third semiconductor layers 12-1, 12-2, and 12-3 in the first direction is $W2(=F2+(2\times tox-b)-(2\times h2))$ wherein F2 is the width of one floating gate electrode 16 in the first direction, and h2 is the thickness of new oxide layer 19. Width W2 corresponds to the channel width of each of memory cells (FETs) MC that constitute memory strings S1, S2, and S3.

When thickness h2 of new oxide layer 19 is greater than thickness tox–b of gate oxide layer 15b, width F2 of floating gate electrode 16 in the first direction is greater than width (channel width) W2 of first, second, and third semiconductor layers 12-1, 12-2, and 12-3 in the first direction. In this case, the coupling ratio of the memory cell and the controllability of the channel can be improved.

When thickness h2 of new oxide layer 19 is smaller than thickness tox–b of gate oxide layer 15b, width F2 of floating gate electrode 16 in the first direction is smaller than width (channel width) W2 of first, second, and third semiconductor layers 12-1, 12-2, and 12-3 in the first direction. In this case, inter-cell interference resulting from what is called Yupin effect can be prevented.

When thickness h2 of new oxide layer 19 is equal to thickness tox–b of gate oxide layer 15b, width F2 of floating gate electrode 16 in the first direction is equal to width (channel width) W2 of first, second, and third semiconductor layers 12-1, 12-2, and 12-3 in the first direction.

In order to prevent inter-cell interference resulting from what is called Yupin effect, the total thickness (width in the first direction) of oxide layers 13 and 19 between first, second, and third semiconductor layers 12-1, 12-2, and 12-3 is preferably 40 nm or more when width W2 is about 20 nm.

When the thickness (width in the third direction) of gate oxide layer 15a is tox–a, thickness h2 of new oxide layer 19 is generally equal to or less than tox–a. Therefore, the width of first, second, and third semiconductor layers 12-1, 12-2, and 12-3 in the first direction before the heat treatment to form new oxide layer 19 needs to be more than at least 2×tox–a to ensure width W2 after the heat treatment.

When h2=tox–a, width F2 of floating gate electrode 16 in the first direction is greater than width (channel width) W2 of first, second, and third semiconductor layers 12-1, 12-2, and 12-3 in the first direction if thickness tox–a (e.g. about 4 nm) of gate oxide layer 15a is greater than tox–b (e.g. about 3 nm) of gate oxide layer 15b.

Moreover, when h2=tox–a, width F2 of floating gate electrode 16 in the first direction is smaller than width (channel width) W2 of first, second, and third semiconductor layers 12-1, 12-2, and 12-3 in the first direction if thickness tox–a (e.g. about 3 nm) of gate oxide layer 15a is smaller than tox–b (e.g. about 4 nm) of gate oxide layer 15b.

According to the structure described above, the curvature of the concave curves of first, second, and third semiconductor layers 12-1, 12-2, and 12-3 in fin structure Fin in the third direction is lessened, and a local concentration of the electric field in gate oxide layer 15 of memory cell MC is prevented. This can improve the characteristics or reliability of memory cell MC.

Materials best suited to each semiconductor memory generation can be properly selected as the materials that constitute the VG-FG type VLB described above as in the first embodiment. Examples of the materials have already been described in detail in the first embodiment, and are therefore not described here.

It should however be noted that gate oxide layer 15a is an oxide layer formed by oxidizing a semiconductor layer in accordance with a method such as thermal oxidation or plasma oxidation. On the other hand, gate oxide layer 15b is an oxide layer formed by a deposition method such as CVD or PVD.

Both gate oxide layers 15a and 15b are, for example, silicon oxide layers. Gate oxide layer 15b is preferably an oxide layer, but may be an insulating layer (e.g. nitride layer) other than the oxide layer.

FIG. 32 to FIG. 55 show a method of manufacturing the VG-FG type VLB in FIG. 29 to FIG. 31.

In the following explanation, the same processes as those in the first embodiment are described in a simplified manner, and repeated explanations are minimized.

Figure 32:
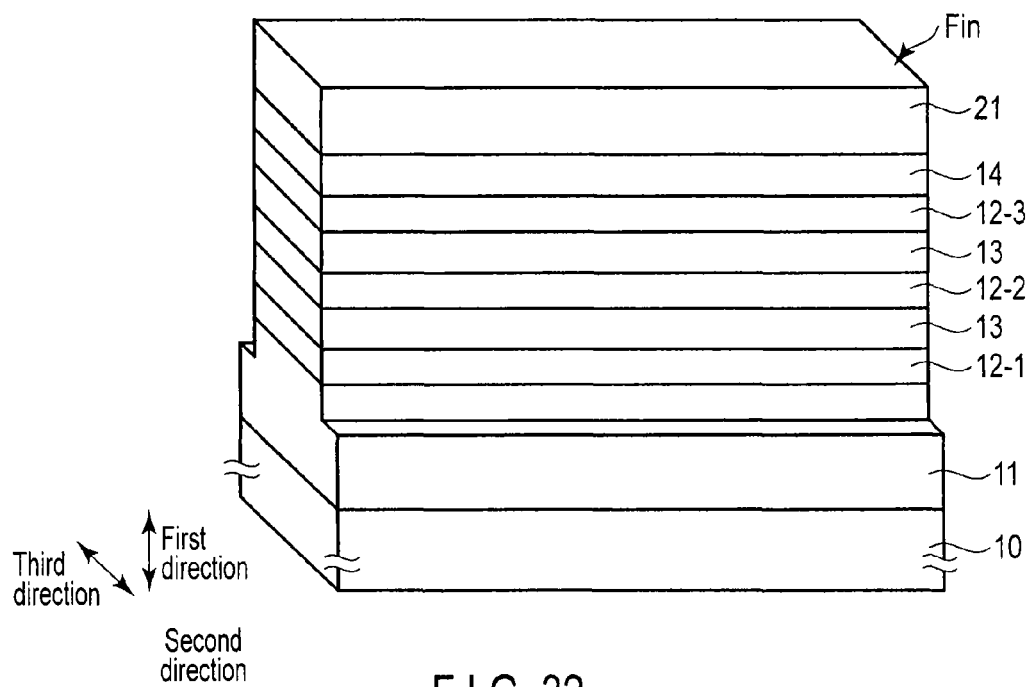
Figure 33:
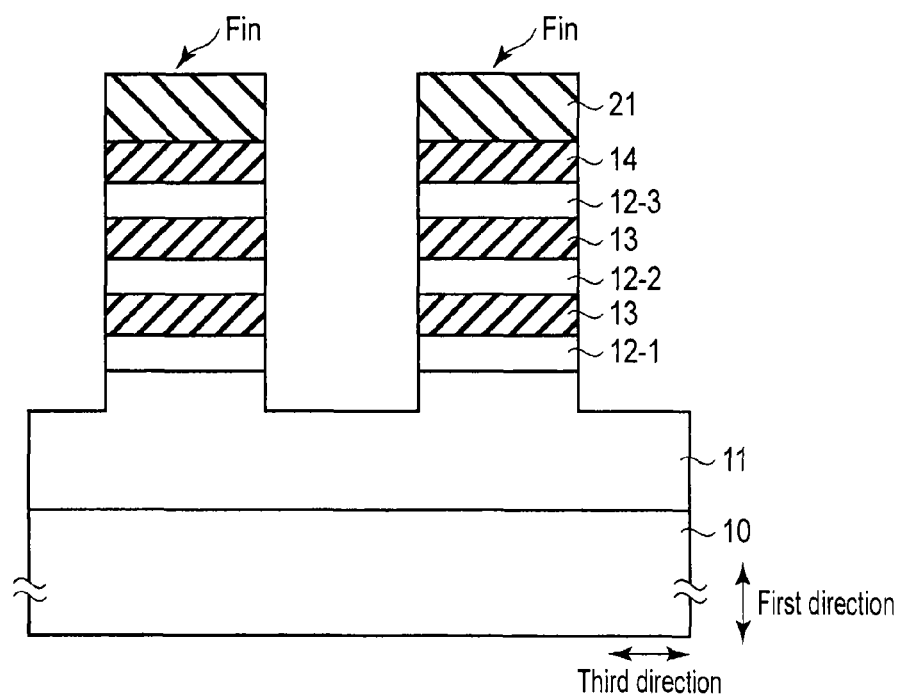

First, as shown in FIG. 32 and FIG. 33, a p-type or n-type silicon substrate, for example, having a plane direction (100) and a specific resistance of 10 to 200 cm is prepared as semiconductor substrate 10. On this semiconductor substrate 10, silicon oxide layers as oxide layers 11, 13, and 14, and polycrystalline silicon layers as first, second, and third semiconductor layers 12-1, 12-2, and 12-3 are alternately formed. Hard mask layer (e.g. silicon nitride layer) 21 is then formed on oxide layer 14.

A resist pattern is formed on hard mask layer 21 by photo engraving process (PEP). The resist pattern is used as a mask to sequentially etch hard mask layer 21, oxide layer 14, third semiconductor layer 12-3, oxide layer 13, second semiconductor layer 12-2, oxide layer 13, and first semiconductor layer 12-1 by RIE.

As a result, fin structure Fin is formed. The resist pattern is then removed.

As shown in FIG. 34 and FIG. 35, the surfaces, in the third direction, of first, second, and third semiconductor layers 12-1, 12-2, and 12-3 that constitute fin structure Fin are then recess-etched, for example, by wet etching that uses chlorine, CDE, or dry etching that uses a chlorine gas. As a result, a recess is formed in the surface of fin structure Fin in the third direction.

The surfaces of first, second, and third semiconductor layers 12-1, 12-2, and 12-3 in the third direction are formed into concave curves by the etching.

Figure 36:
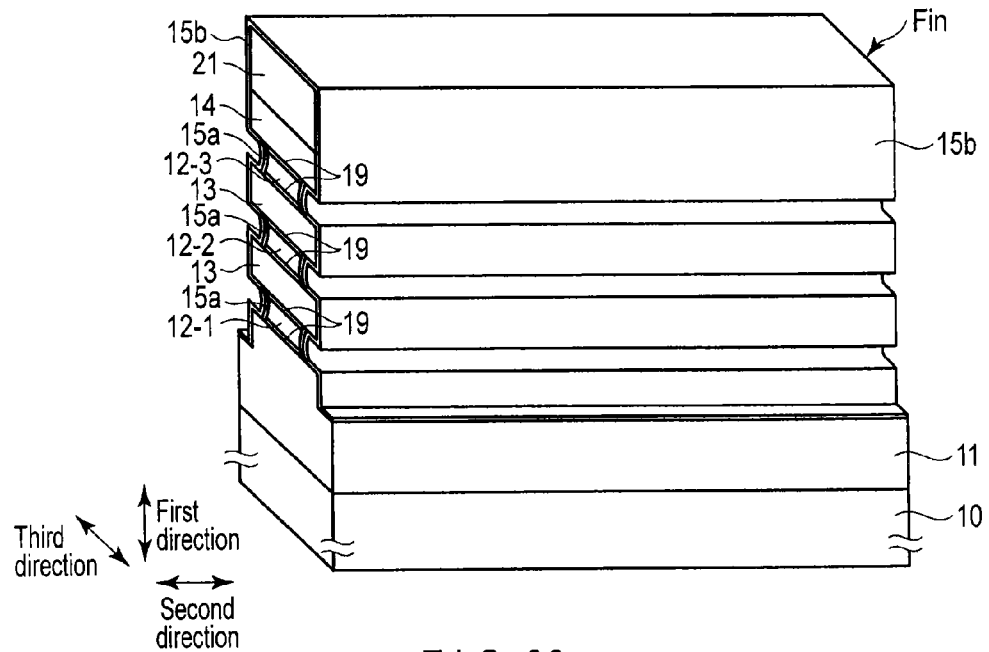
Figure 37:
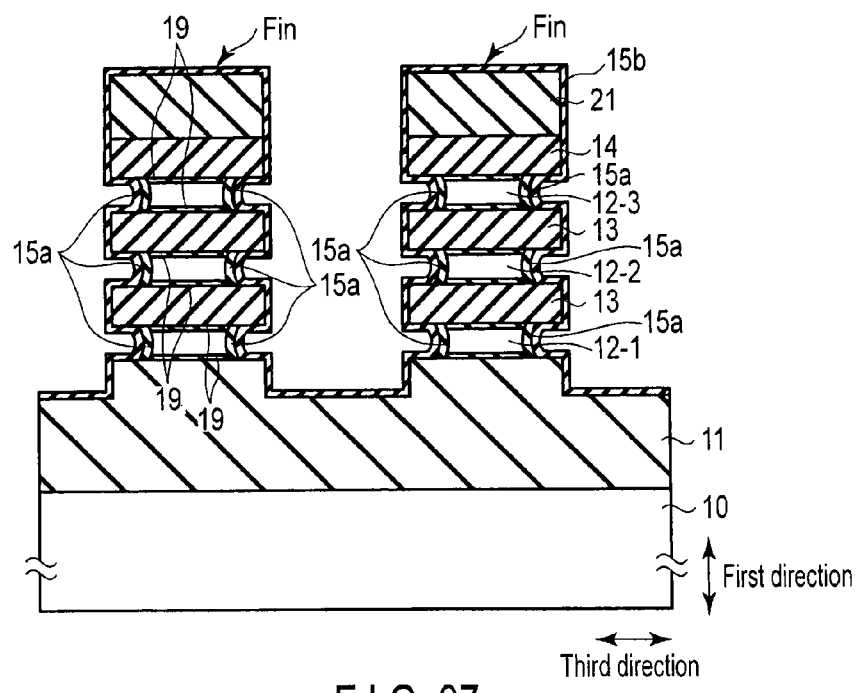

As shown in FIG. 36 and FIG. 37, gate oxide layers 15a and 15b are formed. The order of the formation of gate oxide layers 15a and 15b is not particularly limited. For example, gate oxide layer 15b may be formed after the formation of gate oxide layer 15a, or gate oxide layer 15a may be formed after the formation of gate oxide layer 15b.

Gate oxide layer 15a can be formed in a recess of fin structure Fin in the third direction, that is, in the surfaces of first, second, and third semiconductor layers 12-1, 12-2, and 12-3 in the third direction, for example, by the SPA plasma generation technique. Gate oxide layer 15b can be formed by a deposition method such as CVD or PVD.

As the surfaces of foundation first, second, and third semiconductor layers 12-1, 12-2, and 12-3 in the third direction have the concave curves, gate oxide layers 15a and 15b are shaped into a curved surface as a result.

However, according to the present embodiment, oxygen is diffused from oxide layers 11, 13, and 14 to first, second, and third semiconductor layers 12-1, 12-2, and 12-3, for example, simultaneously with the formation of gate oxide layer 15a to form new oxide layer 19 on the surfaces of first, second, and third semiconductor layers 12-1, 12-2, and 12-3 in the first direction.

Therefore, the curvature of the concave curves of first, second, and third semiconductor layers 12-1, 12-2, and 12-3 is lessened by new oxide layer 19.

As shown in FIG. 38 and FIG. 39, floating gate electrode 16 covering the entire surface of fin structure Fin is then formed, for example, by CVD.

Figure 40:
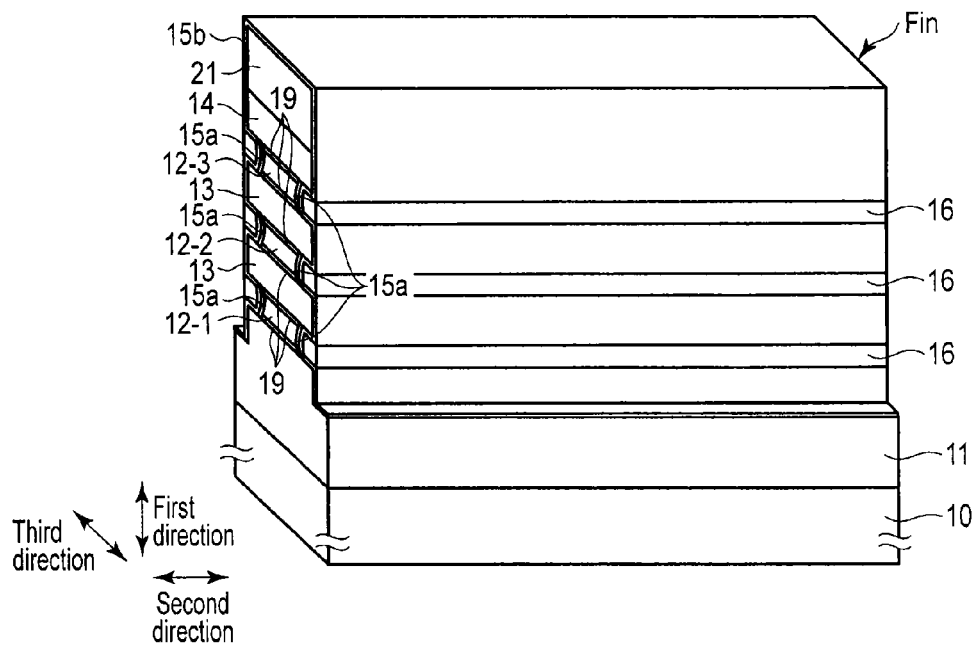
Figure 41:
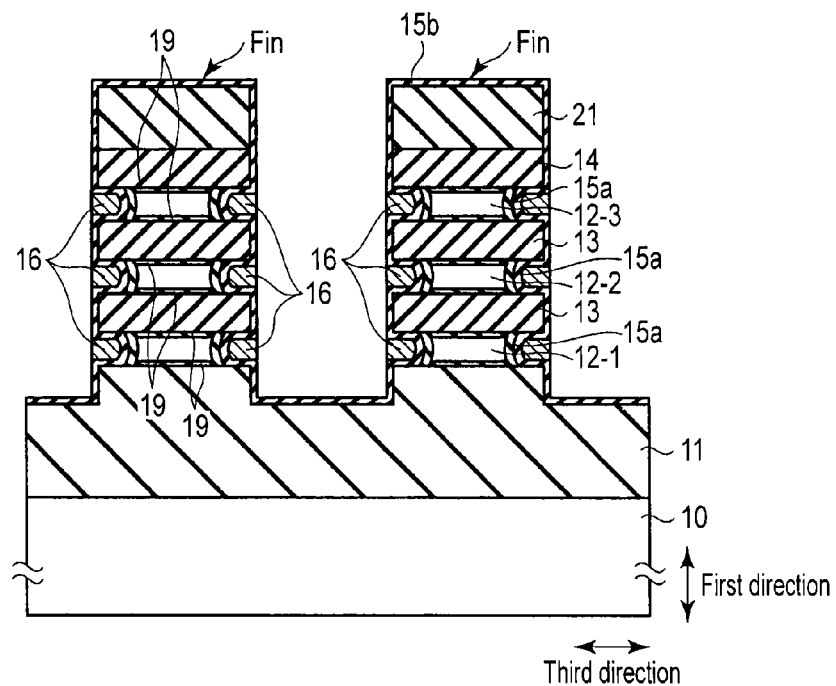
Figure 44:
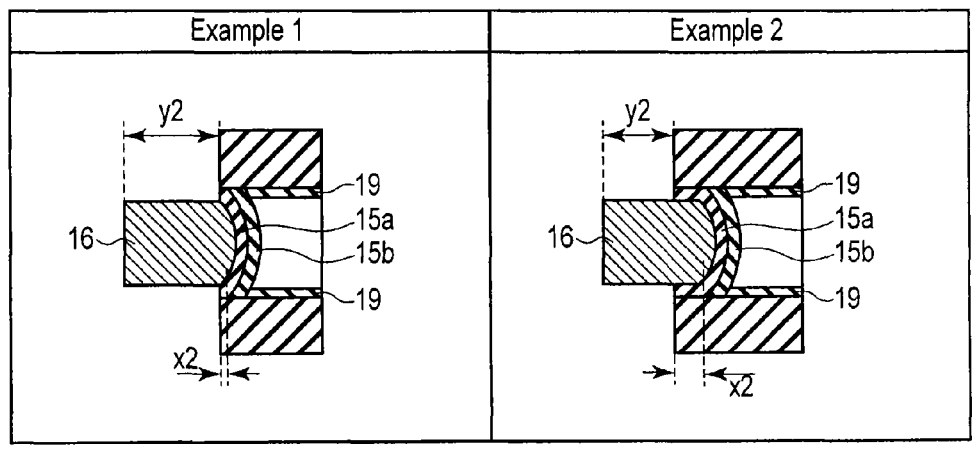

As shown in FIG. 40 and FIG. 41, extra parts of floating gate electrode 16 other than the part located in the recess of fin structure Fin in the third direction are then removed, for example, by RIE. As a result, floating gate electrode 16 only remains on gate oxide layer 15 which is on the surfaces of first, second, and third semiconductor layers 12-1, 12-2, and 12-3 in the third direction.

As shown in FIG. 42 and FIG. 43, the surfaces of oxide layers 11, 13, and 14 in the third direction are then recess-etched, for example, by wet etching or by isotropic dry etching that uses HF/NH$_3$ gas.

Etching amount y2 of oxide layers 11, 13, and 14 is set so that the surfaces of oxide layers 11, 13, and 14 in the third direction after the etching are located outside the part (the tapered portion of gate oxide layer 5a), which is located on the outermost side of fin structure Fin, of an interface between gate oxide layer 15a and gate oxide layer 15b.

This is intended to prevent a control gate electrode that will be formed later from being excessively close to the edges of first, second, and third semiconductor layers 12-1, 12-2, and 12-3. As the area in which the later-formed control gate electrode and the floating gate electrode face each other is increased by the recess-etching of oxide layers 11, 13, and 14, the coupling ratio of the memory cell can be improved.

According to the present embodiment, the width of a portion between the surfaces of oxide layers 11, 13, and 14 in the third direction after the etching and the part, which is located on the outermost side of fin structure Fin, of the interface between gate oxide layer 15a and gate oxide layer 15b is set to x2.

Figure 45:
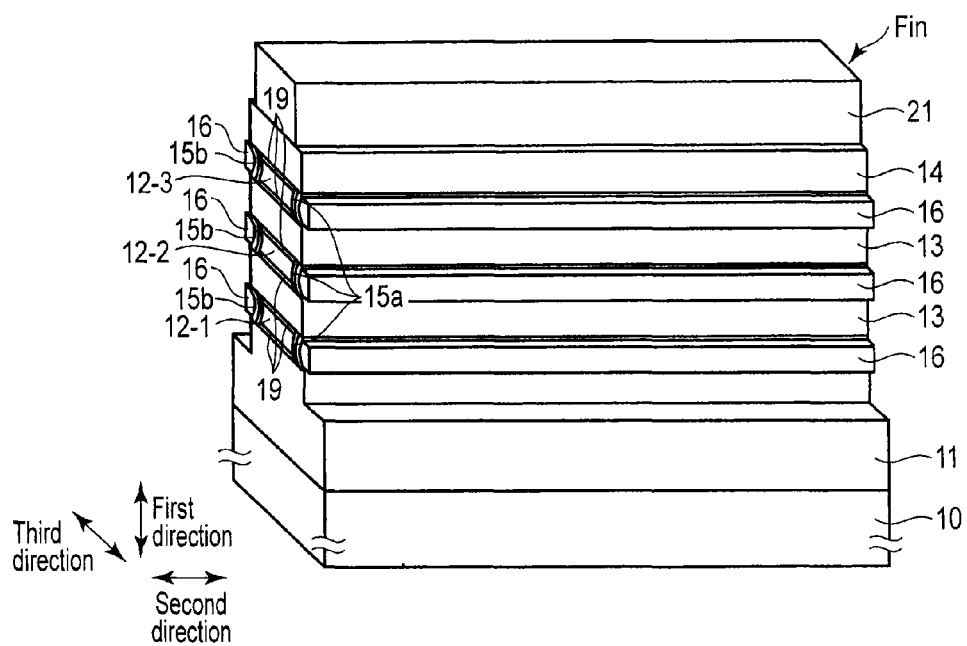

As shown in FIG. 45 and FIG. 46, hard mask layer 21 is etched, for example, by isotropic etching, and the width of hard mask layer 21 in the third direction is shrunk.

Shrinkage amount d of hard mask layer 21 resulting from this process is an amount (ideal value) that is enough for floating gate electrode 16 in one memory string to be divided for each memory cell during the patterning of the control gate electrode.

As shown in FIG. 47 and FIG. 48, block insulating layer (e.g. $SiO_2/Si_3N_4/SiO_2$) 17 covering the entire surface of fin structure Fin is then formed, for example, by CVD.

Figure 49:
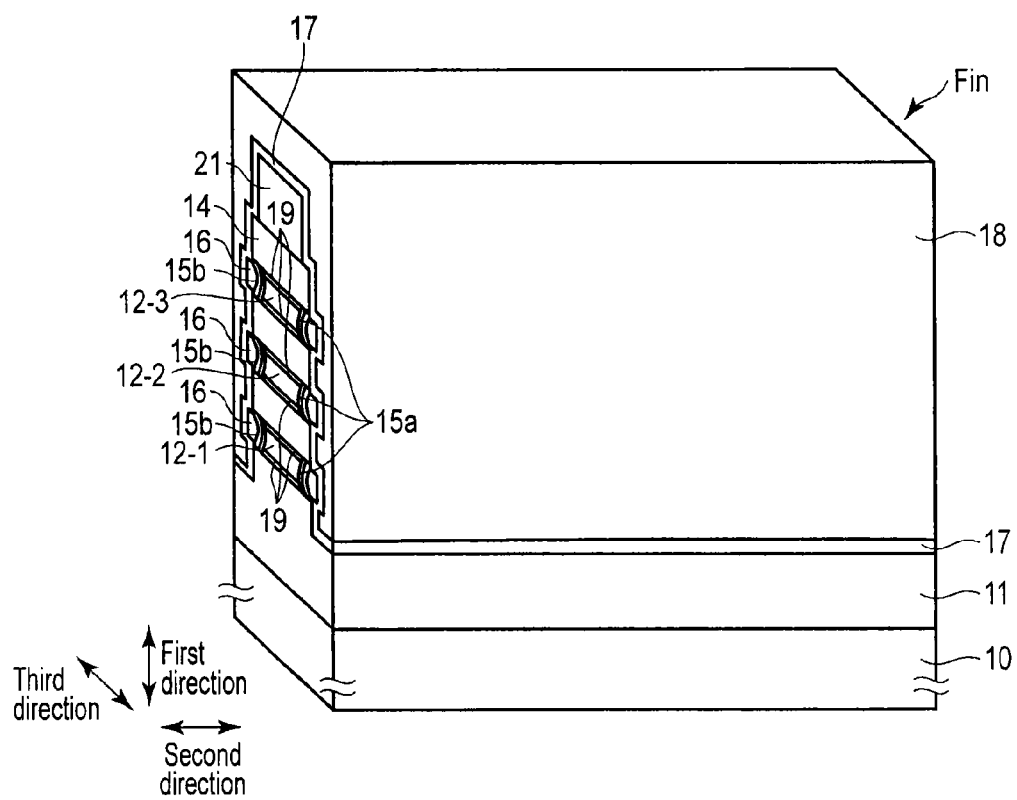
Figure 50:
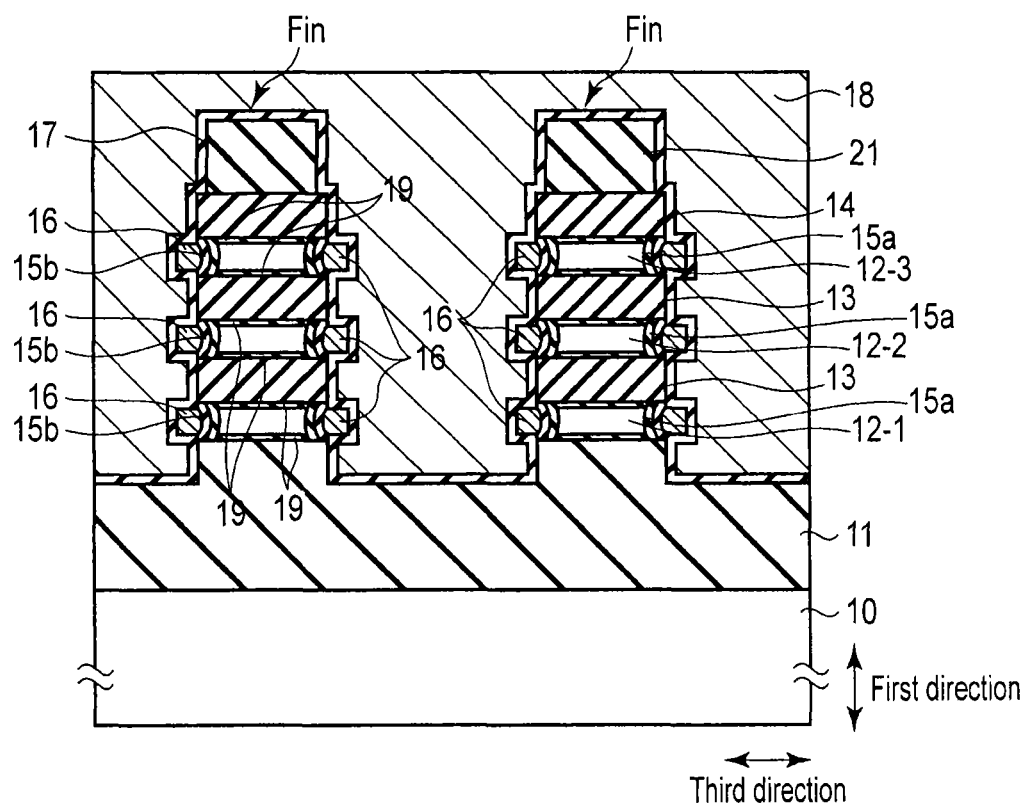

As shown in FIG. 49 and FIG. 50, control gate electrode (e.g. polysilicon layer) 18 covering fin structure Fin and completely filling the space between fin structures Fin is then formed.

Figure 51:
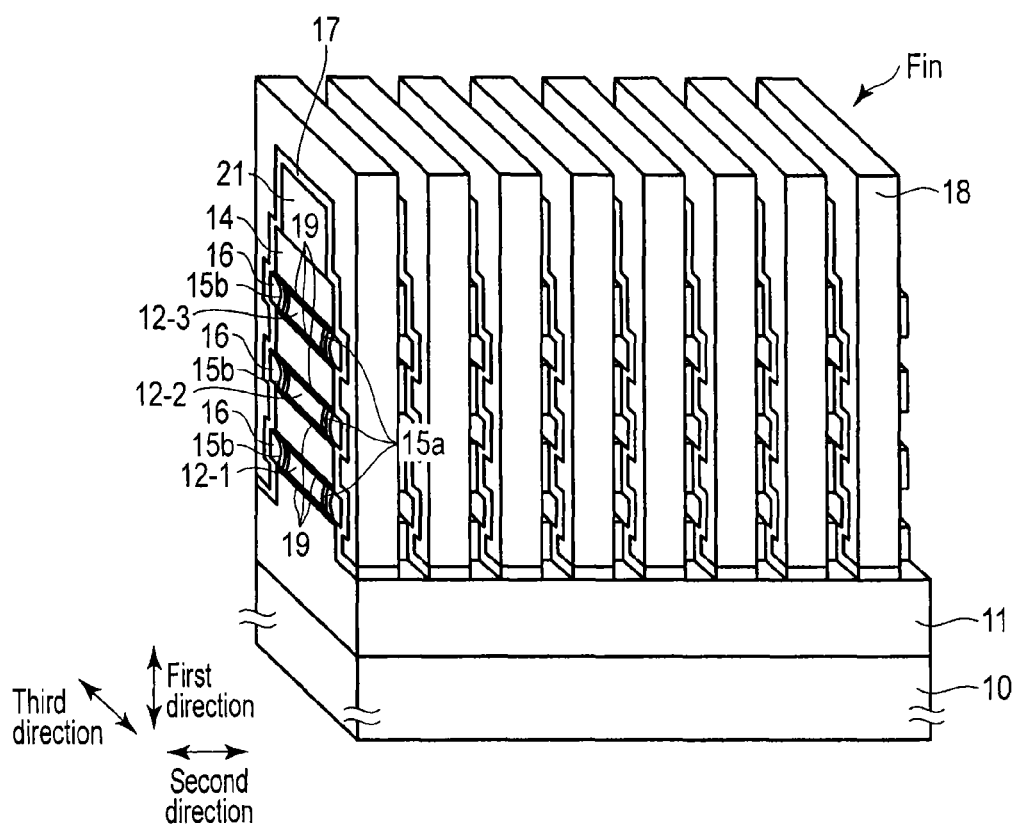

As shown in FIG. 51 and FIG. 52, a resist pattern is then formed on control gate electrode 18 by PEP, and this resist pattern is used as a mask to pattern control gate electrode 18 by RIE.

Control gate electrode 18 and block insulating layer 17 located in parts that are not covered by the resist pattern are completely removed. At the same time, floating gate electrode 16 located in parts that are not covered by the resist pattern is also removed.

Figure 53:
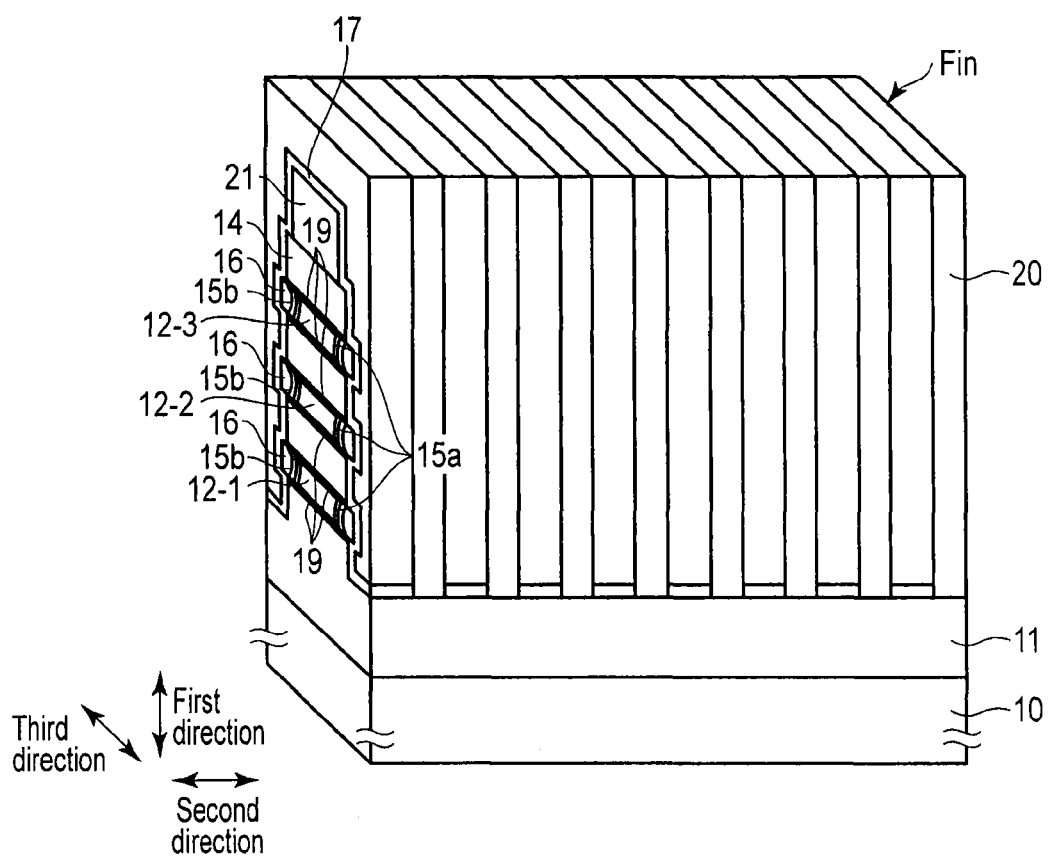
Figure 54:
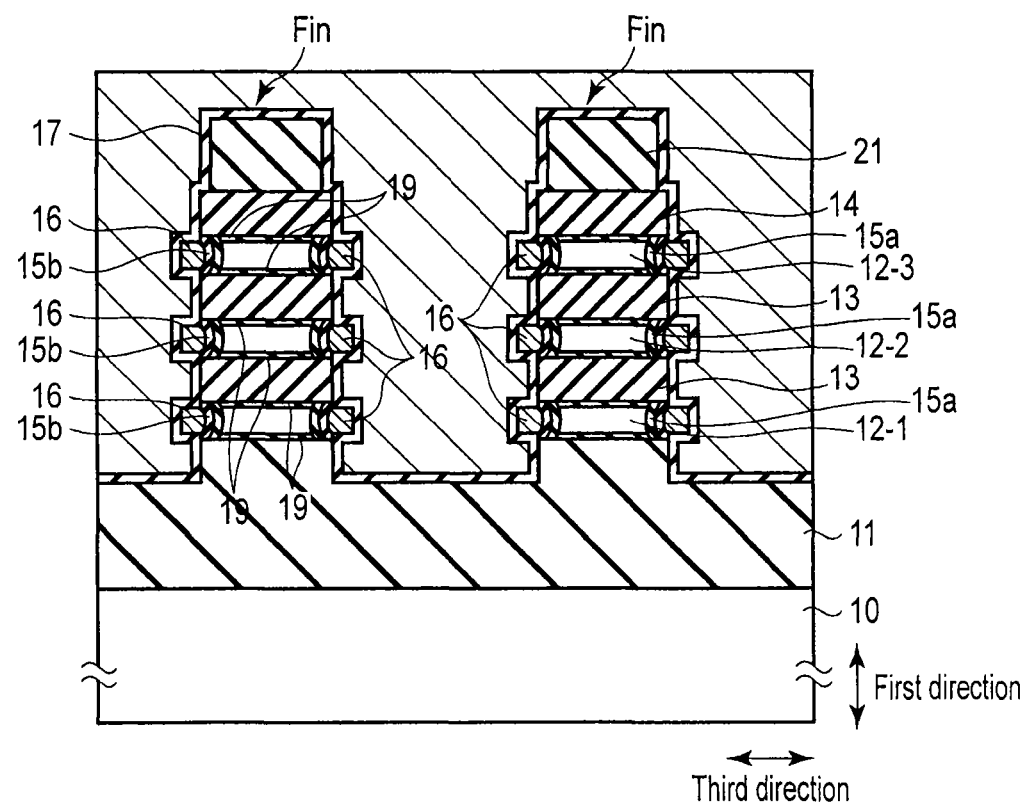

Finally, as shown in FIG. 53 to FIG. 55, the space between control gate electrodes 18 having the line-and-space patterns is filled with interlayer insulating layer (e.g. silicon oxide layer) 20, for example, by CVD.

The VG-FG type VLB in FIG. 29 to FIG. 31 is completed by the process described above.

Third Embodiment

Figure 56:
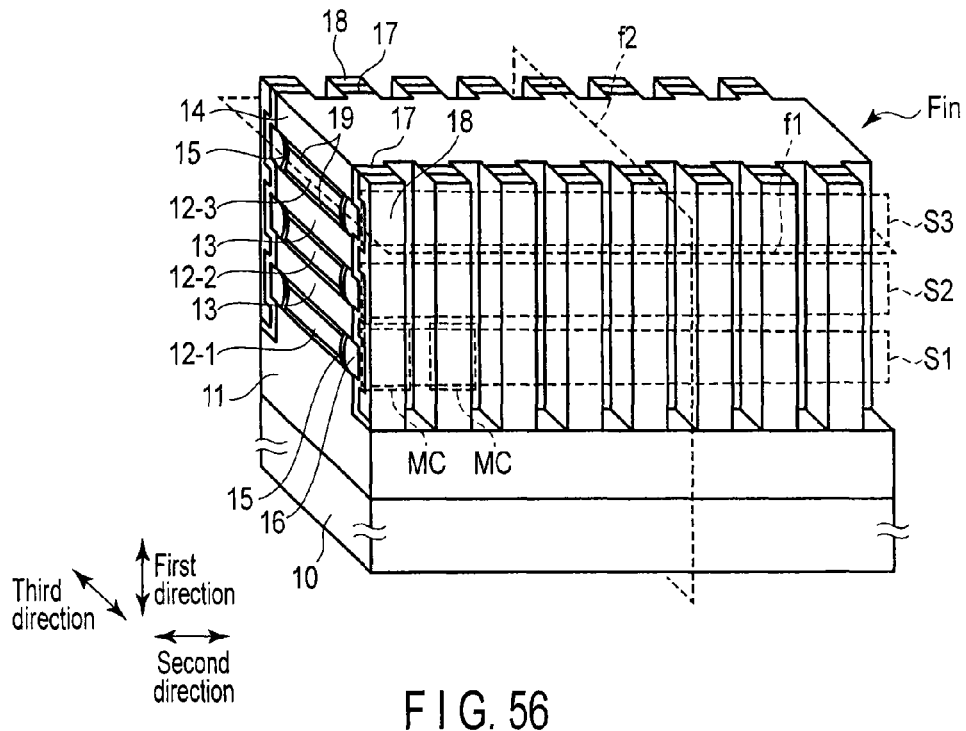
FIG. 56 is a perspective view showing a third embodiment.
Figure 57:
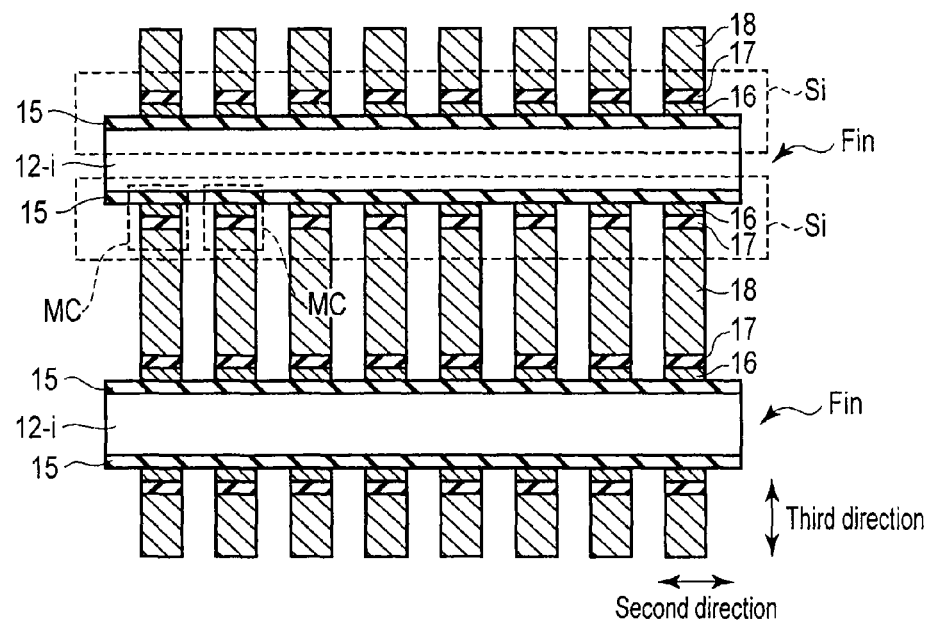
FIG. 57 is a sectional view of FIG. 56.

FIG. 56 shows the structure of a VG-FG type VLB. FIG. 57 is a sectional view of the structure of FIG. 56 cut along surface f1. FIG. 58 is a sectional view of the structure of FIG. 56 cut along surface f2.

As in the first embodiment, a memory cell array is described again in the present embodiment.

Semiconductor substrate 10 is, for example, a silicon substrate. Oxide layer 11 is, for example, a silicon oxide layer called BOX, and is used as an element isolation insulating layer.

First, second, and third semiconductor layers (active areas) 12-1, 12-2, and 12-3 are disposed on oxide layer 11. First, second, and third semiconductor layers 12-1, 12-2, and 12-3 are stacked in a first direction perpendicular to the surface of semiconductor substrate 10, extend in a second direction parallel to the surface of semiconductor substrate 10, and are insulated from one another.

Although the structure in which three semiconductor layers are stacked is shown in the present embodiment, the invention is not limited thereto. Two or more semiconductor layers have only to be stacked. A greater number of semiconductor layers stacked are preferable because a memory capacity as a semiconductor memory is increased accordingly.

First, second, and third semiconductor layers 12-1, 12-2, and 12-3 are insulated from one another by oxide layers (e.g. silicon oxide layers) 13.

Oxide layer (e.g. silicon oxide layer) 14 is disposed on uppermost third semiconductor layer 12-3.

First, second, and third semiconductor layers 12-1, 12-2, and 12-3 and oxide layers 13 and 14 constitute fin structure Fin. First, second, and third semiconductor layers 12-1, 12-2, and 12-3 are preferably monocrystalline, but may be polycrystalline or amorphous.

First, second, and third memory strings S1, S2, and S3 use first, second, and third semiconductor layers 12-1, 12-2, and 12-3 as channels, respectively. Each of first, second, and third memory strings S1, S2, and S3 comprises memory cells MC connected in series in the second direction.

Each of first, second, and third memory strings S1, S2, and S3 comprises floating gate electrodes 16 and control gate electrodes 18 corresponding to memory cells MC, on the surfaces of first, second, and third semiconductor layers 12-1, 12-2, and 12-3 in a third direction perpendicular to the first and second directions.

Gate oxide layer (tunnel oxide layer) 15 is disposed between first, second, and third semiconductor layers 12-1, 12-2, and 12-3 and floating gate electrodes 16. Block insulating layer 17 to prevent a leak current during writing/erasing is disposed between floating gate electrodes 16 and control gate electrodes 18.

Control gate electrodes 18 extend in the first direction along the surfaces of first, second, and third semiconductor layers 12-1, 12-2, and 12-3 in the third direction.

Although the present embodiment shows the structure in which three memory strings corresponding to three semiconductor layers are stacked, the invention is not limited thereto. Two or more memory strings corresponding to two or more semiconductor layers have only to be stacked.

The surfaces of first, second, and third semiconductor layers 12-1, 12-2, and 12-3 in the third direction have concave curves, and are located inside the surfaces of oxide layers 11, 13, and 14 in the third direction. The surfaces of floating gate electrodes 16 on the side of gate oxide layer 15 have convex curves.

Gate oxide layer 15 between first, second, and third semiconductor layers 12-1, 12-2, and 12-3 and floating gate electrodes 16 have curved surfaces, and have tapered portions at the ends in the first direction.

New oxide layer (e.g. silicon oxide layer) 19 having thickness (width in the first direction) h3 is disposed on the surfaces of first, second, and third semiconductor layers 12-1, 12-2, and 12-3 in the first direction.

New oxide layer 19 decreases the curvature of the concave curves of first, second, and third semiconductor layers 12-1, 12-2, and 12-3 in the third direction. As a result, the curvature of the concave curves of first, second, and third semiconductor layers 12-1, 12-2, and 12-3 is smaller than the curvature of the convex curves of floating gate electrodes 16.

According to the present embodiment, new oxide layer 19 having thickness h3 is formed on the surfaces of first, second, and third semiconductor layers 12-1, 12-2, and 12-3 in the first direction.

Width F3 of one floating gate electrode 16 in the first direction is greater than a value (W3+2×h3) obtained by adding double thickness h3 of new oxide layer 19 to width W3 of first, second, and third semiconductor layers 12-1, 12-2, and 12-3 in the first direction.

For example, F3−2×s3=W3+2×h3.

However, in a manufacturing method described later, s3 corresponds to an amount of the extension of the width, in the first direction, of the recess which is located between oxide layers 11, 13, and 14 and which is formed by the recession of first, second, and third semiconductor layers 12-1, 12-2, and 12-3 after this recession.

Thus, according to the present embodiment, width F3 of floating gate electrode 16 in the first direction is greater than width (channel width) W3 of first, second, and third semiconductor layers 12-1, 12-2, and 12-3 in the first direction. In this case, the coupling ratio of the memory cell and the controllability of the channel can be improved.

In order to prevent inter-cell interference resulting from what is called Yupin effect, the total thickness (width in the first direction) of oxide layers 13 and 19 between first, second, and third semiconductor layers 12-1, 12-2, and 12-3 is preferably 40 nm or more when width W3 is about 20 nm.

When the thickness (width in the third direction) of gate oxide layer 15 is tox, thickness h3 of new oxide layer 19 is generally equal to or less than tox. Therefore, the width of first, second, and third semiconductor layers 12-1, 12-2, and 12-3 in the first direction before the heat treatment to form new oxide layer 19 needs to be more than at least 2×tox to ensure width W3 after the heat treatment.

According to the structure described above, the curvature of the concave curves of first, second, and third semiconductor layers 12-1, 12-2, and 12-3 in fin structure Fin in the third direction is lessened, and a local concentration of the electric field in gate oxide layer 15 of memory cell MC is prevented. This can improve the characteristics or reliability of memory cell MC.

According to the present embodiment, width (channel width) of W3 first, second, and third semiconductor layers 12-1, 12-2, and 12-3 in the first direction is smaller than width F3 of floating gate electrode 16 in the first direction, so that the coupling ratio of the memory cell and the controllability of the channel can be improved.

Materials best suited to each semiconductor memory generation can be properly selected as the materials that constitute the VG-FG type VLB described above as in the first embodiment. Examples of the materials have already been described in detail in the first embodiment, and are therefore not described here.

FIG. 59 to FIG. 83 show a method of manufacturing the VG-FG type VLB in FIG. 56 to FIG. 58.

In the following explanation, the same processes as those in the first embodiment are described in a simplified manner, and repeated explanations are minimized.

First, as shown in FIG. 59 and FIG. 60, a p-type or n-type silicon substrate, for example, having a plane direction (100) and a specific resistance of 10 to 20 Ωcm is prepared as semiconductor substrate 10. On this semiconductor substrate 10, silicon oxide layers as oxide layers 11, 13, and 14, and polycrystalline silicon layers as first, second, and third semiconductor layers 12-1, 12-2, and 12-3 are alternately formed. Hard mask layer (e.g. silicon nitride layer) 21 is then formed on oxide layer 14.

A resist pattern is formed on hard mask layer 21 by PEP. The resist pattern is used as a mask to sequentially etch hard mask layer 21, oxide layer 14, third semiconductor layer 12-3, oxide layer 13, second semiconductor layer 12-2, oxide layer 13, and first semiconductor layer 12-1 by RIE.

As a result, fin structure Fin is formed. The resist pattern is then removed.

As shown in FIG. 61 and FIG. 62, the surfaces, in the third direction, of first, second, and third semiconductor layers 12-1, 12-2, and 12-3 that constitute fin structure Fin are then recess-etched, for example, by wet etching that uses chlorine, CDE, or dry etching that uses a chlorine gas. As a result, a recess is formed in the surface of fin structure Fin in the third direction.

The surfaces of first, second, and third semiconductor layers 12-1, 12-2, and 12-3 in the third direction are formed into concave curves by the etching.

As shown in FIG. 63 and FIG. 64, the surfaces of oxide layers 11, 13, and 14 in the first direction that are exposed in the recess of fin structure Fin are then recess-etched, for example, by wet etching or by isotropic dry etching that uses HF/NH$_3$ gas. As a result, the width of the recess of fin structure Fin in the first direction is increased.

As shown in FIG. 65 and FIG. 66, gate oxide layer (e.g. silicon oxide layer) 15 as a tunnel oxide layer is then formed by the SPA plasma generation technique in the recess of fin structure Fin in the third direction, that is, on the surfaces of first, second, and third semiconductor layers 12-1, 12-2, and 12-3 in the third direction.

As the surfaces of foundation first, second, and third semiconductor layers 12-1, 12-2, and 12-3 in the third direction have the concave curves, gate oxide layer 15 is shaped into a curved surface as a result.

However, according to the present embodiment, oxygen is diffused from oxide layers 11, 13, and 14 to first, second, and third semiconductor layers 12-1, 12-2, and 12-3, for example, simultaneously with the formation of gate oxide layer 15 to form new oxide layer 19 on the surfaces of first, second, and third semiconductor layers 12-1, 12-2, and 12-3 in the first direction.

Therefore, the curvature of the concave curves of first, second, and third semiconductor layers 12-1, 12-2, and 12-3 is lessened by new oxide layer 19.

Moreover, the width of the recess of fin structure Fin in the first direction is increased in advance by the recess-etching of oxide layers 11, 13, and 14. Thus, when gate oxide layer 15 is formed, the tapered portions at the edges of first, second, and third semiconductor layers 12-1, 12-2, and 12-3 in the first direction are more easily oxidized.

Thus, as the width of the recess of fin structure Fin is increased, the curvature of the concave curves of first, second, and third semiconductor layers 12-1, 12-2, and 12-3 is further lessened.

Figure 67:
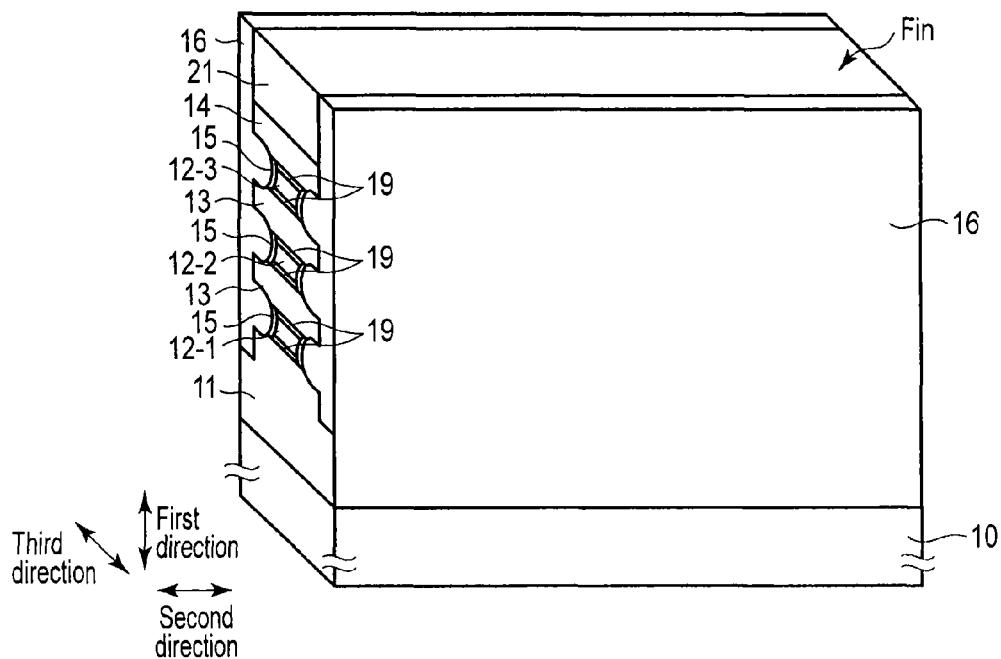
Figure 68:
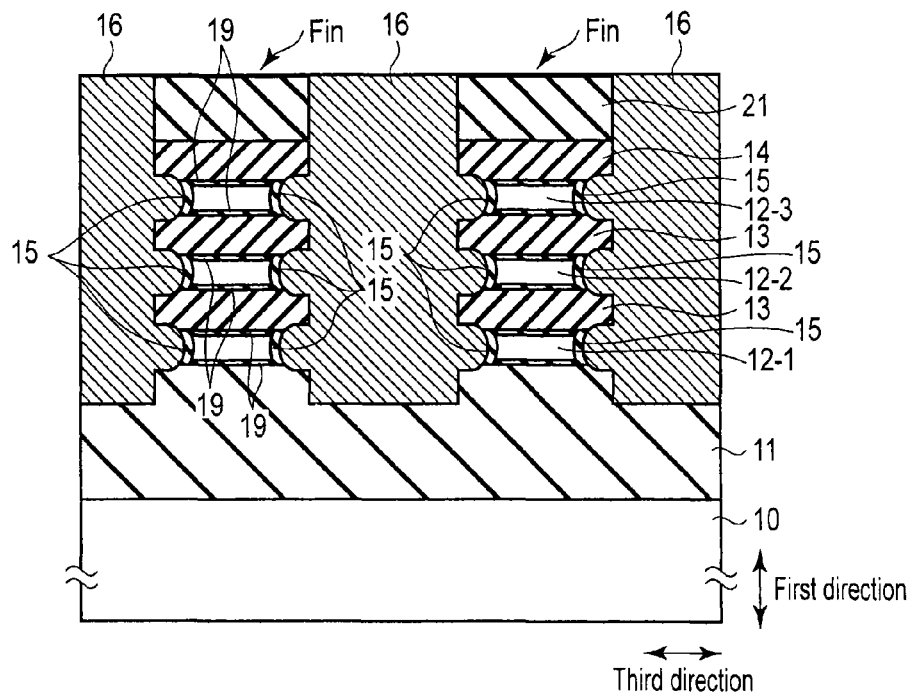

As shown in FIG. 67 and FIG. 68, floating gate electrode 16 covering the entire surface of fin structure Fin is then formed, for example, by CVD.

As shown in FIG. 69 and FIG. 70, extra parts of floating gate electrode 16 other than the part located in the recess of fin structure Fin in the third direction are then removed, for example, by RIE. As a result, floating gate electrode 16 only remains on gate oxide layer 15 which is on the surfaces of first, second, and third semiconductor layers 12-1, 12-2, and 12-3 in the third direction.

Figure 71:
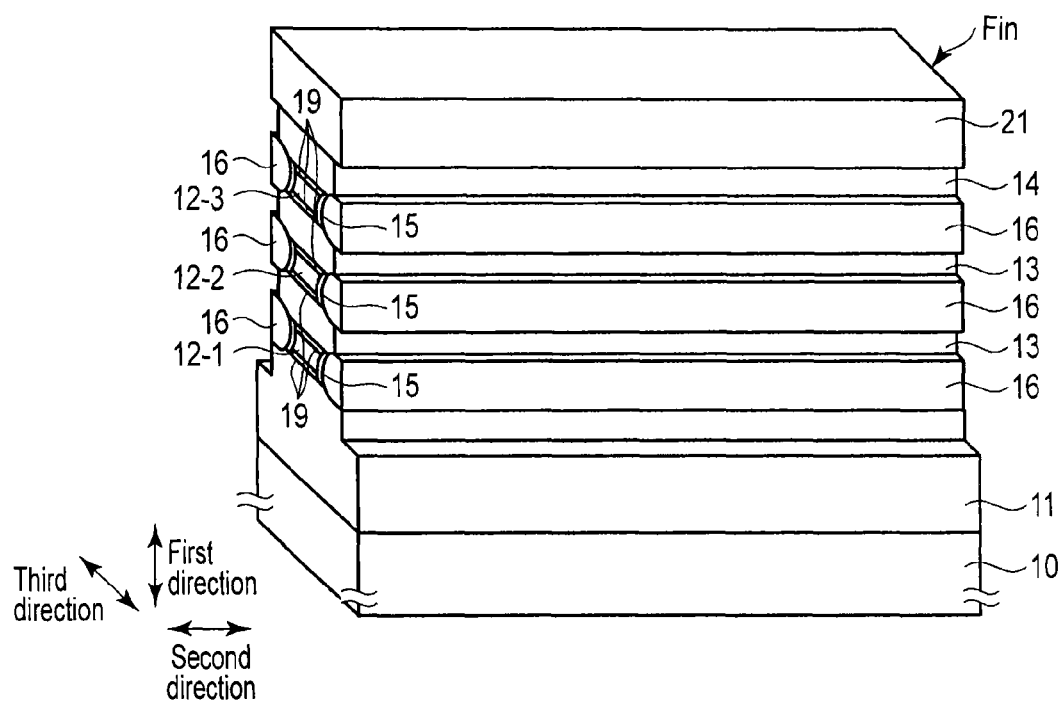

As shown in FIG. 71 and FIG. 72, the surfaces of oxide layers 11, 13, and 14 in the third direction are then recess-etched, for example, by wet etching or by isotropic dry etching that uses HF/NH$_3$ gas.

Etching amount y3 of oxide layers 11, 13, and 14 is set so that the surfaces of oxide layers 11, 13, and 14 in the third direction after the etching are located outside the part (the tapered portion of gate oxide layer 5), which is located on the outermost side of fin structure Fin, of an interface between gate oxide layer 15 and floating gate electrode 16.

This is intended to prevent a control gate electrode that will be formed later from being excessively close to the edges of first, second, and third semiconductor layers 12-1, 12-2, and 12-3. As the area in which the later-formed control gate electrode and the floating gate electrode face each other is increased by the recess-etching of oxide layers 11, 13, and 14, the coupling ratio of the memory cell can be improved.

According to the present embodiment, the width of a portion between the surfaces of oxide layers 11, 13, and 14 in the third direction after the etching and the part, which is located on the outermost side of fin structure Fin, of the interface between gate oxide layer 15 and floating gate electrode 16 is set to x3.

Figure 73:
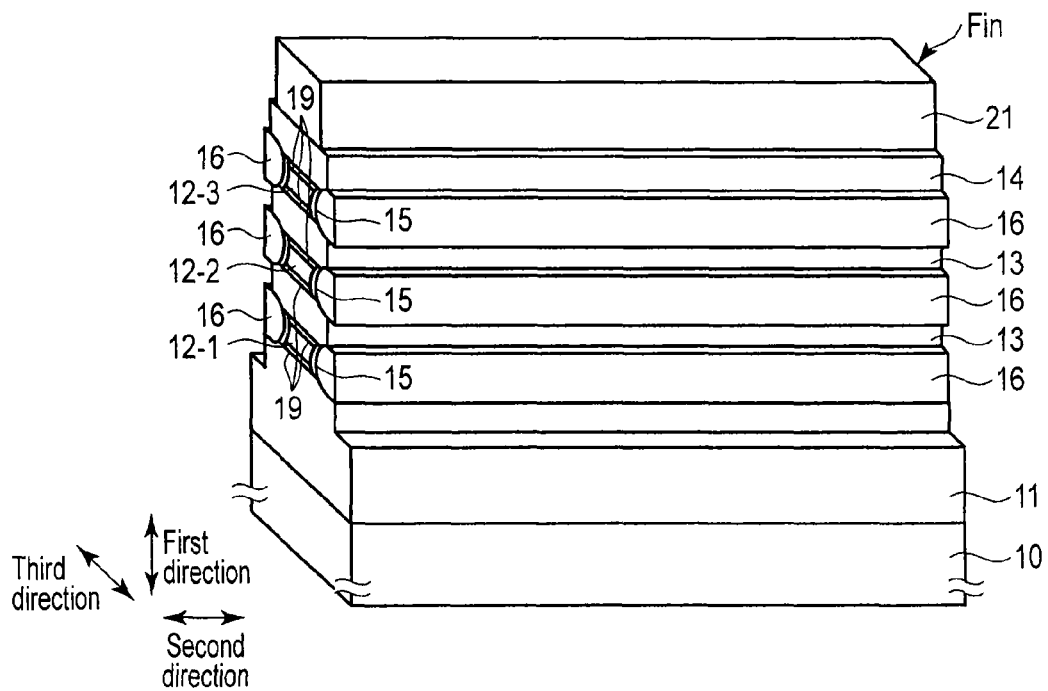
Figure 74:
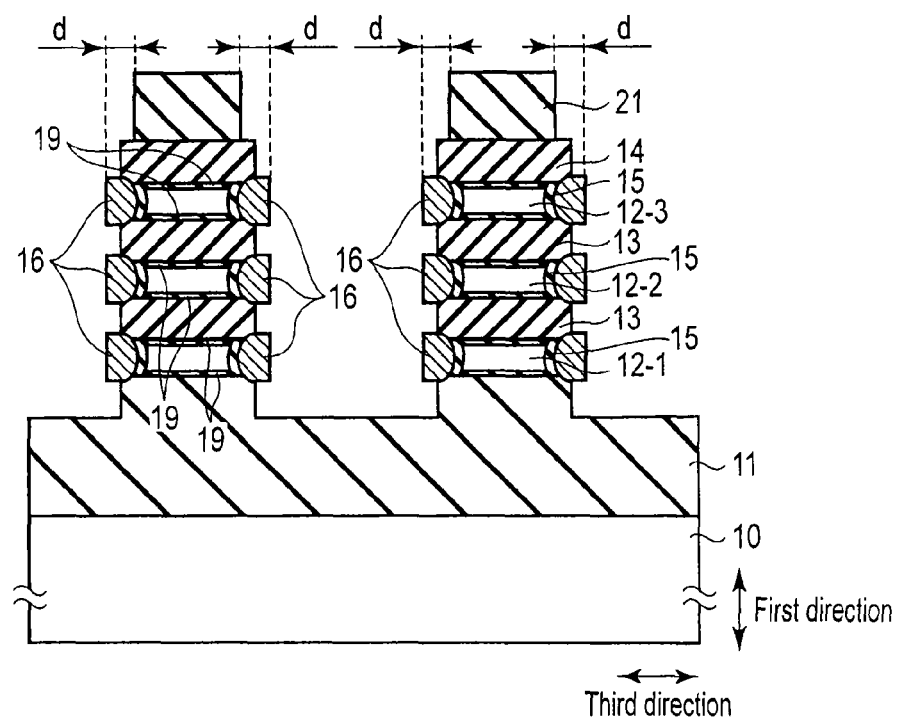

As shown in FIG. 73 and FIG. 74, hard mask layer 21 is etched, for example, by isotropic etching, and the width of hard mask layer 21 in the third direction is shrunk.

Shrinkage amount d of hard mask layer 21 resulting from this process is an amount (ideal value) that is enough for floating gate electrode 16 in one memory string to be divided for each memory cell during the patterning of the control gate electrode.

As shown in FIG. 75 and FIG. 76, block insulating layer (e.g. $SiO_2/Si_3N_4/SiO_2$) 17 covering the entire surface of fin structure Fin is then formed, for example, by CVD.

Figure 78:
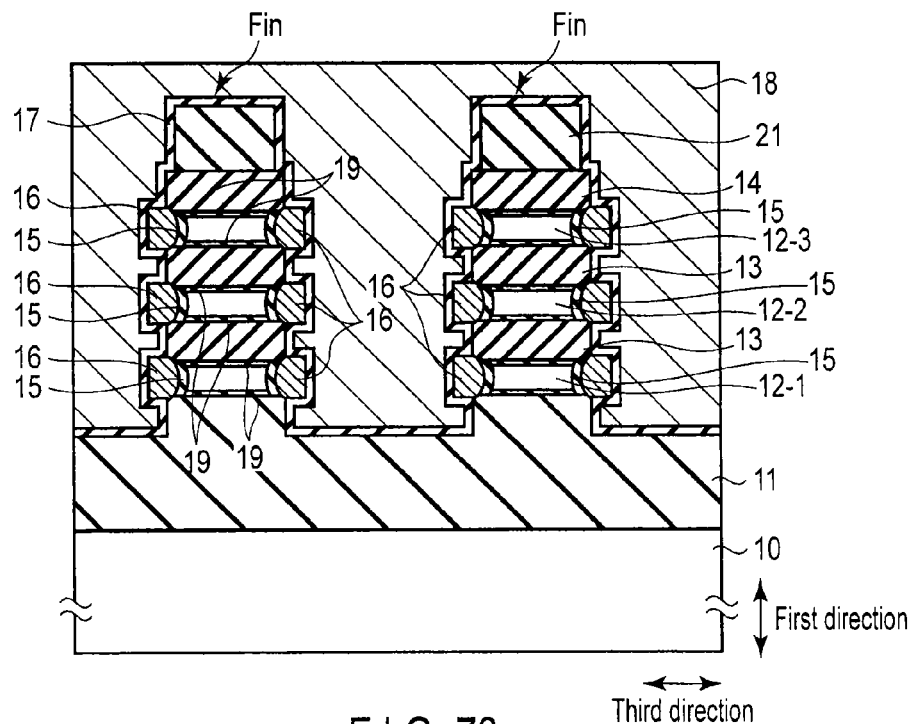

As shown in FIG. 77 and FIG. 78, control gate electrode (e.g. polysilicon layer) 18 covering fin structure Fin and completely filling the space between fin structures Fin is then formed.

Figure 79:
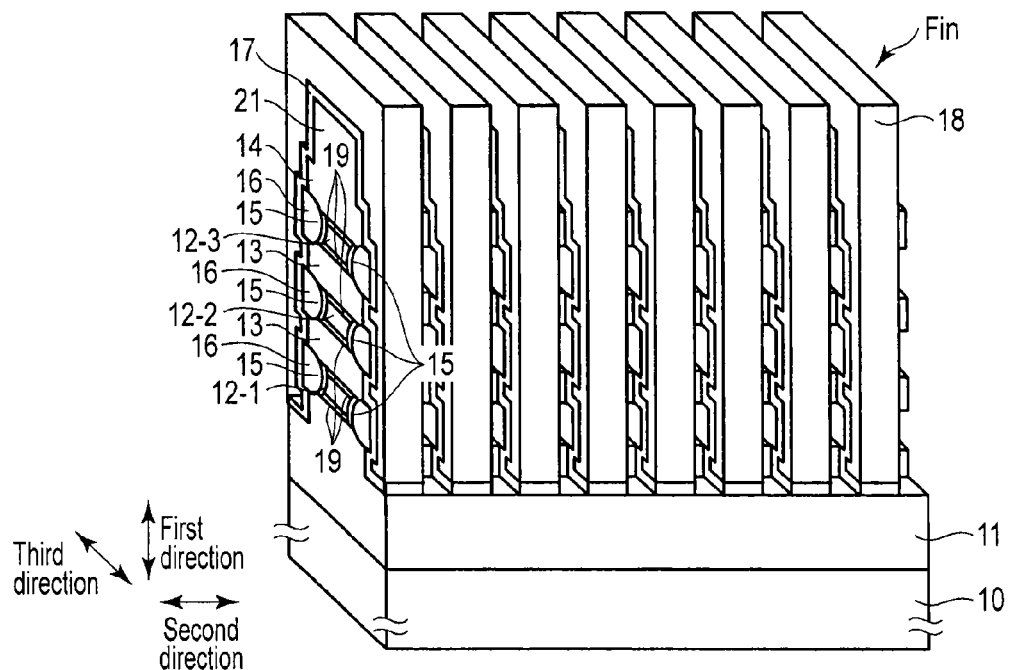
Figure 80:
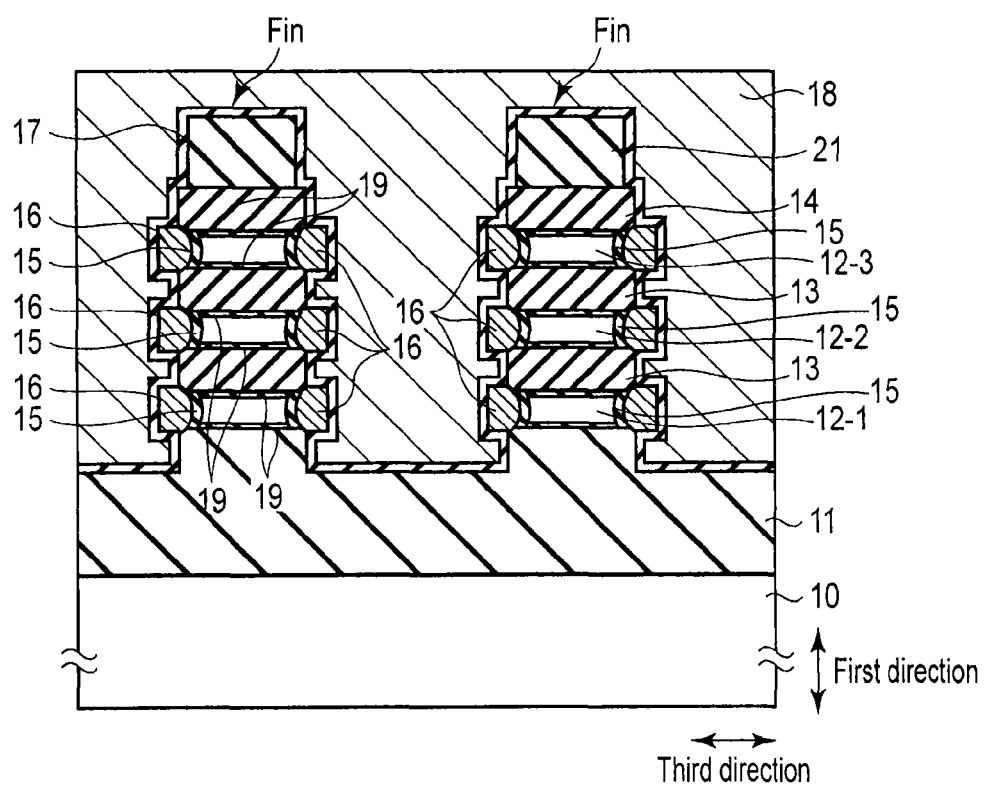

As shown in FIG. 79 and FIG. 80, a resist pattern is then formed on control gate electrode 18 by PEP, and this resist pattern is used as a mask to pattern control gate electrode 18 by RIE.

Control gate electrode 18 and block insulating layer 17 located in parts that are not covered by the resist pattern are completely removed. At the same time, floating gate electrode 16 located in parts that are not covered by the resist pattern is also removed.

Figure 81:
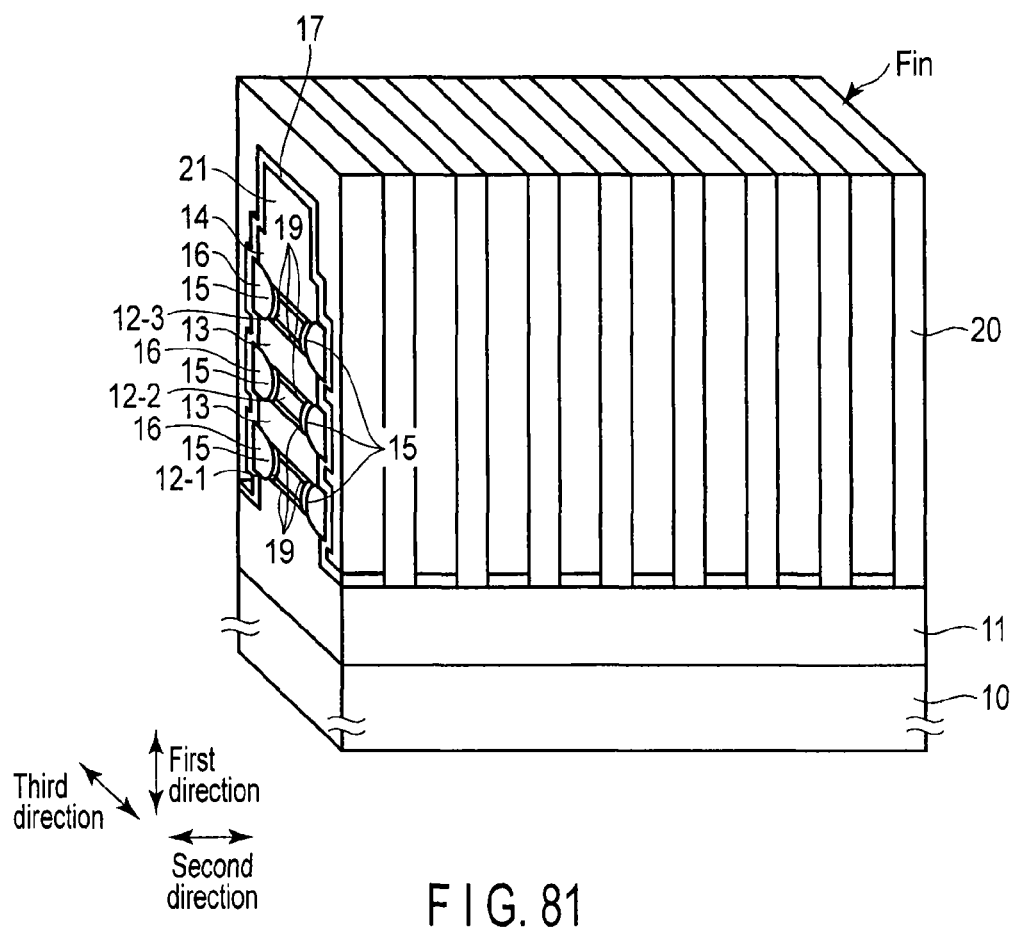

Finally, as shown in FIG. 81 to FIG. 83, the space between control gate electrodes 18 having the line-and-space patterns is filled with interlayer insulating layer (e.g. silicon oxide layer) 20, for example, by CVD.

The VG-FG type VLB in FIG. 56 to FIG. 58 is completed by the process described above.

The second embodiment can be combined with the third embodiment. That is, gate oxide layer 15 in the third embodiment may be changed to gate oxide layers 15a and 15b as in the second embodiment (e.g. FIG. 29 to FIG. 31).

Application Examples

VG-FG type VLBs as the application examples are described.

In the following application examples, the same elements as those in the VG-FG type VLBs according to the first to third embodiments are indicated by the same reference signs, and are thus not described in detail.

FIG. 84 shows the VLB as the first application example. FIG. 85 is a sectional view taken along the line LXXXV-LXXXV in FIG. 84.

According to this application example, first, second, and third semiconductor layers 12-1, 12-2, and 12-3 stacked on semiconductor substrate 10 are selected by a stepped shape of parts (e.g. beams) of first, second, and third semiconductor layers 12-1, 12-2, and 12-3.

Both ends of fin structure Fin comprising first, second, and third semiconductor layers 12-1, 12-2, and 12-3 in the second direction are connected to beams 22, respectively. Beams 22 extend in the third direction, and thereby function to prevent the collapse of fin structure Fin.

Similarly to fin structure Fin, beam 22 comprises first, second, and third semiconductor layers 12-1, 12-2, and 12-3 and oxide layers 11, 13, and 14. One end of beam 22 in the third direction has a stepped shape. This stepped shape permits contact plugs 23 to be independently connected to first, second, and third semiconductor layers 12-1, 12-2, and 12-3, respectively.

The width of beam 22 in the second direction may be the same as or different from the width of fin structure Fin in the third direction. However, the width of beam 22 in the second direction is preferably greater than the width of fin structure Fin in the third direction for the purpose of decreasing the wiring resistance in beam 22 and preventing the collapse of fin structure Fin.

Contact plug 23 comprises a metal material such as W or Al. A bit line or a source line is connected to contact plug 23.

Figure 86:
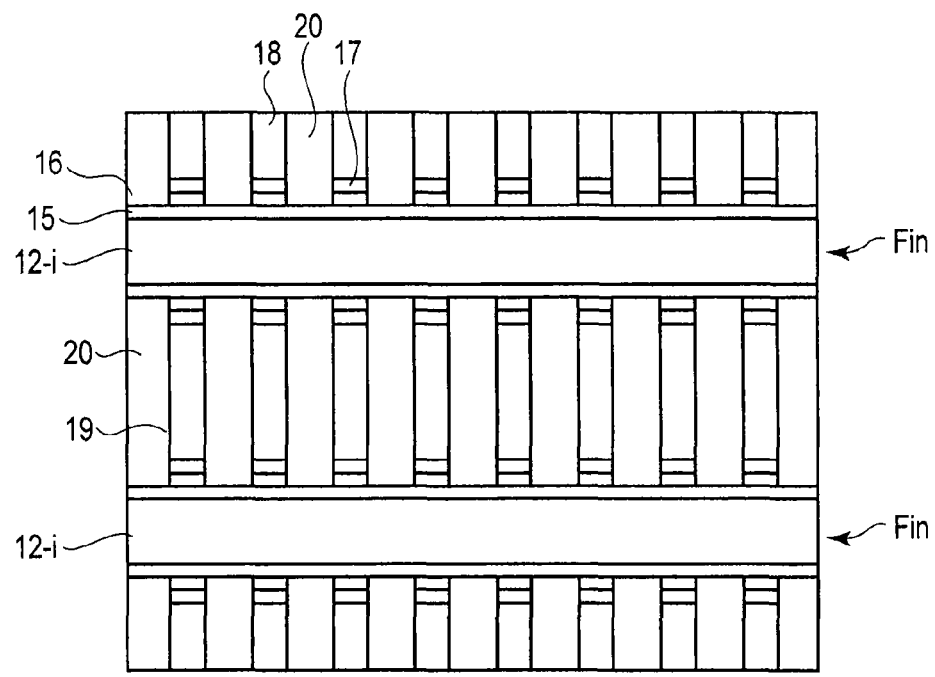
FIG. 86 to FIG. 89 are plan views showing a VLB as an application example.
Figure 87:
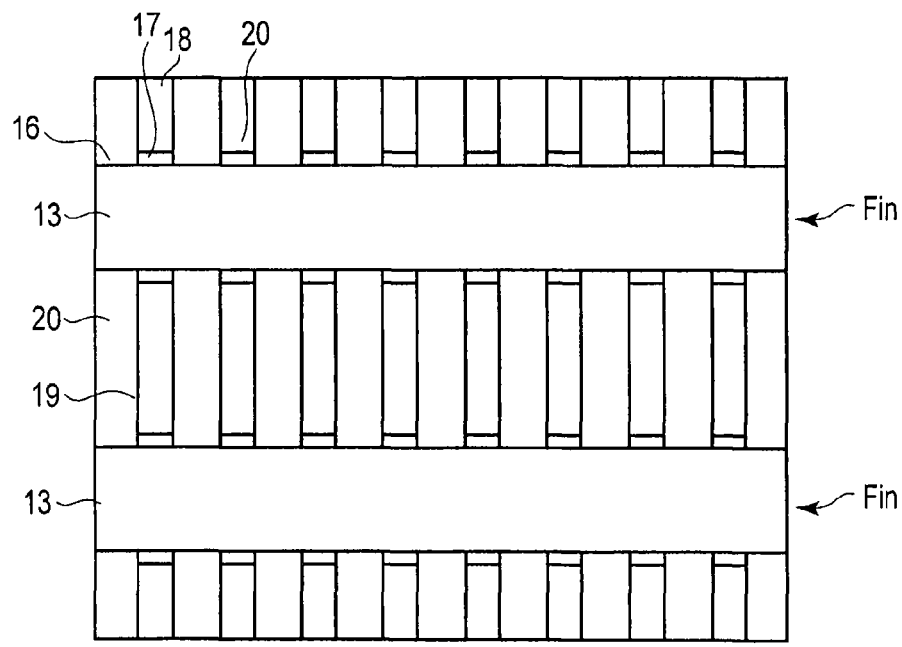

FIG. 86 is a diagram showing i-th semiconductor layer (i is one of 1 to 3) 12-i cut out along a plane parallel to the surface of semiconductor substrate 10. FIG. 87 is a diagram showing insulating layers 13 and 14 cut out along a plane parallel to the surface of semiconductor substrate 10.

As apparent from these drawings, when fin structures Fin are arranged, a trench is formed between control gate electrodes 18 after the patterning of control gate electrodes 18 if fin structures Fin are viewed from the first direction. This trench is filled with interlayer insulating layer 20.

Figure 88:
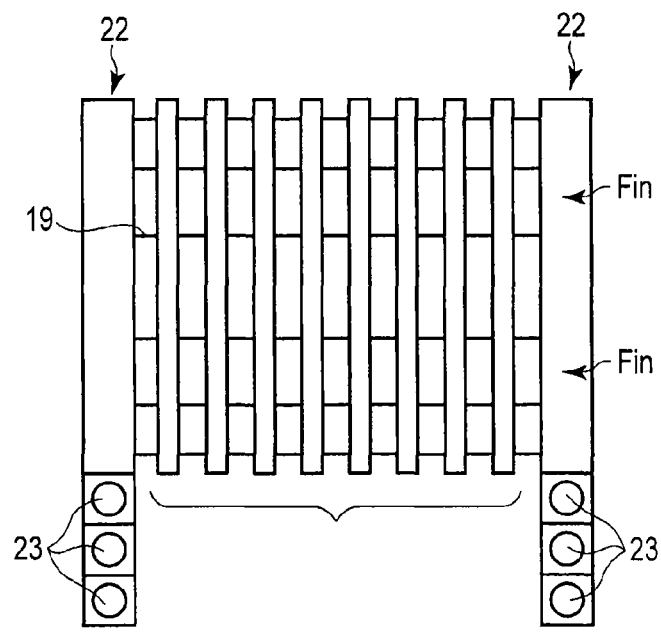

FIG. 88 shows the pattern of control gate electrodes 18 when fin structures Fin are viewed from the first direction.

Control gate electrodes 18 have a line-and-space pattern, and extend in the third direction as a whole. However, between fin structures Fin, control gate electrodes 18 extend in the first direction (direction perpendicular to the front of the drawing) along the surfaces of fin structures Fin in the third direction.

Figure 89:
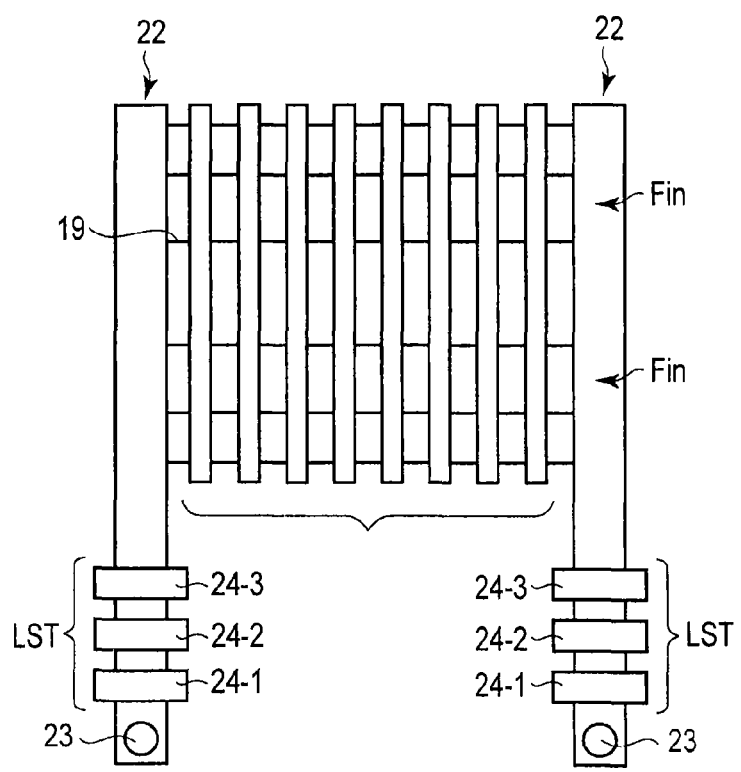

FIG. 89 shows the VLB as the second application example.

According to this application example, first, second, and third semiconductor layers 12-1, 12-2, and 12-3 stacked on semiconductor substrate 10 are selected by first, second, and third layer select transistors.

Both ends of fin structure Fin comprising first, second, and third semiconductor layers 12-1, 12-2, and 12-3 in the second direction are connected to beams 22, respectively. Beams 22 extend in the third direction, and thereby function to prevent the collapse of fin structure Fin.

Similarly to fin structure Fin, beam 22 comprises first, second, and third semiconductor layers 12-1, 12-2, and 12-3 and oxide layers 11, 13, and 14. First, second, and third layer select transistors LST are disposed at one end of beam 22 in the third direction.

First, second, and third layer select transistors LST are, for example, field effect transistors, and use first, second, and third semiconductor layers 12-1, 12-2, and 12-3 as channels, and select one of first, second, and third semiconductor layers 12-1, 12-2, and 12-3.

First, second, and third layer select transistors LST are arranged in the third direction, and have first, second, and third gate electrodes 24-1, 24-2, and 24-3 that are arranged with constant pitch P in order from contact plug (common electrode) 23. First, second, and third gate electrodes 24-1, 24-2, and 24-3 comprise metal silicide layers such as conductive polysilicon layers and nickel silicide layers, or stacks of these layers.

First, second, and third gate electrodes 24-1, 24-2, and 24-3 extend in the first direction along at least the side surfaces of first, second, and third semiconductor layers 12-1, 12-2, and 12-3 located in the second direction.

In this example, first, second, and third gate electrodes 24-1, 24-2, and 24-3 cover the upper surface of fin structure Fin in the first direction and the two side surfaces thereof in the second direction. That is, layer select transistor LST has a double gate structure.

First layer select transistor LST comprising first gate electrode 24-1 has a normally-on channel in first semiconductor layer 12-1. That is, first layer select transistor LST comprising first gate electrode 24-1 is normally on in first semiconductor layer 12-1 and is on/off controllable in second and third semiconductor layers 12-2 and 12-3.

Second layer select transistor LST comprising second gate electrode 24-2 has a normally-on channel in second semiconductor layer 12-2. That is, second layer select transistor LST comprising second gate electrode 24-2 is normally on in second semiconductor layer 12-2 and is on/off controllable in first and third semiconductor layers 12-1 and 12-3.

Third layer select transistor LST comprising third gate electrode 24-3 has a normally-on channel in third semiconductor layer 12-3. That is, third layer select transistor LST comprising third gate electrode 24-3 is normally on in third semiconductor layer 12-3 and is on/off controllable in first and second semiconductor layers 12-1 and 12-2.

To generalize, i-th layer select transistor (i is one of 1 to n) among first to n-th layer select transistors LST that use first to n-th semiconductor layers (n is a natural number equal to or more than 2) 12-1 to 12-$n$ is normally on in the i-th semiconductor layer and is on/off controllable in the other semiconductor layers.

The normally-on channels in first, second, and third semiconductor layers 12-1, 12-2, and 12-3 can be formed by an n-type impurity (a pentad such as arsenic or phosphorus), a p-type impurity (a triad such as boron or indium), or impurity regions including both of the above.

Owing to first, second, and third layer select transistors LST described above, contact plug 23 can be a common electrode for first, second, and third semiconductor layers 12-1, 12-2, and 12-3. That is, as it is not necessary to independently provide a contact plug for each of first, second, and third semiconductor layers 12-1, 12-2, and 12-3, the size of a contact region can be reduced.

The width of beam 22 in the second direction may be the same as or different from the width of fin structure Fin in the third direction. However, the width of beam 22 in the second direction is preferably greater than the width of fin structure Fin in the third direction for the purpose of decreasing the wiring resistance in beam 22 and preventing the collapse of fin structure Fin.

Contact plug (common electrode) 23 comprises a metal material such as W or Al. A bit line or a source line is connected to contact plug 23.

Although the VLB having a double gate structure is shown in the embodiments described above, the embodiments are also applicable to a VLB having a single gate structure.

CONCLUSION

According to the embodiments, the characteristics or reliability of a memory cell of a three-dimensional nonvolatile semiconductor memory device can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a first structure stacked in order of a first oxide layer, a semiconductor layer and a second oxide layer in a first direction, the first structure extending in a second direction crossing the first direction; and
    a second structure stacked in order of a gate oxide layer, a charge storage layer, a block insulating layer and a control gate electrode in a third direction crossing the first and second directions on a surface of the semiconductor layer, the third direction crossing the surface of the semiconductor layer,
    wherein the surface of the semiconductor layer has a concave curve, and is located inside surfaces of the first and second oxide layers,
    the concave curve is provided in a cross sectional plane in the first and third directions,
    a surface of the charge storage layer beside the gate oxide layer has a convex curve, and
    the semiconductor layer has tapered portions extending in the third direction in portions in which the semiconductor layer is in contact with the first and second oxide layers.

2. The device of claim 1, wherein the curvature of the concave curve is equal to or more than zero.

3. The device of claim 1, wherein a width of the semiconductor layer in the first direction is smaller than a width of the charge storage layer in the first direction.

4. The device of claim 1, wherein a width of the semiconductor layer in the first direction is equal to or greater than a width of the charge storage layer in the first direction.

5. The device of claim 1, wherein the gate oxide layer has a tapered portion extending in the third direction along the convex curve, and an end of the tapered portion in the third direction is located between the first and second oxide layers.

6. The device of claim 1, further comprising:
    a memory string which comprises memory cells connected in series,
    wherein each of the memory cells uses the semiconductor layer as a channel and comprises the second structure.

7. The device of claim 1, wherein the cross sectional plane is perpendicular to a current path in the semiconductor layer corresponding to the second structure.

8. The device of claim 1, wherein
    the concave curve has a curvature which varies with location, and the curvature has a minimum value in portions in which the semiconductor layer is in contact with the first and second oxide layers.

9. A nonvolatile semiconductor memory device comprising:
    a first structure stacked in order of a first oxide layer, a semiconductor layer and a second oxide layer in a first direction, the first structure extending in a second direction crossing the first direction;
    a second structure stacked in order of a gate oxide layer, a charge storage layer, a block insulating layer and a control gate electrode in a third direction crossing the first and second directions on a surface of the semiconductor layer, the third direction crossing the surface of the semiconductor layer;

a third oxide layer between the first oxide layer and the semiconductor layer; and a fourth oxide layer between the second oxide layer and the semiconductor layer, wherein the surface of the semiconductor layer has a concave curve, and is located between the first and second oxide layers, the concave curve is provided in a cross sectional plane in the first and third directions, a surface of the charge storage layer beside the gate oxide layer has a convex curve, and the semiconductor layer has tapered portions extending in the third direction in portions in which the semiconductor layer in contact with the third and fourth oxide layers.

10. The device of claim 9, wherein the curvature of the concave curve is equal to or more than zero.

11. The device of claim 9, wherein a width of the semiconductor layer in the first direction is smaller than a width of the charge storage layer in the first direction.

12. The device of claim 9, wherein a width of the semiconductor layer in the first direction is equal to or greater than a width of the charge storage layer in the first direction.

13. The device of claim 9, wherein the gate oxide layer has a tapered portion extending in the third direction along the convex curve, and an end of the tapered portion in the third direction is located between the first and second oxide layers.

14. The device of claim 9, further comprising:
a memory string which comprises memory cells connected in series,
wherein each of the memory cells uses the semiconductor layer as a channel and comprises the second structure.

15. The device of claim 9, wherein the cross sectional plane is perpendicular to a current path in the semiconductor layer corresponding to the second structure.

16. The device of claim 9, wherein
the concave curve has a curvature which varies with location, and the curvature has a minimum value in portions in which the semiconductor layer is in contact with the third and fourth oxide layers.

* * * * *